(12) United States Patent
Borole et al.

(10) Patent No.: US 10,158,346 B2
(45) Date of Patent: Dec. 18, 2018

(54) PULSE TRIGGERED FLIP FLOP

(71) Applicant: Intel Corporation, Santa Clara, CA (US)

(72) Inventors: Bhushan M. Borole, Rancho Cordova, CA (US); Anupama A. Thaploo, Folsom, CA (US); Altug Koker, El Dorado Hills, CA (US); Abhishek R. Appu, El Dorado Hills, CA (US); Kamal Sinha, Rancho Cordova, CA (US); Wenyin Fu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/488,628

(22) Filed: Apr. 17, 2017

(65) Prior Publication Data
US 2018/0302064 A1     Oct. 18, 2018

(51) Int. Cl.
*H03K 3/012*     (2006.01)
*H03K 3/356*     (2006.01)
*H03K 19/21*     (2006.01)

(52) U.S. Cl.
CPC ............. *H03K 3/012* (2013.01); *H03K 3/356* (2013.01); *H03K 19/215* (2013.01)

(58) Field of Classification Search
CPC ...... H03K 3/012; H03K 3/356; H03K 19/215; H03K 3/356069; H03K 3/356104; H03K 3/356113; H03K 3/356121; H03K 3/356165; H03K 3/356173
See application file for complete search history.

(56) References Cited

U.S. PATENT DOCUMENTS

| | | | |
|---|---|---|---|
| 8,120,406 B2 * | 2/2012 | Iyer | H03K 3/356156 326/93 |
| 2016/0062947 A1 | 3/2016 | Chetlur et al. | |

OTHER PUBLICATIONS

Cook, S., "CUDA Programming," CUDA Hardware Overview, Chapter 3, http://dx.doi.org/10.1016/B978-0-12-415933-4.00003-X, Elsevier, Inc. 2013, pp. 37-52.
Goodfellow, I., et al., "Adaptive Computation and Machine Learning Series," Chapter 5, Nov. 18, 2016, pp. 98-165.
Junkins, S., "The Compute Architecture of Intel Processor Graphics Gen9", Ver. 1, Aug. 14, 2015 (22 pgs.).
Ross, J., et al., "Intel Processor Graphics: Architecture & Programming," PowerPoint presentation, Aug. 2015 (78 pgs).
Wilt, N., The CUDA Handbook: A Comprehensive Guide to GPU Programming, Pearson Education, 2013, pp. 41-57.

\* cited by examiner

*Primary Examiner* — Jung Kim
(74) *Attorney, Agent, or Firm* — Trop Pruner & Hu, P.C.

(57) ABSTRACT

A pulse triggered flip flop circuit includes an exclusive OR clock generating stage that receives an input clock, data and produces an output clock pulse. The stage produces a output clock pulse that only goes away when the data is fully captured. The stage disables the output clock pulse only when the data is fully captured. Moreover, the circuit only toggles when the input data changes, reducing power consumption in some embodiments.

21 Claims, 34 Drawing Sheets

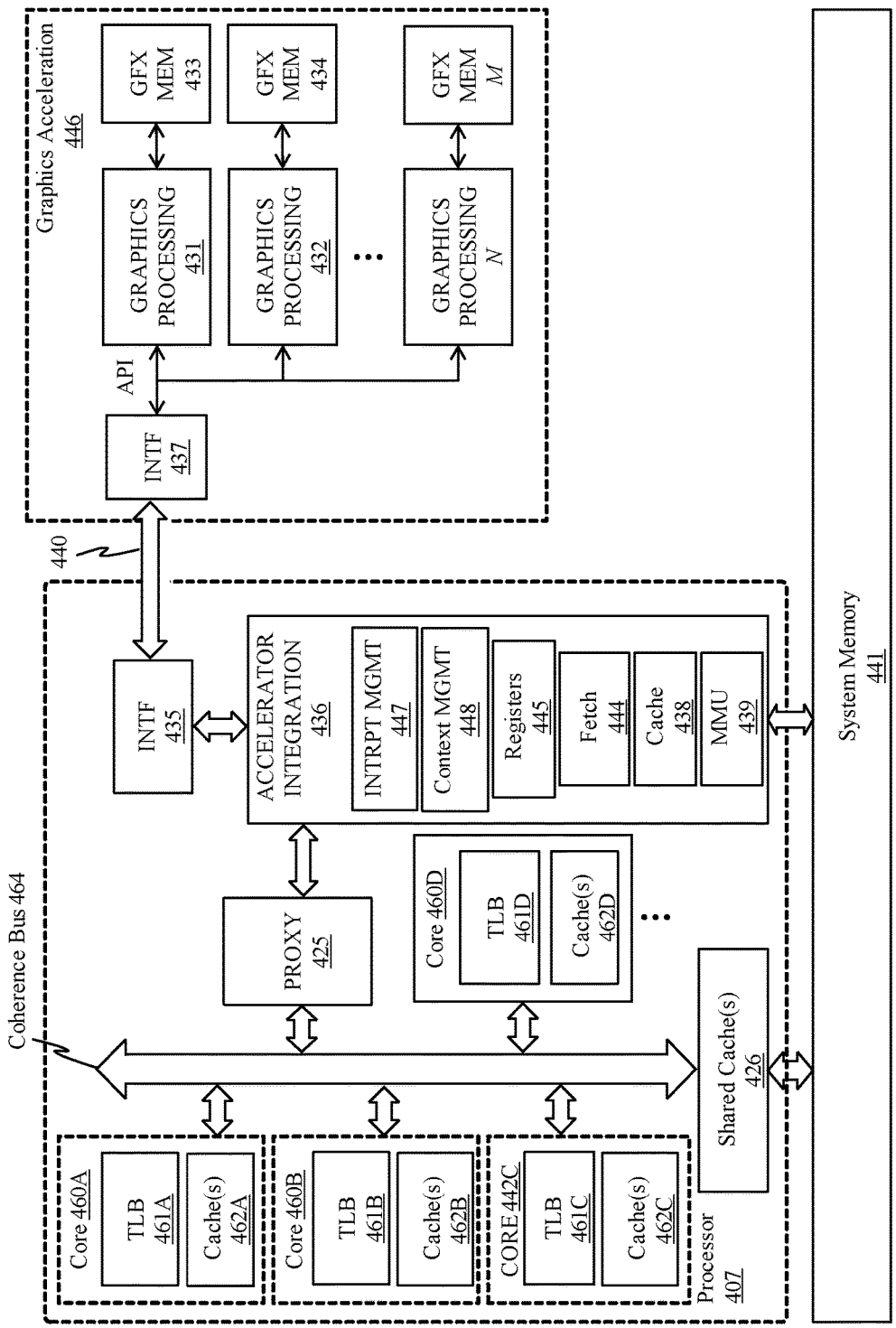

PULSE TRIGGERED FLIP FLOP

FIELD

Embodiments relate generally to data processing and more particularly to data processing via a general-purpose graphics processing unit.

BACKGROUND OF THE DESCRIPTION

Current parallel graphics data processing includes systems and methods developed to perform specific operations on graphics data such as, for example, linear interpolation, tessellation, rasterization, texture mapping, depth testing, etc. Traditionally, graphics processors used fixed function computational units to process graphics data; however, more recently, portions of graphics processors have been made programmable, enabling such processors to support a wider variety of operations for processing vertex and fragment data.

To further increase performance, graphics processors typically implement processing techniques such as pipelining that attempt to process, in parallel, as much graphics data as possible throughout the different parts of the graphics pipeline. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency.

BRIEF DESCRIPTION OF THE DRAWINGS

So that the manner in which the above recited features of the present embodiments can be understood in detail, a more particular description of the embodiments, briefly summarized above, may be had by reference to embodiments, some of which are illustrated in the appended drawings. It is to be noted, however, that the appended drawings illustrate only typical embodiments and are therefore not to be considered limiting of its scope.

FIG. 4A-4F illustrate an exemplary architecture in which a plurality of GPUs are communicatively coupled to a plurality of multi-core processors;

DETAILED DESCRIPTION

In some embodiments, a graphics processing unit (GPU) is communicatively coupled to host/processor cores to accelerate graphics operations, machine-learning operations, pattern analysis operations, and various general purpose GPU (GPGPU) functions. The GPU may be communicatively coupled to the host processor/cores over a bus or another interconnect (e.g., a high-speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

System Overview

Figure 1:
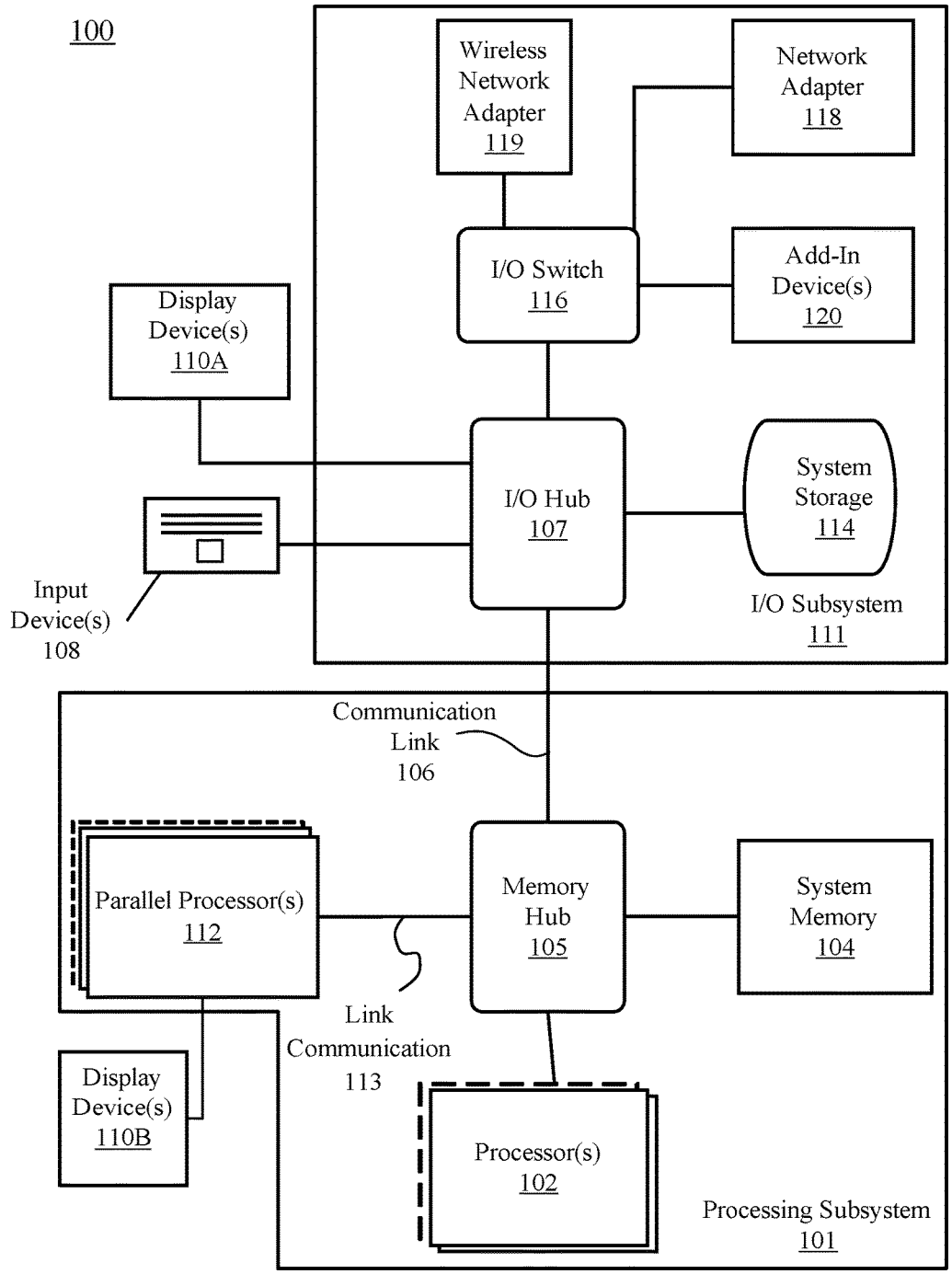
FIG. 1 is a block diagram illustrating a computer system configured to implement one or more aspects of the embodiments described herein.

FIG. 1 is a block diagram illustrating a computing system 100 configured to implement one or more aspects of the embodiments described herein. The computing system 100 includes a processing subsystem 101 having one or more processor(s) 102 and a system memory 104 communicating via an interconnection path that may include a memory hub 105. The memory hub 105 may be a separate component within a chipset component or may be integrated within the one or more processor(s) 102. The memory hub 105 couples with an I/O subsystem 111 via a communication link 106. The I/O subsystem 111 includes an I/O hub 107 that can enable the computing system 100 to receive input from one or more input device(s) 108. Additionally, the I/O hub 107 can enable a display controller, which may be included in the one or more processor(s) 102, to provide outputs to one or more display device(s) 110A. In one embodiment the one or more display device(s) 110A coupled with the I/O hub 107 can include a local, internal, or embedded display device.

In one embodiment the processing subsystem 101 includes one or more parallel processor(s) 112 coupled to memory hub 105 via a bus or other communication link 113. The communication link 113 may be one of any number of standards based communication link technologies or protocols, such as, but not limited to PCI Express, or may be a vendor specific communications interface or communications fabric. In one embodiment the one or more parallel processor(s) 112 form a computationally focused parallel or vector processing system that an include a large number of processing cores and/or processing clusters, such as a many integrated core (MIC) processor. In one embodiment the one or more parallel processor(s) 112 form a graphics processing subsystem that can output pixels to one of the one or more display device(s) 110A coupled via the I/O Hub 107. The one or more parallel processor(s) 112 can also include a display controller and display interface (not shown) to enable a direct connection to one or more display device(s) 110B.

Within the I/O subsystem 111, a system storage unit 114 can connect to the I/O hub 107 to provide a storage mechanism for the computing system 100. An I/O switch 116 can be used to provide an interface mechanism to enable connections between the I/O hub 107 and other components, such as a network adapter 118 and/or wireless network adapter 119 that may be integrated into the platform, and various other devices that can be added via one or more add-in device(s) 120. The network adapter 118 can be an Ethernet adapter or another wired network adapter. The wireless network adapter 119 can include one or more of a Wi-Fi, Bluetooth, near field communication (NFC), or other network device that includes one or more wireless radios.

The computing system 100 can include other components not explicitly shown, including USB or other port connections, optical storage drives, video capture devices, and the like, may also be connected to the I/O hub 107. Communication paths interconnecting the various components in FIG. 1 may be implemented using any suitable protocols, such as PCI (Peripheral Component Interconnect) based protocols (e.g., PCI-Express), or any other bus or point-to-point communication interfaces and/or protocol(s), such as the NV-Link high-speed interconnect, or interconnect protocols known in the art.

In one embodiment, the one or more parallel processor(s) 112 incorporate circuitry optimized for graphics and video processing, including, for example, video output circuitry, and constitutes a graphics processing unit (GPU). In another embodiment, the one or more parallel processor(s) 112 incorporate circuitry optimized for general purpose processing, while preserving the underlying computational architecture, described in greater detail herein. In yet another embodiment, components of the computing system 100 may be integrated with one or more other system elements on a single integrated circuit. For example, the one or more parallel processor(s), 112 memory hub 105, processor(s) 102, and I/O hub 107 can be integrated into a system on chip (SoC) integrated circuit. Alternatively, the components of the computing system 100 can be integrated into a single package to form a system in package (SIP) configuration. In one embodiment at least a portion of the components of the computing system 100 can be integrated into a multi-chip module (MCM), which can be interconnected with other multi-chip modules into a modular computing system.

It will be appreciated that the computing system 100 shown herein is illustrative and that variations and modifications are possible. The connection topology, including the number and arrangement of bridges, the number of processor(s) 102, and the number of parallel processor(s) 112, may be modified as desired. For instance, in some embodiments, system memory 104 is connected to the processor(s) 102 directly rather than through a bridge, while other devices communicate with system memory 104 via the memory hub 105 and the processor(s) 102. In other alternative topologies, the parallel processor(s) 112 are connected to the I/O hub 107 or directly to one of the one or more processor(s) 102, rather than to the memory hub 105. In other embodiments, the I/O hub 107 and memory hub 105 may be integrated into a single chip. Large embodiments may include two or more sets of processor(s) 102 attached via multiple sockets, which can couple with two or more instances of the parallel processor(s) 112. Some of the particular components shown herein are optional and may not be included in all implementations of the computing system 100. For example, any number of add-in cards or peripherals may be supported, or some components may be eliminated.

Figure 2A:
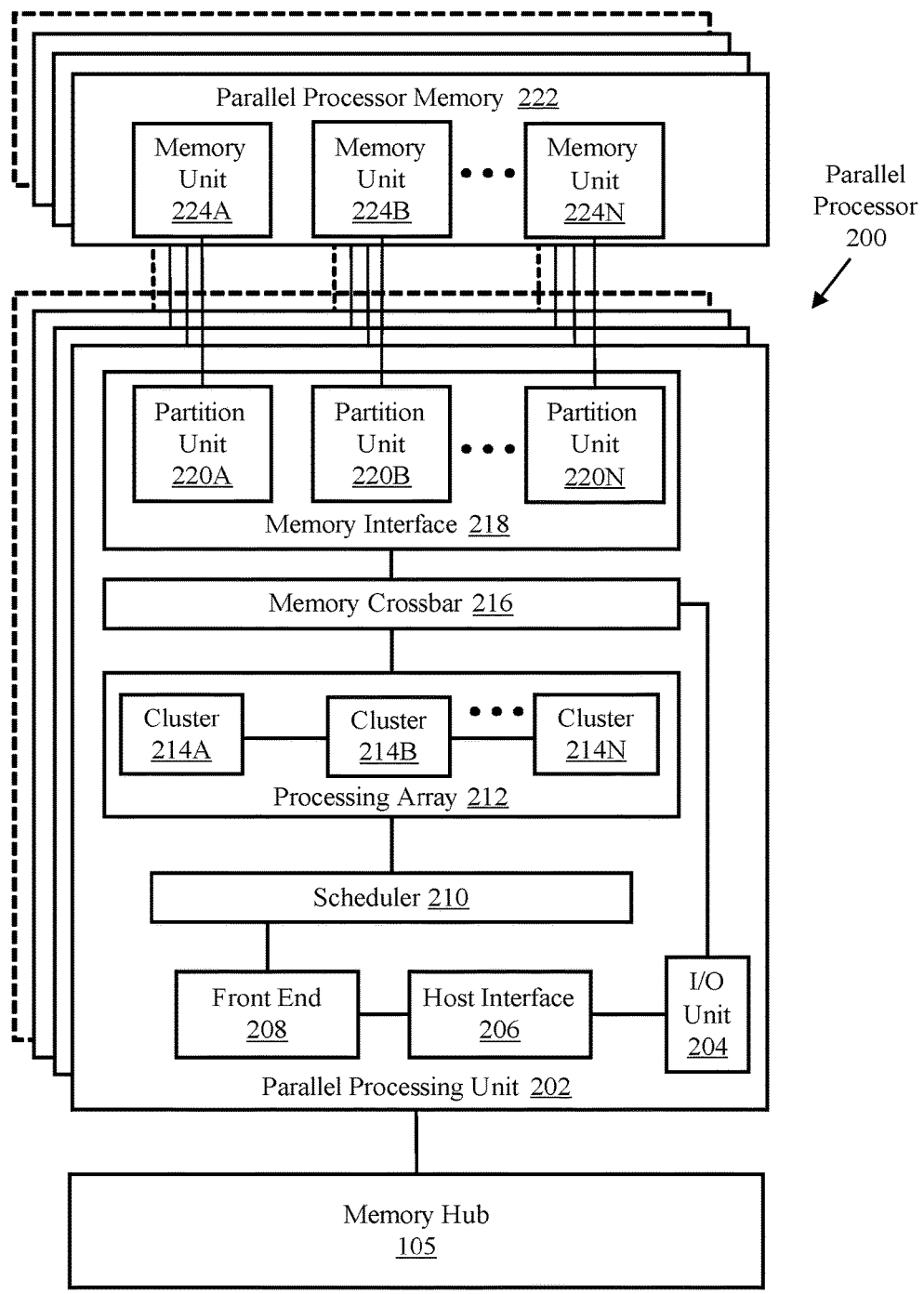
FIG. 2A-2D illustrate a parallel processor components, according to an embodiment.

FIG. 2A illustrates a parallel processor 200, according to an embodiment. The various components of the parallel processor 200 may be implemented using one or more integrated circuit devices, such as programmable processors, application specific integrated circuits (ASICs), or field programmable gate arrays (FPGA). The illustrated parallel processor 200 is a variant of the one or more parallel processor(s) 112 shown in FIG. 1, according to an embodiment.

In one embodiment the parallel processor 200 includes a parallel processing unit 202. The parallel processing unit includes an I/O unit 204 that enables communication with other devices, including other instances of the parallel processing unit 202. The I/O unit 204 may be directly connected to other devices. In one embodiment the I/O unit 204 connects with other devices via the use of a hub or switch interface, such as memory hub 105. The connections between the memory hub 105 and the I/O unit 204 form a communication link 113. Within the parallel processing unit 202, the I/O unit 204 connects with a host interface 206 and a memory crossbar 216, where the host interface 206 receives commands directed to performing processing operations and the memory crossbar 216 receives commands directed to performing memory operations.

When the host interface 206 receives a command buffer via the I/O unit 204, the host interface 206 can direct work operations to perform those commands to a front end 208. In one embodiment the front end 208 couples with a scheduler 210, which is configured to distribute commands or other work items to a processing cluster array 212. In one embodiment the scheduler 210 ensures that the processing cluster array 212 is properly configured and in a valid state before tasks are distributed to the processing clusters of the processing cluster array 212.

The processing cluster array 212 can include up to "N" processing clusters (e.g., cluster 214A, cluster 214B, through cluster 214N). Each cluster 214A-214N of the processing cluster array 212 is capable of executing a large number (e.g., thousands) of concurrent threads, where each thread is an instance of a program.

In one embodiment, different clusters 214A-214N can be allocated for processing different types of programs or for performing different types of computations. The scheduler 210 can allocate work to the clusters 214A-214N of the processing cluster array 212 using various scheduling and/or work distribution algorithms, which may vary depending on the workload arising for each type of program or computation. The scheduling can be handled dynamically by the scheduler 210, or can be assisted in part by compiler logic during compilation of program logic configured for execution by the processing cluster array 212.

The processing cluster array 212 can be configured to perform various types of parallel processing operations. In one embodiment the processing cluster array 212 is configured to perform general-purpose parallel compute operations. For example, the processing cluster array 212 can include logic to execute processing tasks including but not limited to, linear and nonlinear data transforms, filtering of video and/or audio data, and/or modeling operations (e.g., applying laws of physics to determine position, velocity and other attributes of objects).

In one embodiment the processing cluster array 212 is configured to perform parallel graphics processing operations. In embodiments in which the parallel processor 200 is configured to perform graphics processing operations, the processing cluster array 212 can include additional logic to support the execution of such graphics processing operations, including, but not limited to texture sampling logic to perform texture operations, as well as tessellation logic and other vertex processing logic. Additionally, the processing cluster array 212 can be configured to execute graphics processing related shader programs such as, but not limited to vertex shaders, tessellation shaders, geometry shaders, and pixel shaders. The parallel processing unit 202 can transfer data from system memory via the I/O unit 204 for processing. During processing the transferred data can be stored to on-chip memory (e.g., parallel processor memory 222) during processing, then written back to system memory.

In one embodiment, when the parallel processing unit 202 is used to perform graphics processing, the scheduler 210 can be configured to divide the processing workload into approximately equal sized tasks, to better enable distribution of the graphics processing operations to multiple clusters 214A-214N of the processing cluster array 212. In some embodiments, portions of the processing cluster array 212 can be configured to perform different types of processing. For example a first portion may be configured to perform vertex shading and topology generation, a second portion may be configured to perform tessellation and geometry shading, and a third portion may be configured to perform pixel shading or other screen space operations, to produce a rendered image for display. Intermediate data produced by one or more of the clusters 214A-214N may be stored in buffers to allow the intermediate data to be transmitted between clusters 214A-214N for further processing.

During operation, the processing cluster array 212 can receive processing tasks to be executed via the scheduler 210, which receives commands defining processing tasks from front end 208. For graphics processing operations, processing tasks can include indices of data to be processed, e.g., surface (patch) data, primitive data, vertex data, and/or pixel data, as well as state parameters and commands defining how the data is to be processed (e.g., what program is to be executed). The scheduler 210 may be configured to fetch the indices corresponding to the tasks or may receive the indices from the front end 208. The front end 208 can be configured to ensure the processing cluster array 212 is configured to a valid state before the workload specified by incoming command buffers (e.g., batch-buffers, push buffers, etc.) is initiated.

Each of the one or more instances of the parallel processing unit 202 can couple with parallel processor memory 222. The parallel processor memory 222 can be accessed via the memory crossbar 216, which can receive memory requests from the processing cluster array 212 as well as the I/O unit 204. The memory crossbar 216 can access the parallel processor memory 222 via a memory interface 218. The memory interface 218 can include multiple partition units (e.g., partition unit 220A, partition unit 220B, through partition unit 220N) that are each directly coupled to a portion (e.g., memory unit) of parallel processor memory 222. The number of partition units 220A-220N generally equals the number of memory units, such that a first partition unit 220A has a corresponding first memory unit 224A, a second partition unit 220B has a corresponding memory unit 224B, and an Nth partition unit 220N has a corresponding Nth memory unit 224N. In other embodiments, the number of partition units 220A-220N may not equal the number of memory devices.

In various embodiments, the memory units 224A-224N can include various types of memory devices, including dynamic random access memory (DRAM) or graphics random access memory, such as synchronous graphics random access memory (SGRAM), including graphics double data rate (GDDR) memory. In one embodiment, the memory units 224A-224N may also include 3D stacked memory, including but not limited to high bandwidth memory (HBM). Persons skilled in the art will appreciate that the specific implementation of the memory units 224A-224N can vary, and can be selected from one of various conventional designs. Render targets, such as frame buffers or texture maps may be stored across the memory units 224A-224N, allowing partition units 220A-220N to write portions of each render target in parallel to efficiently use the available bandwidth of parallel processor memory 222. In some embodiments, a local instance of the parallel processor memory 222 may be excluded in favor of a unified memory design that utilizes system memory in conjunction with local cache memory.

In one embodiment, any one of the clusters 214A-214N of the processing cluster array 212 can process data to be written to any of the memory units 224A-224N within parallel processor memory 222. The memory crossbar 216 can be configured to route the output of each cluster 214A-214N to the input of any partition unit 220A-220N or to another cluster 214A-214N for further processing. Each cluster 214A-214N can communicate with the memory interface 218 through the memory crossbar 216 to read from or write to various external memory devices. In one embodiment the memory crossbar 216 has a connection to the memory interface 218 to communicate with the I/O unit 204, as well as a connection to a local instance of the parallel processor memory 222, enabling the processing units within the different processing clusters 214A-214N to communicate with system memory or other memory that is not local to the parallel processing unit 202. In one embodiment the memory crossbar 216 can use virtual channels to separate traffic streams between the clusters 214A-214N and the partition units 220A-220N.

While a single instance of the parallel processing unit 202 is illustrated within the parallel processor 200, any number of instances of the parallel processing unit 202 can be included. For example, multiple instances of the parallel processing unit 202 can be provided on a single add-in card, or multiple add-in cards can be interconnected. The different instances of the parallel processing unit 202 can be configured to inter-operate even if the different instances have different numbers of processing cores, different amounts of local parallel processor memory, and/or other configuration differences. For example and in one embodiment, some instances of the parallel processing unit 202 can include higher precision floating point units relative to other instances. Systems incorporating one or more instances of the parallel processing unit 202 or the parallel processor 200 can be implemented in a variety of configurations and form factors, including but not limited to desktop, laptop, or handheld personal computers, servers, workstations, game consoles, and/or embedded systems.

Figure 2B:
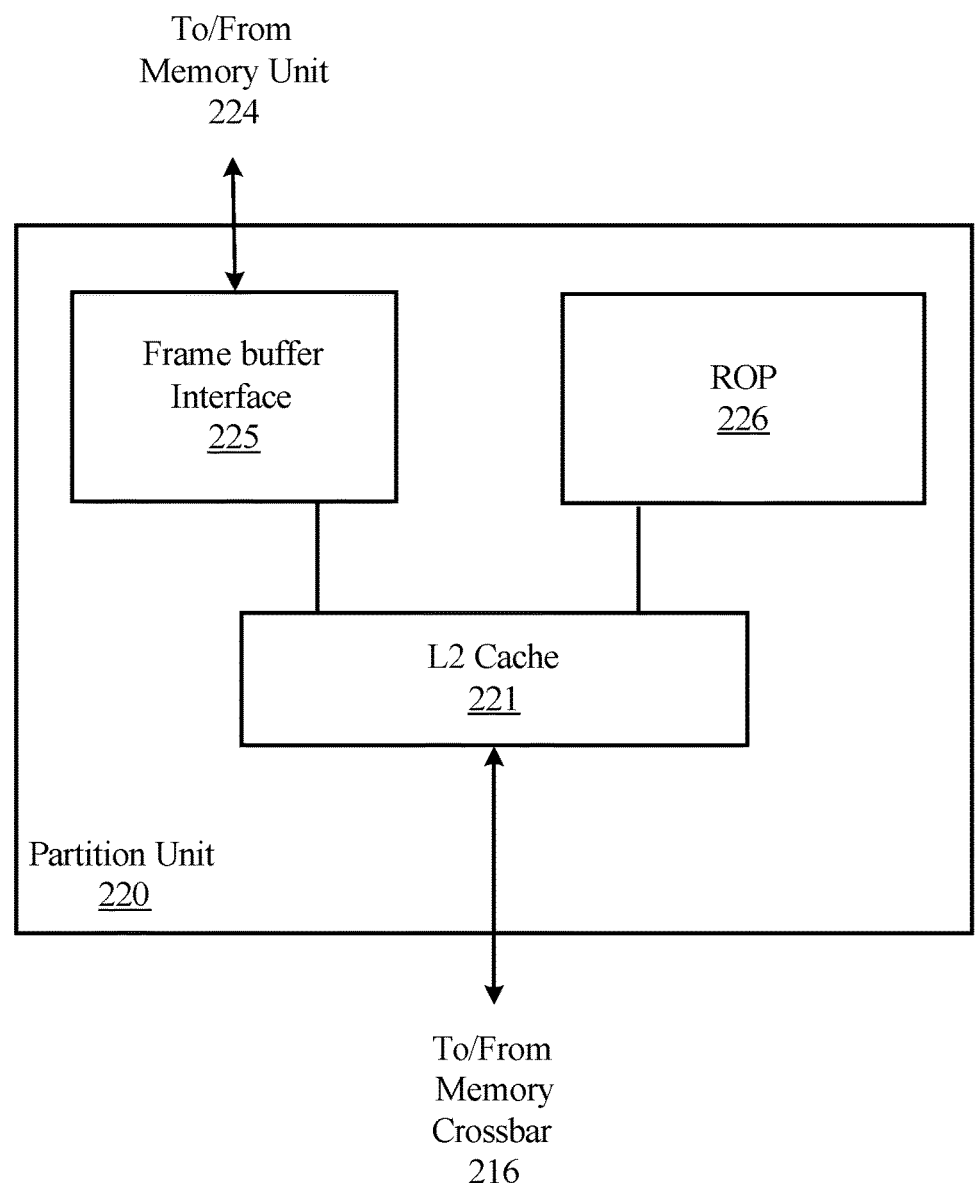

FIG. 2B is a block diagram of a partition unit 220, according to an embodiment. In one embodiment the partition unit 220 is an instance of one of the partition units 220A-220N of FIG. 2A. As illustrated, the partition unit 220 includes an L2 cache 221, a frame buffer interface 225, and a ROP 226 (raster operations unit). The L2 cache 221 is a read/write cache that is configured to perform load and store operations received from the memory crossbar 216 and ROP 226. Read misses and urgent write-back requests are output by L2 cache 221 to frame buffer interface 225 for processing. Dirty updates can also be sent to the frame buffer via the frame buffer interface 225 for opportunistic processing. In one embodiment the frame buffer interface 225 interfaces with one of the memory units in parallel processor memory, such as the memory units 224A-224N of FIG. 2 (e.g., within parallel processor memory 222).

In graphics applications, the ROP 226 is a processing unit that performs raster operations, such as stencil, z test, blending, and the like, and outputs pixel data as processed graphics data for storage in graphics memory. In some embodiments, ROP 226 may be configured to compress z or color data that is written to memory and decompress z or color data that is read from memory. In some embodiments, the ROP 226 is included within each processing cluster (e.g., cluster 214A-214N of FIG. 2) instead of within the partition unit 220. In such embodiment, read and write requests for pixel data are transmitted over the memory crossbar 216 instead of pixel fragment data.

The processed graphics data may be displayed on display device, such as one of the one or more display device(s) 110 of FIG. 1, routed for further processing by the processor(s) 102, or routed for further processing by one of the processing entities within the parallel processor 200 of FIG. 2A.

Figure 2C:
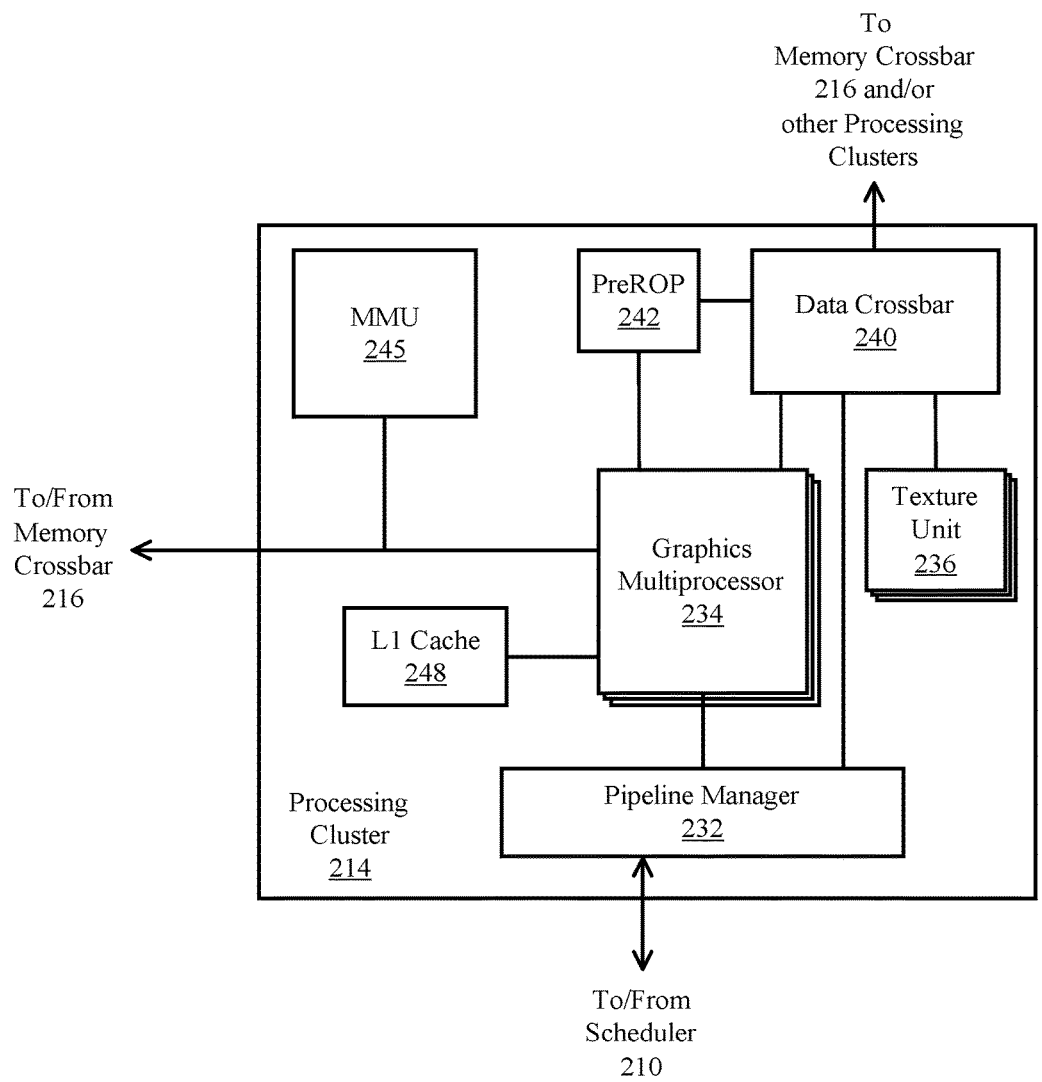

FIG. 2C is a block diagram of a processing cluster 214 within a parallel processing unit, according to an embodiment. In one embodiment the processing cluster is an instance of one of the processing clusters 214A-214N of FIG. 2. The processing cluster 214 can be configured to execute many threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the processing clusters. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

Operation of the processing cluster 214 can be controlled via a pipeline manager 232 that distributes processing tasks to SIMT parallel processors. The pipeline manager 232 receives instructions from the scheduler 210 of FIG. 2 and manages execution of those instructions via a graphics multiprocessor 234 and/or a texture unit 236. The illustrated graphics multiprocessor 234 is an exemplary instance of an SIMT parallel processor. However, various types of SIMT parallel processors of differing architectures may be included within the processing cluster 214. One or more instances of the graphics multiprocessor 234 can be included within a processing cluster 214. The graphics multiprocessor 234 can process data and a data crossbar 240 can be used to distribute the processed data to one of multiple possible destinations, including other shader units. The pipeline manager 232 can facilitate the distribution of processed data by specifying destinations for processed data to be distributed vis the data crossbar 240.

Each graphics multiprocessor 234 within the processing cluster 214 can include an identical set of functional execution logic (e.g., arithmetic logic units, load-store units, etc.), which may be pipelined, allowing a new instruction to be issued before a previous instruction has finished. Any combination of functional execution logic may be provided. In one embodiment, the functional logic supports a variety of operations including integer and floating point arithmetic (e.g., addition and multiplication), comparison operations, Boolean operations (AND, OR, XOR), bit-shifting, and computation of various algebraic functions (e.g., planar interpolation, trigonometric, exponential, and logarithmic functions, etc.); and the same functional-unit hardware can be leveraged to perform different operations.

The series of instructions transmitted to the processing cluster 214 constitutes a thread, as previously defined herein, and the collection of a certain number of concurrently executing threads across the parallel processing engines (not shown) within an graphics multiprocessor 234 is referred to herein as a thread group. As used herein, a thread group refers to a group of threads concurrently executing the same program on different input data, with one thread of the group being assigned to a different processing engine within a graphics multiprocessor 234. A thread group may include fewer threads than the number of processing engines within the graphics multiprocessor 234, in which case some processing engines will be idle during cycles when that thread group is being processed. A thread group may also include more threads than the number of processing engines within the graphics multiprocessor 234, in which case processing will take place over consecutive clock cycles. Each graphics multiprocessor 234 can support up to G thread groups concurrently. Additionally, a plurality of related thread groups may be active (in different phases of execution) at the same time within a graphics multiprocessor 234.

In one embodiment the graphics multiprocessor 234 includes an internal cache memory to perform load and store operations. In one embodiment, the graphics multiprocessor 234 can forego an internal cache and use a cache memory (e.g., L1 cache 308) within the processing cluster 214. Each graphics multiprocessor 234 also has access to L2 caches within the partition units (e.g., partition units 220A-220N of FIG. 2) that are shared among all processing clusters 214 and may be used to transfer data between threads. The graphics multiprocessor 234 may also access off-chip global memory, which can include one or more of local parallel processor memory and/or system memory. Any memory external to the parallel processing unit 202 may be used as global memory. Embodiments in which the processing cluster 214 includes multiple instances of the graphics multiprocessor 234 can share common instructions and data, which may be stored in the L1 cache 308.

Each processing cluster 214 may include an MMU 245 (memory management unit) that is configured to map virtual addresses into physical addresses. In other embodiments, one or more instances of the MMU 245 may reside within the memory interface 218 of FIG. 2. The MMU 245 includes a set of page table entries (PTEs) used to map a virtual address to a physical address of a tile (talk more about tiling) and optionally a cache line index. The MMU 245 may include address translation lookaside buffers (TLB) or caches that may reside within the graphics multiprocessor 234 or the L1 cache or processing cluster 214. The physical address is processed to distribute surface data access locality to allow efficient request interleaving among partition units. The cache line index may be used to determine whether or not a request for a cache line is a hit or miss.

In graphics and computing applications, a processing cluster 214 may be configured such that each graphics multiprocessor 234 is coupled to a texture unit 236 for performing texture mapping operations, e.g., determining texture sample positions, reading texture data, and filtering the texture data. Texture data is read from an internal texture L1 cache (not shown) or in some embodiments from the L1 cache within graphics multiprocessor 234 and is fetched from an L2 cache, local parallel processor memory, or system memory, as needed. Each graphics multiprocessor 234 outputs processed tasks to the data crossbar 240 to provide the processed task to another processing cluster 214 for further processing or to store the processed task in an L2 cache, local parallel processor memory, or system memory via the memory crossbar 216. A preROP 242 (pre-raster operations unit) is configured to receive data from graphics multiprocessor 234, direct data to ROP units, which may be located with partition units as described herein (e.g., partition units 220A-220N of FIG. 2). The preROP 242 unit can perform optimizations for color blending, organize pixel color data, and perform address translations.

It will be appreciated that the core architecture described herein is illustrative and that variations and modifications are possible. Any number of processing units, e.g., graphics multiprocessor 234, texture units 236, preROPs 242, etc., may be included within a processing cluster 214. Further, while only one processing cluster 214 is shown, a parallel processing unit as described herein may include any number of instances of the processing cluster 214. In one embodiment, each processing cluster 214 can be configured to operate independently of other processing clusters 214 using separate and distinct processing units, L1 caches, etc.

Figure 2D:
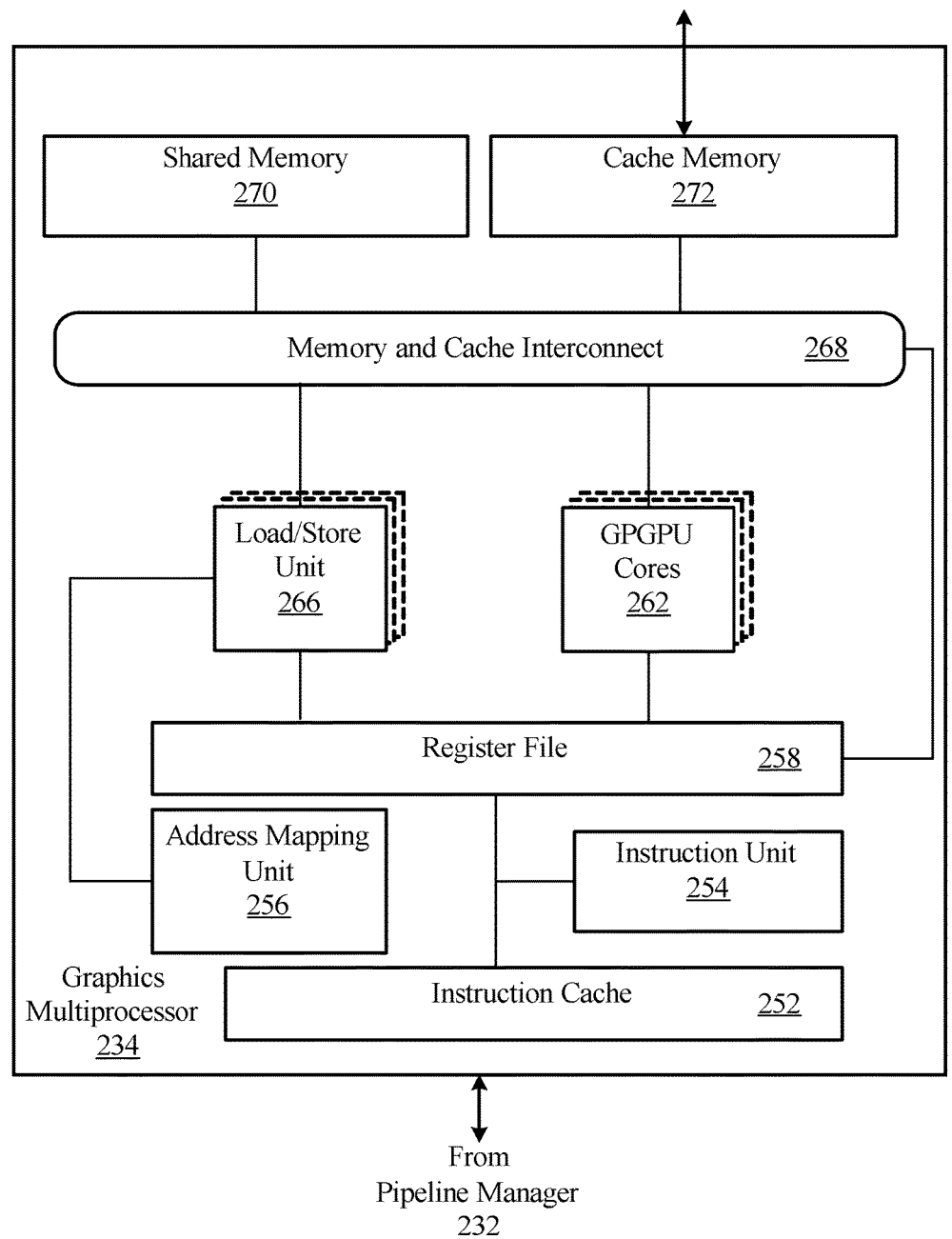

FIG. 2D shows a graphics multiprocessor 234, according to one embodiment. In such embodiment the graphics multiprocessor 234 couples with the pipeline manager 232 of the processing cluster 214. The graphics multiprocessor 234 has an execution pipeline including but not limited to an instruction cache 252, an instruction unit 254, an address mapping unit 256, a register file 258, one or more general purpose graphics processing unit (GPGPU) cores 262, and one or more load/store units 266. The GPGPU cores 262 and load/store units 266 are coupled with cache memory 272 and shared memory 270 via a memory and cache interconnect 268.

In one embodiment, the instruction cache 252 receives a stream of instructions to execute from the pipeline manager 232. The instructions are cached in the instruction cache 252 and dispatched for execution by the instruction unit 254. The instruction unit 254 can dispatch instructions as thread groups (e.g., warps), with each thread of the thread group assigned to a different execution unit within GPGPU core 262. An instruction can access any of a local, shared, or global address space by specifying an address within a unified address space. The address mapping unit 256 can be used to translate addresses in the unified address space into a distinct memory address that can be accessed by the load/store units 266.

The register file 258 provides a set of registers for the functional units of the graphics multiprocessor 324. The register file 258 provides temporary storage for operands connected to the data paths of the functional units (e.g., GPGPU cores 262, load/store units 266) of the graphics multiprocessor 324. In one embodiment, the register file 258 is divided between each of the functional units such that each functional unit is allocated a dedicated portion of the register file 258. In one embodiment, the register file 258 is divided between the different warps being executed by the graphics multiprocessor 324.

The GPGPU cores 262 can each include floating point units (FPUs) and/or integer arithmetic logic units (ALUs) that are used to execute instructions of the graphics multiprocessor 324. The GPGPU cores 262 can be similar in architecture or can differ in architecture, according to embodiments. For example and in one embodiment, a first portion of the GPGPU cores 262 include a single precision FPU and an integer ALU while a second portion of the GPGPU cores include a double precision FPU. In one embodiment the FPUs can implement the IEEE 754-2008 standard for floating point arithmetic or enable variable precision floating point arithmetic. The graphics multiprocessor 324 can additionally include one or more fixed function or special function units to perform specific functions such as copy rectangle or pixel blending operations. In one embodiment one or more of the GPGPU cores can also include fixed or special function logic, The memory and cache interconnect 268 is an interconnect network that connects each of the functional units of the graphics multiprocessor 324 to the register file 258 and to the shared memory 270. In one embodiment, the memory and cache interconnect 268 is a crossbar interconnect that allows the load/store unit 266 to implement load and store operations between the shared memory 270 and the register file 258. In one embodiment the shared memory 270 can be used to enable communication between threads that execute on the functional units. The cache memory 272 can be used as a data cache for example, to cache texture data communicated between the functional units and the texture unit 236.

Figure 3A:
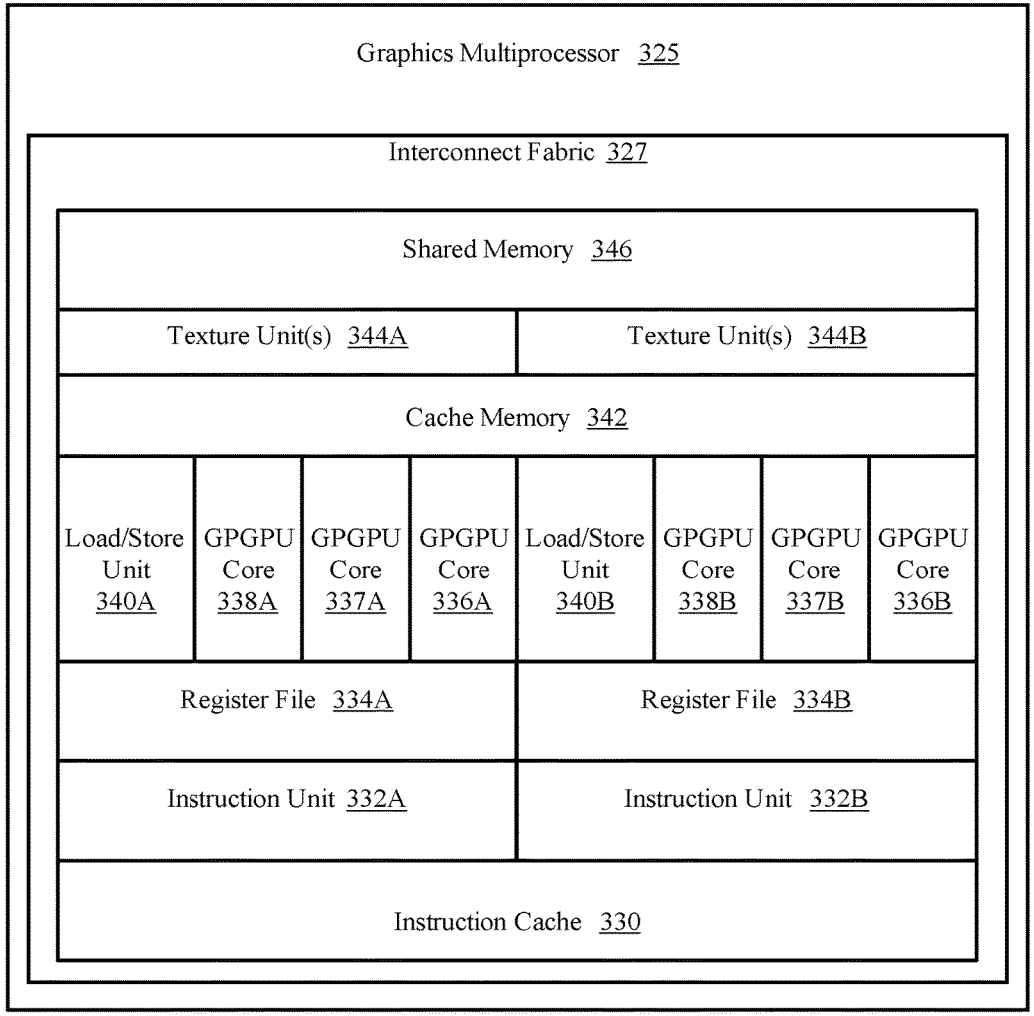
FIGS. 3A-3B are block diagrams of graphics multiprocessors, according to embodiments.
Figure 3B:
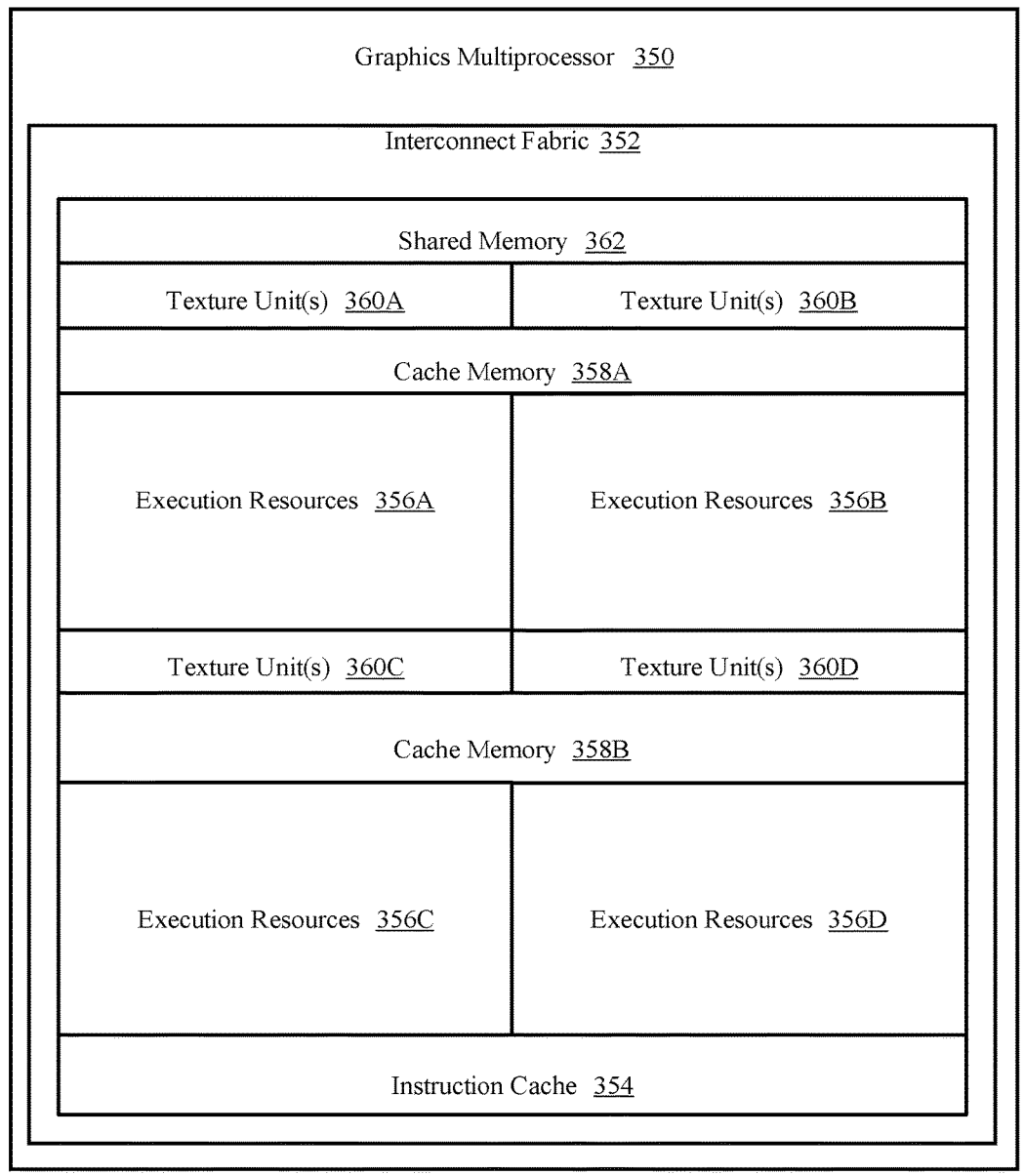

FIGS. 3A-3B illustrate additional graphics multiprocessors, according to embodiments. The illustrated graphics multiprocessors 325, 350 are variants of the graphics multiprocessor 234 of FIG. 2C. The illustrated graphics multiprocessors 325, 350 can be configured as a streaming multiprocessor (SM) capable of simultaneous execution of a large number of execution threads.

FIG. 3A shows a graphics multiprocessor 325 according to an additional embodiment. The graphics multiprocessor 325 includes multiple additional instances of execution resource units relative to the graphics multiprocessor 234 of FIG. 2D. For example, the graphics multiprocessor 325 can include multiple instances of the instruction unit 332A-332B, register file 334A-334B, and texture unit(s) 344A-344B. The graphics multiprocessor 325 also includes multiple sets of graphics or compute execution units (e.g., GPGPU core 336A-336B, GPGPU core 337A-337B, GPGPU core 338A-338B) and multiple sets of load/store units 340A-340B. In one embodiment the execution resource units have a common instruction cache 330, texture and/or data cache memory 342, and shared memory 346. The various components can communicate via an interconnect fabric 327. In one embodiment the interconnect fabric 327 includes one or more crossbar switches to enable communication between the various components of the graphics multiprocessor 325.

FIG. 3B shows a graphics multiprocessor 350 according to an additional embodiment. The graphics processor includes multiple sets of execution resources 356A-356D, where each set of execution resource includes multiple instruction units, register files, GPGPU cores, and load store units, as illustrated in FIG. 2D and FIG. 3A. The execution resources 356A-356D can work in concert with texture unit(s) 360A-360D for texture operations, while sharing an instruction cache 354, and shared memory 362. In one embodiment the execution resources 356A-356D can share an instruction cache 354 and shared memory 362, as well as multiple instances of a texture and/or data cache memory 358A-358B. The various components can communicate via an interconnect fabric 352 similar to the interconnect fabric 327 of FIG. 3A.

Persons skilled in the art will understand that the architecture described in FIGS. 1, 2A-2D, and 3A-3B are descriptive and not limiting as to the scope of the present embodiments. Thus, the techniques described herein may be implemented on any properly configured processing unit, including, without limitation, one or more mobile application processors, one or more desktop or server central processing units (CPUs) including multi-core CPUs, one or more parallel processing units, such as the parallel processing unit 202 of FIG. 2, as well as one or more graphics processors or special purpose processing units, without departure from the scope of the embodiments described herein.

In some embodiments a parallel processor or GPGPU as described herein is communicatively coupled to host/processor cores to accelerate graphics operations, machine-learning operations, pattern analysis operations, and various general purpose GPU (GPGPU) functions. The GPU may be communicatively coupled to the host processor/cores over a bus or other interconnect (e.g., a high speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

Techniques for GPU to Host Processor Interconnection

Figure 4A:
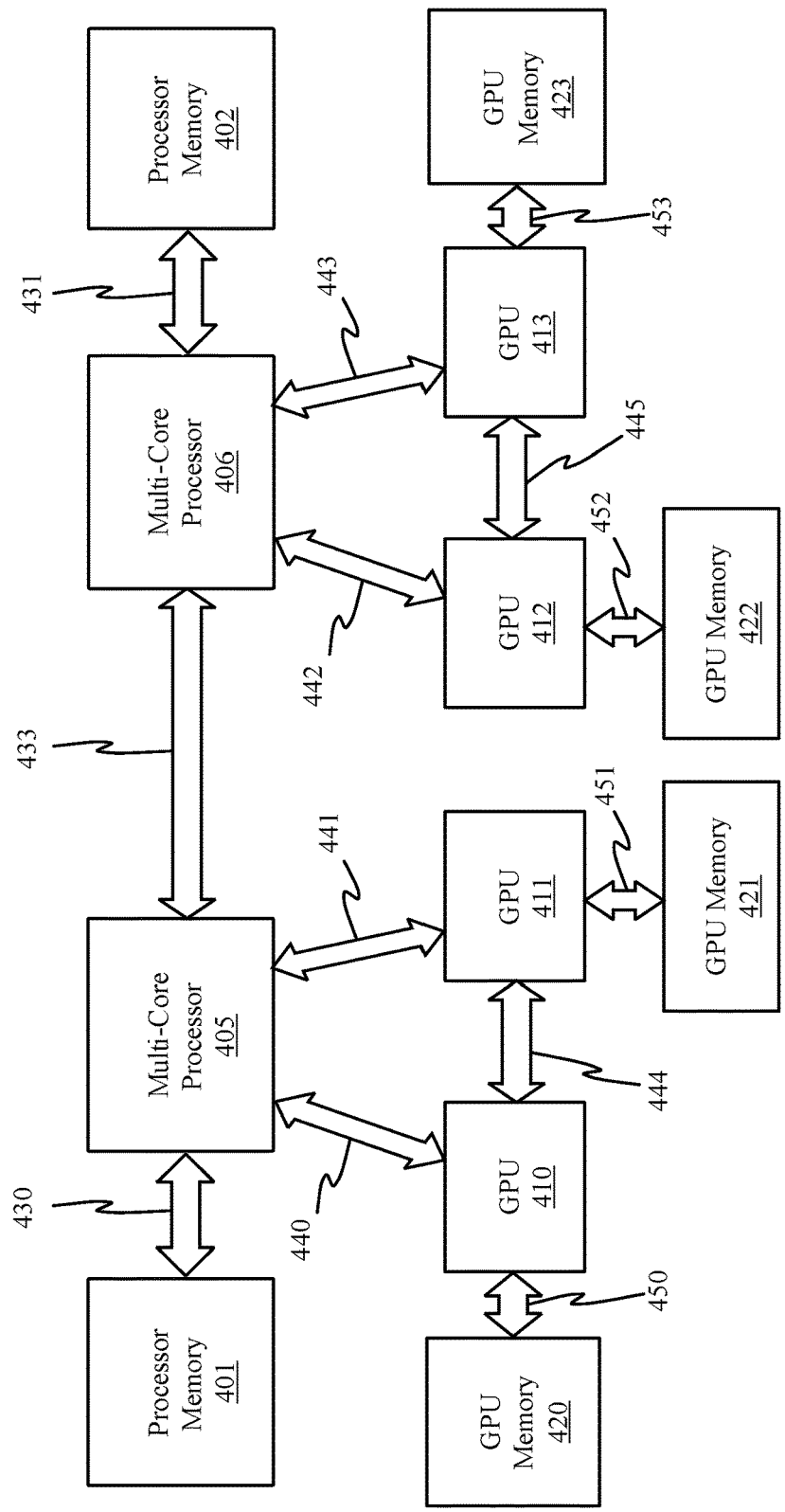

FIG. 4A illustrates an exemplary architecture in which a plurality of GPUs 410-413 are communicatively coupled to a plurality of multi-core processors 405-406 over high-speed links 440-443 (e.g., buses, point-to-point interconnects, etc.). In one embodiment, the high-speed links 440-443 support a communication throughput of 4 GB/s, 30 GB/s, 80 GB/s or higher, depending on the implementation. Various interconnect protocols may be used including, but not limited to, PCIe 4.0 or 5.0 and NVLink 2.0. However, the underlying principles of the invention are not limited to any particular communication protocol or throughput.

In addition, in one embodiment, two or more of the GPUs 410-413 are interconnected over high-speed links 444-445, which may be implemented using the same or different protocols/links than those used for high-speed links 440-443. Similarly, two or more of the multi-core processors 405-406 may be connected over high speed link 433 which may be symmetric multi-processor (SMP) buses operating at 20 GB/s, 30 GB/s, 120 GB/s or higher. Alternatively, all communication between the various system components shown in FIG. 4A may be accomplished using the same protocols/links (e.g., over a common interconnection fabric). As mentioned, however, the underlying principles of the invention are not limited to any particular type of interconnect technology.

In one embodiment, each multi-core processor 405-406 is communicatively coupled to a processor memory 401-402, via memory interconnects 430-431, respectively, and each GPU 410-413 is communicatively coupled to GPU memory 420-423 over GPU memory interconnects 450-453, respectively. The memory interconnects 430-431 and 450-453 may utilize the same or different memory access technologies. By way of example, and not limitation, the processor memories 401-402 and GPU memories 420-423 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In one embodiment, some portion of the memories may be volatile memory and another portion may be non-volatile memory (e.g., using a two-level memory (2LM) hierarchy).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

Figure 4B:
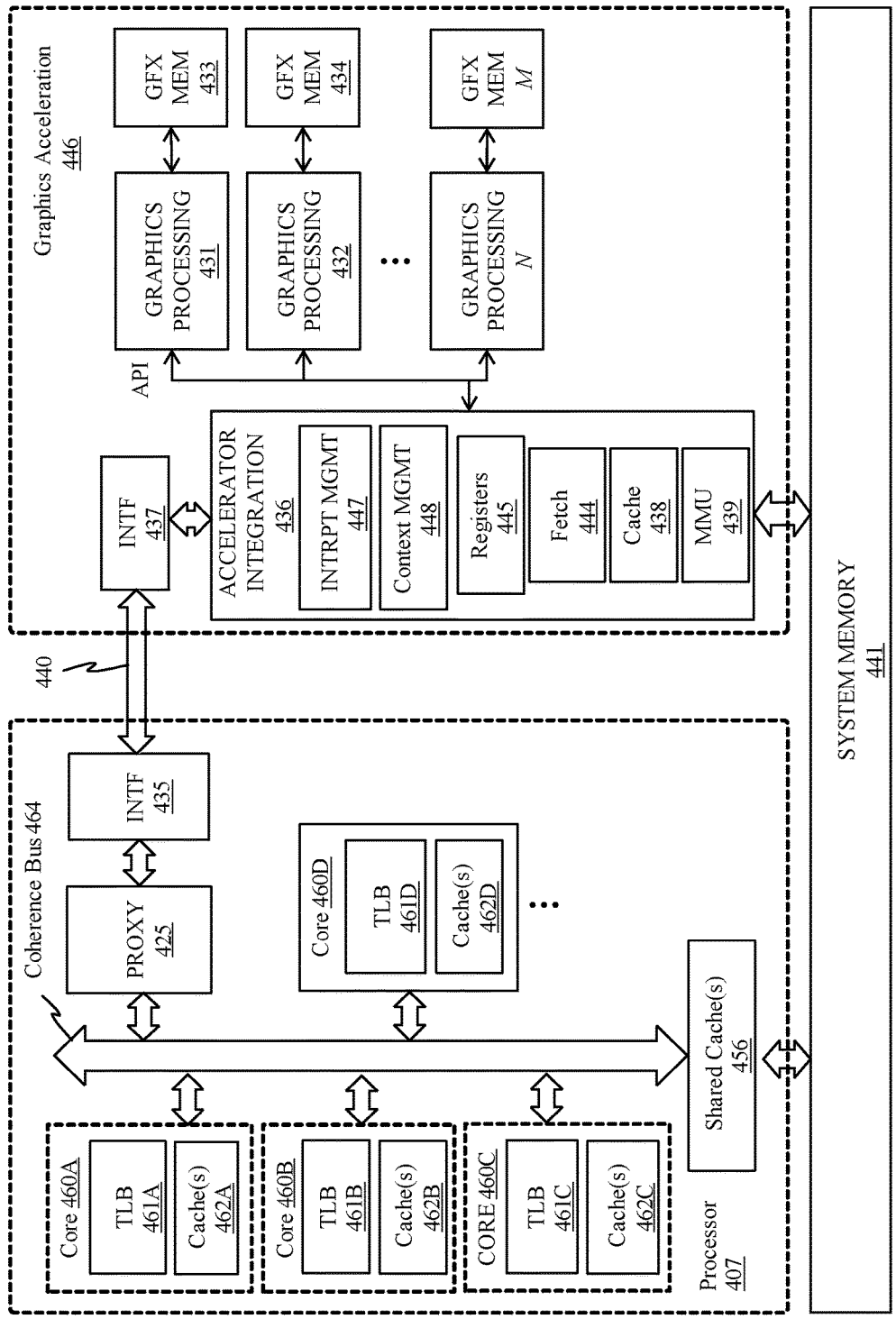

FIG. 4B illustrates additional details for an interconnection between a multi-core processor 407 and a graphics acceleration module 446 in accordance with one embodiment. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the invention (e.g., instruction fetch units, branch prediction units, decoders, execution units, reorder buffers, etc.). The caches 462A-462D may comprise level 1 (L1) and level 2 (L2) caches. In addition, one or more shared caches 426 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402

Coherency is maintained for data and instructions stored in the various caches 462A-462D, 456 and system memory 441 via inter-core communication over a coherence bus 464. For example, each cache may have cache coherency logic/ circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles of the invention.

In one embodiment, a proxy circuit 425 communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

In one embodiment, the accelerator integration circuit 436 includes a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431-432, N. In one embodiment, the data stored in cache 438 and graphics memories 433-434, N is kept coherent with the core caches 462A-462D, 456 and system memory 411. As mentioned, this may be accomplished via proxy circuit 425 which takes part in the cache coherency mechanism on behalf of cache 438 and memories 433-434, N (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and restore contexts of the various threads during contexts switches (e.g., where a first thread is saved and a second thread is stored so that the second thread can be execute by a graphics processing engine). For example, on a context switch, the context management circuit 448 may store current register values to a designated region in memory (e.g., identified by a context pointer). It may then restore the register values when returning to the context. In one embodiment, an interrupt management circuit 447 receives and processes interrupts received from system devices.

In one implementation, virtual/effective addresses from a graphics processing engine 431 are translated to real/physical addresses in system memory 411 by the MMU 439. One embodiment of the accelerator integration circuit 436 supports multiple (e.g., 4, 8, 16) graphics accelerator modules 446 and/or other accelerator devices. The graphics accelerator module 446 may be dedicated to a single application executed on the processor 407 or may be shared between multiple applications. In one embodiment, a virtualized graphics execution environment is presented in which the resources of the graphics processing engines 431-432, N are shared with multiple applications or virtual machines (VMs). The resources may be subdivided into "slices" which are allocated to different VMs and/or applications based on the processing requirements and priorities associated with the VMs and/or applications.

Thus, the accelerator integration circuit acts as a bridge to the system for the graphics acceleration module 446 and provides address translation and system memory cache services. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One function of the accelerator integration circuit 436, in one embodiment, is the physical separation of the graphics processing engines 431-432, N so that they appear to the system as independent units.

As mentioned, in the illustrated embodiment, one or more graphics memories 433-434, M are coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6), or HBM, and/or may be non-volatile memories such as 3D XPoint or Nano-Ram.

In one embodiment, to reduce data traffic over link 440, biasing techniques are used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 411.

FIG. 4C illustrates another embodiment in which the accelerator integration circuit 436 is integrated within the processor 407. In this embodiment, the graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherency bus 462 and caches 462A-462D, 426.

One embodiment supports different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In one embodiment of the dedicated process model, graphics processing engines 431-432, N are dedicated to a single application or process under a single operating system. The single application can funnel other application requests to the graphics engines 431-432, N, providing virtualization within a VM/partition.

In the dedicated-process programming models, the graphics processing engines 431-432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. In one embodiment, process elements are stored in system memory 411 and are addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

Figure 4D:
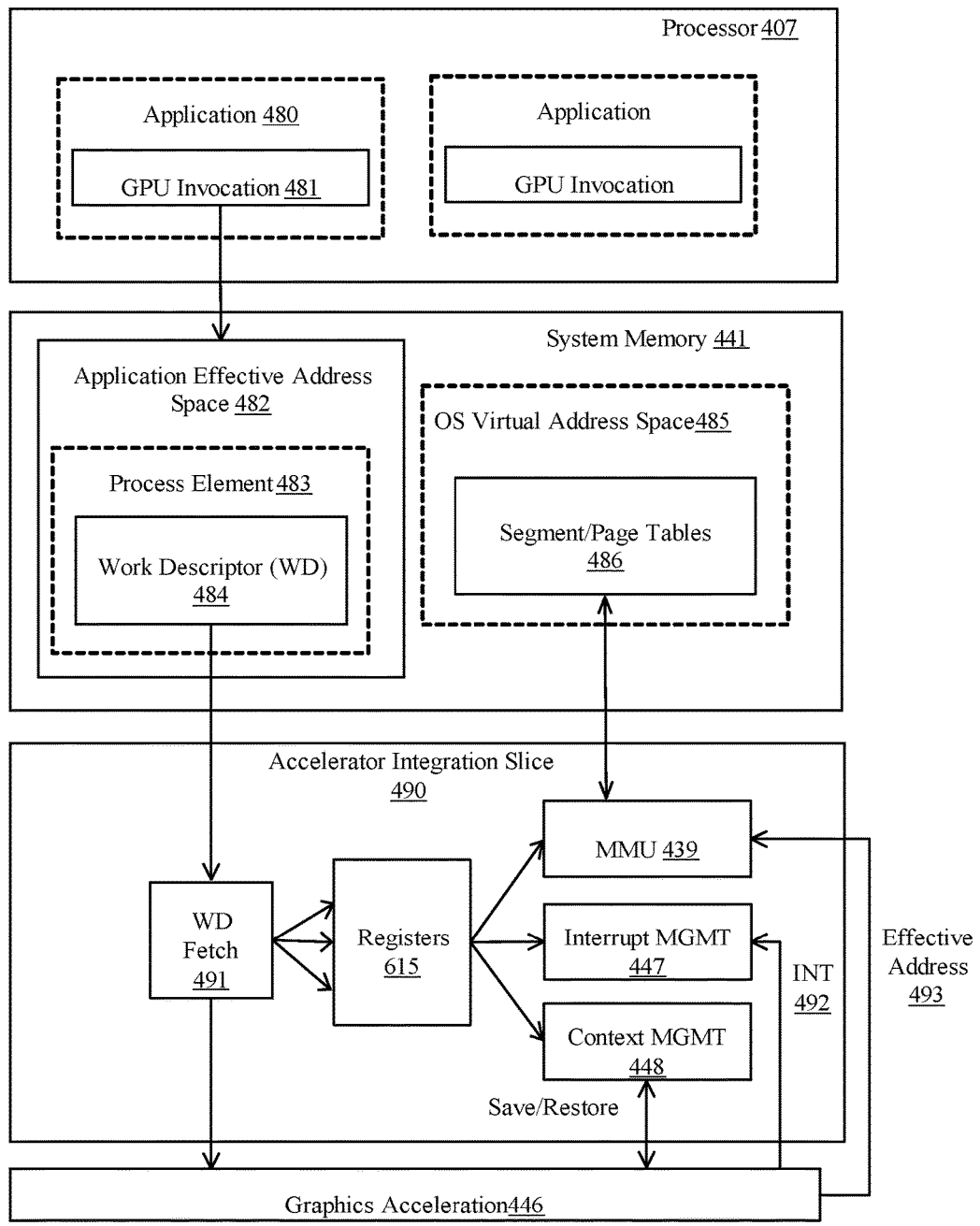

FIG. 4D illustrates an exemplary accelerator integration slice 490. As used herein, a "slice" comprises a specified portion of the processing resources of the accelerator integration circuit 436. Application effective address space 482 within system memory 411 stores process elements 483. In one embodiment, the process elements 483 are stored in response to GPU invocations 481 from applications 480 executed on the processor 407. A process element 483 contains the process state for the corresponding application 480. A work descriptor (WD) 484 contained in the process element 483 can be a single job requested by an application or may contain a pointer to a queue of jobs. In the latter case, the WD 484 is a pointer to the job request queue in the application's address space 482.

The graphics acceleration module 446 and/or the individual graphics processing engines 431-432, N can be shared by all or a subset of the processes in the system. Embodiments of the invention include an infrastructure for setting up the process state and sending a WD 484 to a graphics acceleration module 446 to start a job in a virtualized environment.

In one implementation, the dedicated-process programming model is implementation-specific. In this model, a single process owns the graphics acceleration module 446 or an individual graphics processing engine 431. Because the graphics acceleration module 446 is owned by a single process, the hypervisor initializes the accelerator integration circuit 436 for the owning partition and the operating system initializes the accelerator integration circuit 436 for the owning process at the time when the graphics acceleration module 446 is assigned.

In operation, a WD fetch unit 491 in the accelerator integration slice 490 fetches the next WD 484 which includes an indication of the work to be done by one of the graphics processing engines of the graphics acceleration module 446. Data from the WD 484 may be stored in registers 445 and used by the MMU 439, interrupt management circuit 447 and/or context management circuit 446 as illustrated. For example, one embodiment of the MMU 439 includes segment/page walk circuitry for accessing segment/page tables 486 within the OS virtual address space 485. The interrupt management circuit 447 may process interrupt events 492 received from the graphics acceleration module 446. When performing graphics operations, an effective address 493 generated by a graphics processing engine 431-432, N is translated to a real address by the MMU 439.

In one embodiment, the same set of registers 445 are duplicated for each graphics processing engine 431-432, N and/or graphics acceleration module 446 and may be initialized by the hypervisor or operating system. Each of these duplicated registers may be included in an accelerator integration slice 490. Exemplary registers that may be initialized by the hypervisor are shown in Table 1.

TABLE 1

Hypervisor Initialized Registers

| | |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by the operating system are shown in Table 2.

TABLE 2

Operating System Initialized Registers

| | |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In one embodiment, each WD 484 is specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

Figure 4E:
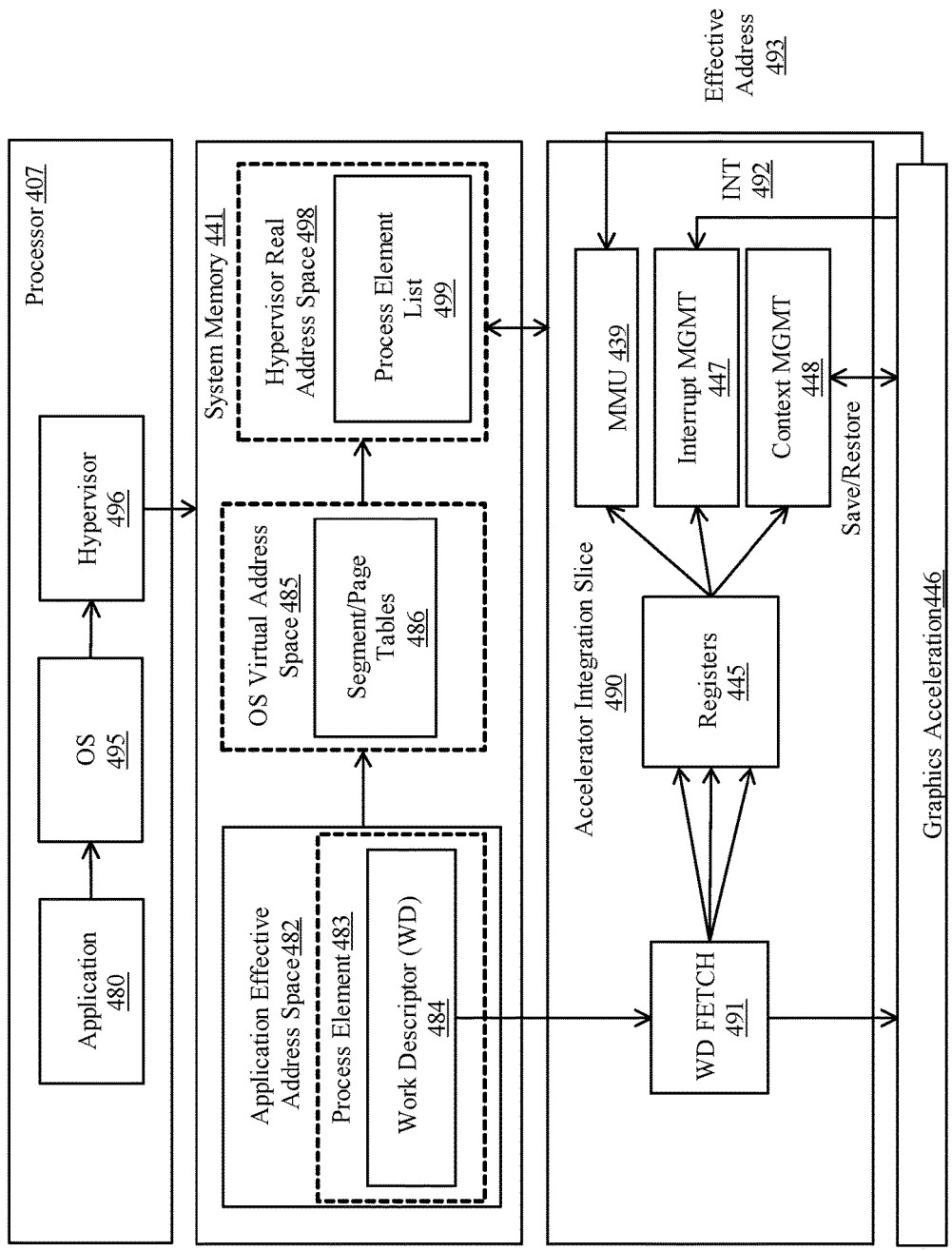

FIG. 4E illustrates additional details for one embodiment of a shared model. This embodiment includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

In one embodiment, for the shared model, the application 480 is required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. In one embodiment, the CSRP is one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

OS to Hypervisor Call Parameters

1 A work descriptor (WD)
2 An Authority Mask Register (AMR) value (potentially masked).
3 An effective address (EA) Context Save/Restore Area Pointer (CSRP)
4 A process ID (PID) and optional thread ID (TID)
5 A virtual address (VA) accelerator utilization record pointer (AURP)
6 The virtual address of the storage segment table pointer (SSTP)
7 A logical interrupt service number (LISN)

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

Process Element Information

1 A work descriptor (WD)
2 An Authority Mask Register (AMR) value (potentially masked).
3 An effective address (EA) Context Save/Restore Area Pointer (CSRP)
4 A process ID (PID) and optional thread ID (TID)
5 A virtual address (VA) accelerator utilization record pointer (AURP)
6 The virtual address of the storage segment table pointer (SSTP)
7 A logical interrupt service number (LISN)
8 Interrupt vector table, derived from the hypervisor call parameters.
9 A state register (SR) value
10 A logical partition ID (LPID)
11 A real address (RA) hypervisor accelerator utilization record pointer
12 The Storage Descriptor Register (SDR)

In one embodiment, the hypervisor initializes a plurality of accelerator integration slice 490 registers 445.

Figure 4F:
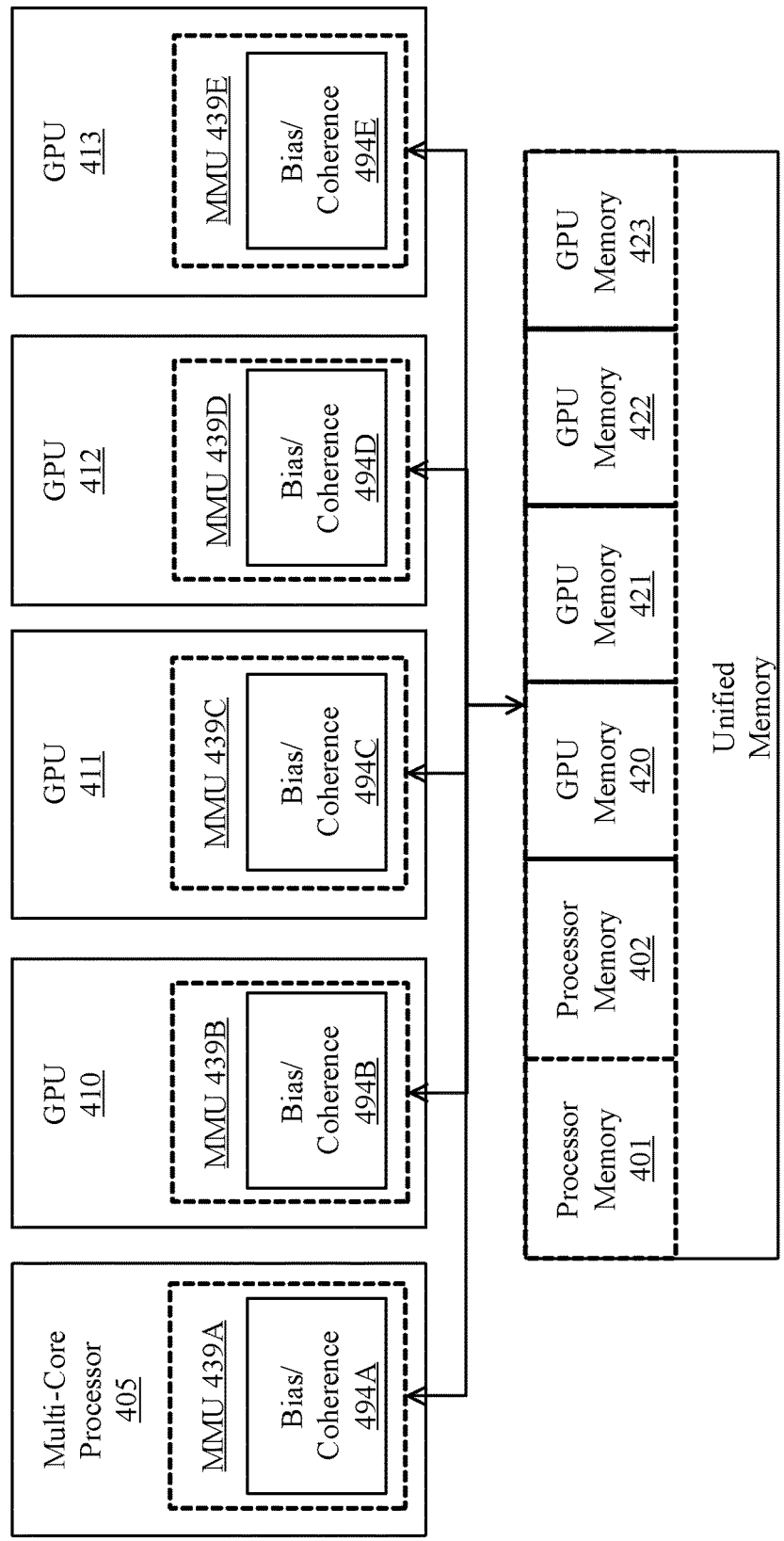

As illustrated in FIG. 4F, one embodiment of the invention employs a unified memory addressable via a common virtual memory address space used to access the physical processor memories 401-402 and GPU memories 420-423. In this implementation, operations executed on the GPUs 410-413 utilize the same virtual/effective memory address space to access the processors memories 401-402 and vice versa, thereby simplifying programmability. In one embodiment, a first portion of the virtual/effective address space is allocated to the processor memory 401, a second portion to the second processor memory 402, a third portion to the GPU memory 420, and so on. The entire virtual/effective memory space (sometimes referred to as the effective address space) is thereby distributed across each of the processor memories 401-402 and GPU memories 420-423, allowing any processor or GPU to access any physical memory with a virtual address mapped to that memory.

In one embodiment, bias/coherence management circuitry 494A-494E within one or more of the MMUs 439A-439E ensures cache coherence between the caches of the host processors (e.g., 405) and the GPUs 410-413 and also implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

One embodiment allows GPU-attached memory 420-423 to be mapped as part of system memory, and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

In one implementation, the selection of between GPU bias and host processor bias is driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high speed link as discussed above). In one embodiment, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g. OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias, but is not required for the opposite transition.

In one embodiment, cache coherency is maintained by temporarily rendering GPU-biased pages uncacheable by the host processor 405. In order to access these pages, the processor 405 may request access from the GPU 410 which may or may not grant access right away, depending on the implementation. Thus, to reduce communication between the processor 405 and GPU 410 it is beneficial to ensure that GPU-biased pages are those which are required by the GPU but not the host processor 405 and vice versa.

Graphics Processing Pipeline

Figure 5:
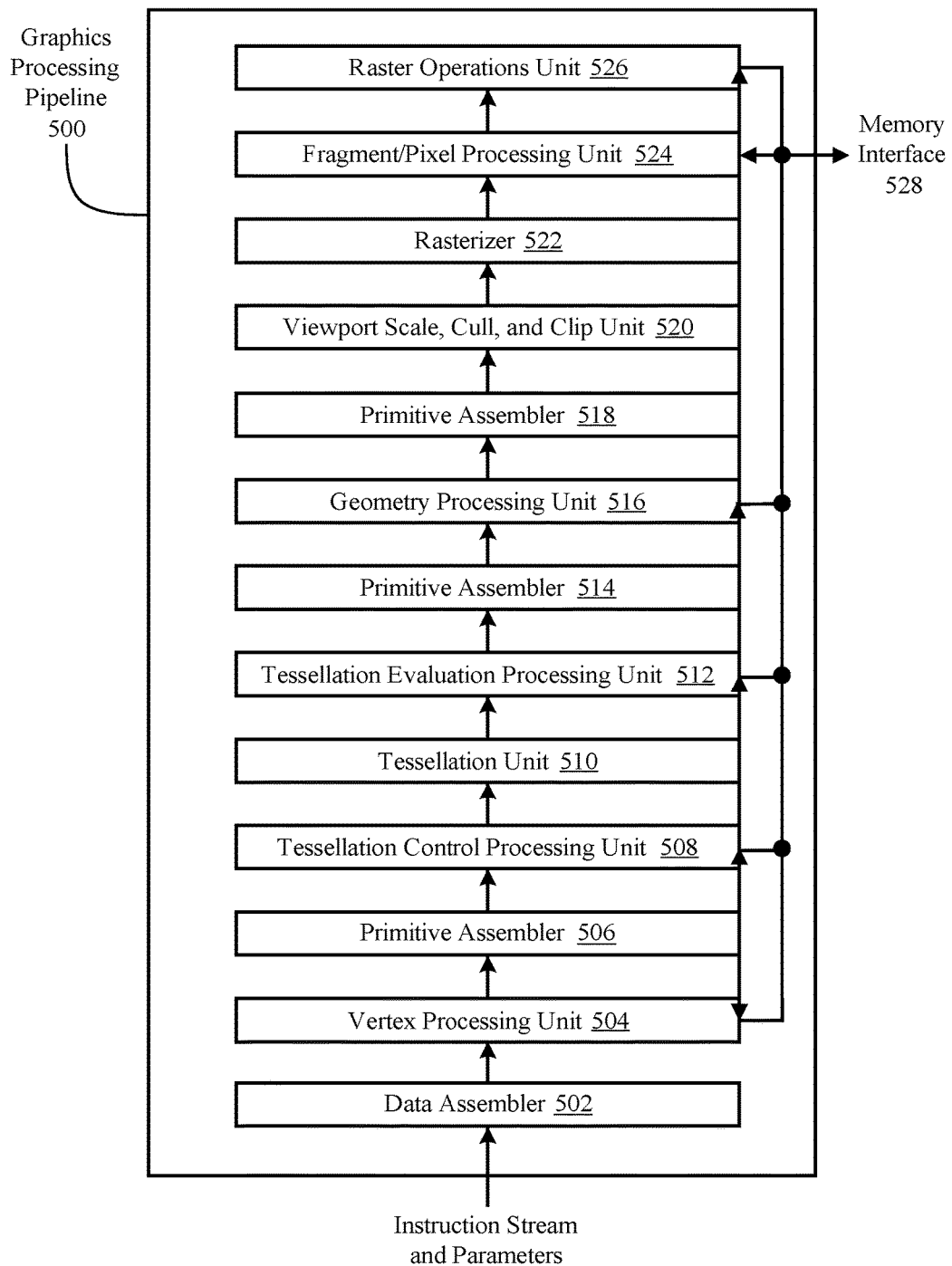
FIG. 5 is a conceptual diagram of a graphics processing pipeline, according to an embodiment.

FIG. 5 is a conceptual diagram of a graphics processing pipeline 500, according to an embodiment. In one embodiment a graphics processor can implement the illustrated graphics processing pipeline 500. The graphics processor can be included within the parallel processing subsystems as described herein, such as the parallel processor 200 of FIG. 2, which, in one embodiment, is a variant of the parallel processor(s) 112 of FIG. 1. The various parallel processing systems can implement the graphics processing pipeline 500 via one or more instances of the parallel processing unit (e.g., parallel processing unit 202 of FIG. 2) as described herein. For example, a shader unit (e.g., graphics multiprocessor 234 of FIG. 3) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 3) and a corresponding partition unit (e.g., partition unit 220A-220N of FIG. 2). Alternately, the graphics processing pipeline 500 may be implemented using dedicated processing units for one or more functions. In one embodiment, one or more portions of the graphics processing pipeline 500 can be performed in by a parallel processing logic within a general purpose processor (e.g., CPU). In one embodiment, one or more portions of the graphics processing pipeline 500 can access on-chip memory (e.g., parallel processor memory 222 as in FIG. 2) via a memory interface 528, which may be an instance of the memory interface 218 of FIG. 2.

In one embodiment the data assembler 502 is a processing unit that collects vertex data for high-order surfaces, primitives, etc., and outputs the vertex data, including the vertex attributes, to the vertex processing unit 504. The vertex processing unit 504 is a programmable execution unit that is configured to execute vertex shader programs, lighting and transforming vertex data as specified by the vertex shader programs. For example, vertex processing unit 504 may be programmed to transform the vertex data from an object-based coordinate representation (object space) to an alternatively based coordinate system such as world space or normalized device coordinates (NDC) space. Vertex processing unit 504 may read data that is stored in cache, local or system memory for use in processing the vertex data.

A first instance of a primitive assembler 506 receives vertex attributes from the vertex processing unit 504, reading stored vertex attributes as needed, and constructs graphics primitives for processing by tessellation control processing unit 508, where the graphics primitives include triangles, line segments, points, patches, and so forth, as supported by various graphics processing application programming interfaces (APIs).

The tessellation control processing unit 508 treats the input vertices as control points for a geometric patch and transforms these control points from the patch's input representation, often called the patch's basis, into a representation suitable for efficient surface evaluation by the tessellation evaluation processing unit 512. The tessellation control processing unit 508 also computes tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that is configured to execute geometry shader programs, transforming graphics primitives received from primitive assembler 514 as specified by the geometry shader programs. For example, the geometry processing unit 516 may be programmed to subdivide the graphics primitives into one or more new graphics primitives and calculate parameters, such as plane equation coefficients, that are used to rasterize the new graphics primitives.

In some embodiments the geometry processing unit 516 may also add or delete elements in the geometry stream. Geometry processing unit 516 outputs the parameters and vertices specifying new graphics primitives to primitive assembler 518, which receives the parameters and vertices from the geometry processing unit 516, reading stored vertex attributes, as needed, and constructs graphics primitives for processing by a viewport scale, cull, and clip unit 520. The geometry processing unit 516 may read data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 scan converts the new graphics primitives and outputs fragment and coverage data to the fragment/pixel processing unit 524. Additionally, the rasterizer 522 may be configured to perform z culling and other z-based optimizations.

The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations such as perspective correction, texture mapping, shading, blending, and the like, to produce shaded fragments or pixels that are output to raster operations unit 526. The fragment/pixel processing unit 524 may read data that is stored in parallel processor memory or system memory for use in processing the fragment data. Fragment or pixel shader programs may be configured to shade at the sample, pixel, tile, or other granularity, depending on the programmed sampling rate.

The raster operations unit 526 is a processing unit that performs raster operations, such as stencil, z test, blending, and the like, and outputs pixel data as processed graphics data for storage in graphics memory. The processed graphics data may be stored in graphics memory, e.g., parallel processor memory 222 as in FIG. 2, and/or system memory 104 as in FIG. 1, for display on one of the one or more display device(s) 110 or for further processing by one of the one or more processor(s) 102 or parallel processor(s) 112. In some embodiments the raster operations unit 526 is configured to compress z or color data that is written to memory and decompress z or color data that is read from memory.

Pulse Triggered Flip Flop

Power reduction in integrated circuits continues to be one of the primary objectives in the field of digital system design, especially in light of increasing throughput required by modern systems. The majority of these systems are fully or primarily synchronous, requiring the distribution of clocks across the entire chip. The clock system consisting of clock distribution networks and sequential elements is one of the most power consuming very large scale integration (VLSI) components.

Reduction of flip flop power consumption has an impact on the total power consumption. Since power consumption is a major bottleneck of system performance, the clock load should be reduced to reduce the power consumption.

The clock distribution network distributes the clock signal from a common point to all the elements that need it. Since this function is vital in synchronous systems, much attention has been given to the characteristics of these clock signals and the electrical network used in their distribution. In synchronous systems, clock distribution networks consume large amounts of total power because of the higher operation frequency of the highest capacitance.

In one conventional rising edge flip flop design, the clock load on the conventional rising edge flip flop design is 12 transistors. Since the clock makes transitions in idle clock cycles, which causes transitions in the internal nodes, all transistors in the load contribute significantly to the flip flop dynamic power consumption.

A pulse triggered flip flop circuit includes an exclusive OR clock generating stage that receives an input clock, data and produces an output clock pulse. The stage produces a output clock pulse that only goes away when the data is fully captured. The stage disables the output clock pulse only when the data is fully captured. Moreover, the circuit only toggles when the input data changes, reducing power consumption in some embodiments.

An effective way to reduce capacity of a clock load is to reduce the number of clocked transistors. Hence, a pulsed flip flop may include a reduced number of local clocked transistors in some embodiments.

Figure 6:
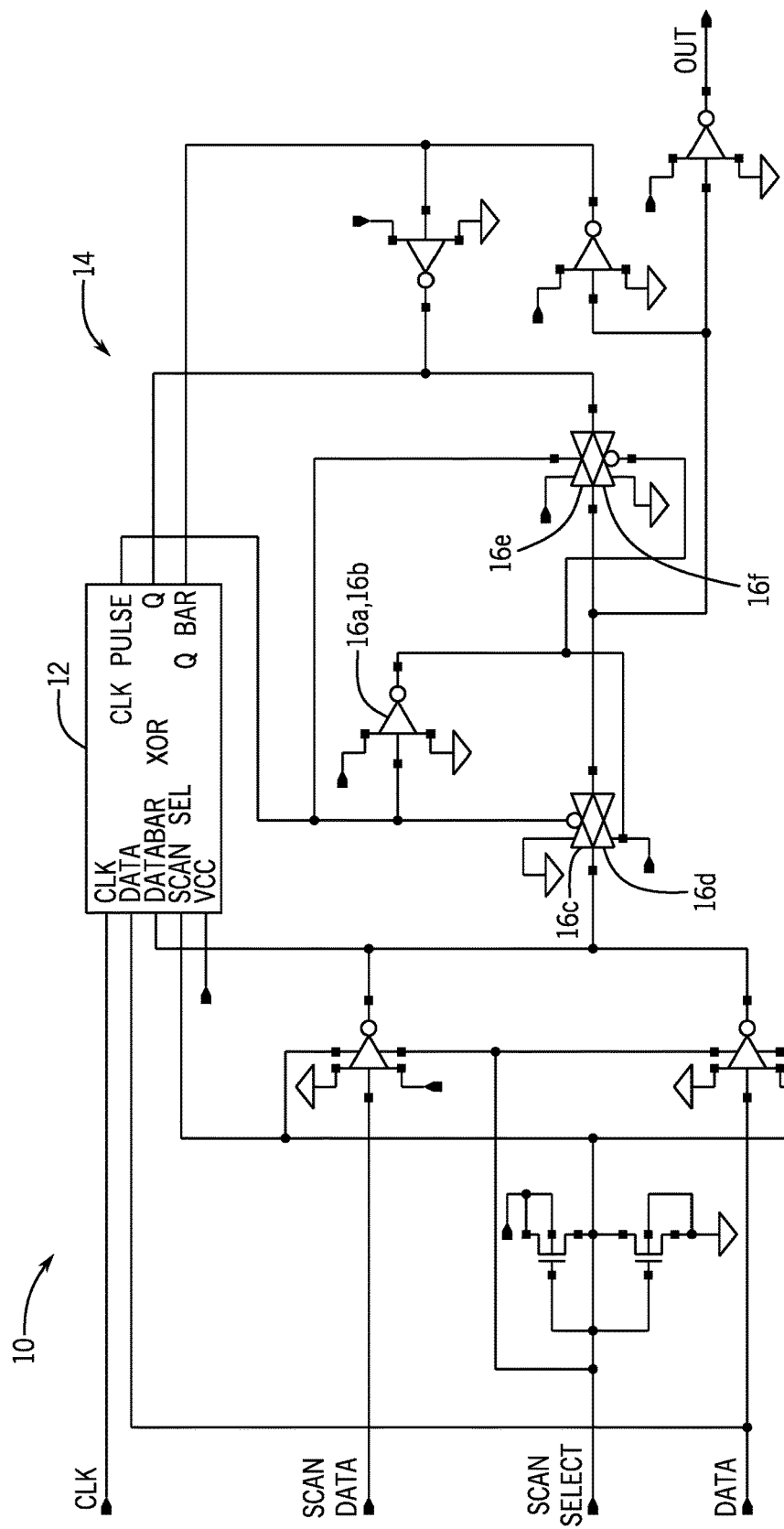
FIG. 6 is a schematic depiction of one embodiment.

In FIG. 6, a pulse triggered flip flop circuit 10 includes an exclusive OR (XOR) based pulse generating stage 12 and a data latching stage 14 which excludes only the stage 12. The inputs to the circuit include a clock (clk), scan data, scan select and data. Scan data is a test mode input. Scan select selects between normal and test modes. The inputs to the pulse generating stage 12 may include the clock, data, databar, scan select, a supply voltage, an internal latch circuit signal q, and qbar. The output signal is clk pulse, the generated output clock pulse.

The latching stage 14 includes pmos and nmos flop transistors 16a, 16b, as well as nmos/pmos transmission gates 16c, d, and 16 e, f. These transistors make up part of the flip flop load.

Figure 7:
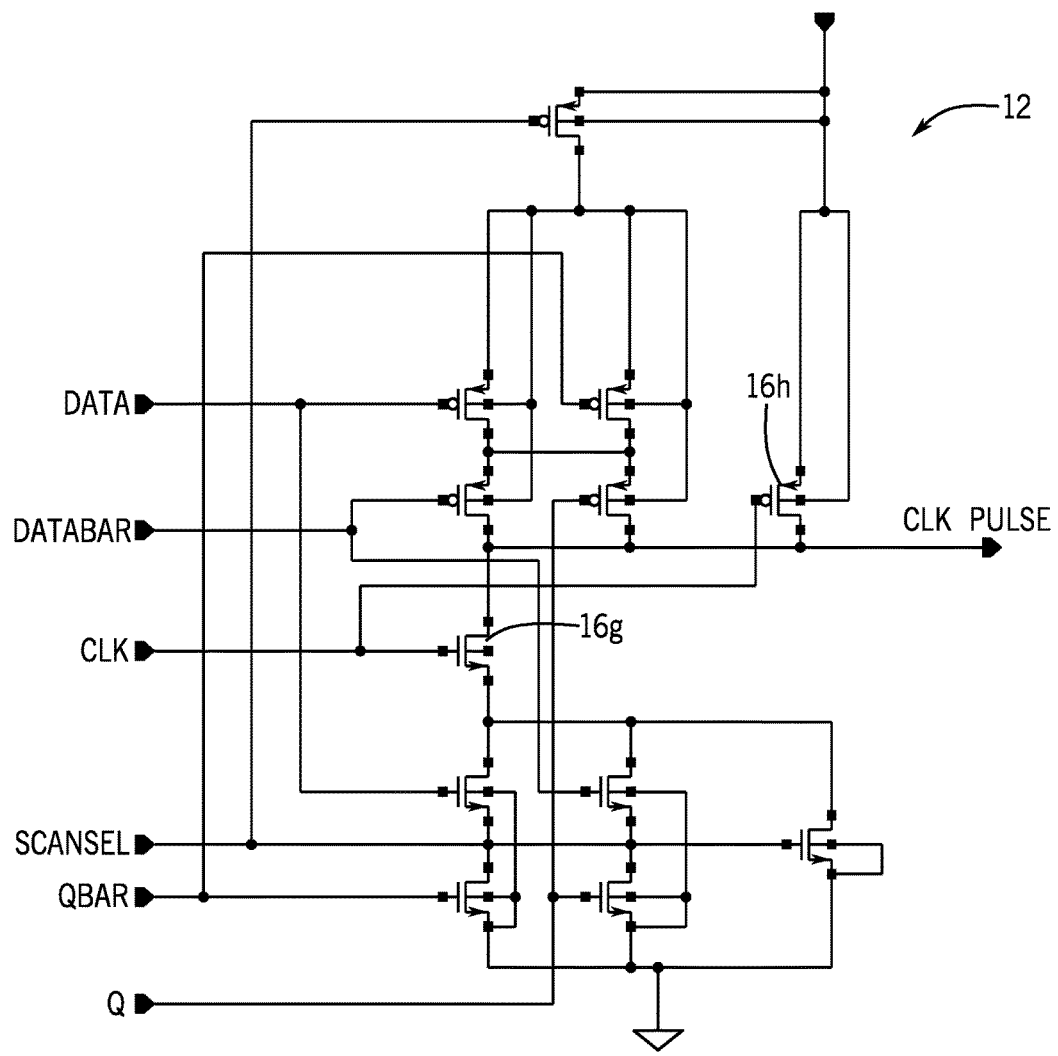
FIG. 7 is a schematic depiction of an exclusive OR (XOR) based clock generator for one embodiment.

FIG. 7 shows the XOR based clock pulse generating stage 12. The clock generating stage compares data, databar, feedbacks q, and qbar and clock (clk) inputs.

The stage 12 only produces the output clock pulse (clk pulse) in the high phase of the clock. This reduces unnecessary toggling in the clock network and an output clock pulse is only generated if the data is different/toggles. This can save significant dynamic power in some embodiments. In other words, the exclusive OR based clock pulse generating stage only produces the high clock output pulse when the clock is high and only one of data and q is high.

One advantage of this arrangement is that the output clock pulse only goes away when the data is fully captured inside the latching stage, which in turn triggers the disabling of the output clock pulse. Therefore, the pulse generating stage 12 is a self-correcting pulse generator in some embodiments. If it takes more time to latch the data due to semiconductor process variations, the output clock pulse will continue to be valid until the data is latched inside the flop. Thus, the latch is only opened when there is a rising or high clock edge.

Processing variations can change when the clock is high. It is desirable to only write to the latch when the clock is high. Since latch internal signals q and qbar are taken back into pulse generator, these signals can be used to decide when the output should be disabled. Therefore, the data is always written before the output data fades in one embodiment.

All the clock devices 16 are shown in FIGS. 6 and 7. The clock load for one pulsed flip flop design is eight transistors labeled 16 in FIGS. 6 and 7. Thus, the clock load is reduced from twelve transistors to eight transistors (33%) in one embodiment. When data does not toggle, the clock load is just two transistors, so a maximum of up to 83% of clock load reduction can be achieved in some embodiments. The pulse-triggered flip flop reduces power consumption by reducing the number of transistors connected to the clock signal in some embodiments. Since the pulse triggered flip flop reduces the clock load, it further reduces the clock drivers in the clock spines which, overall, reduces the clock spine power consumed as well.

Figure 8:
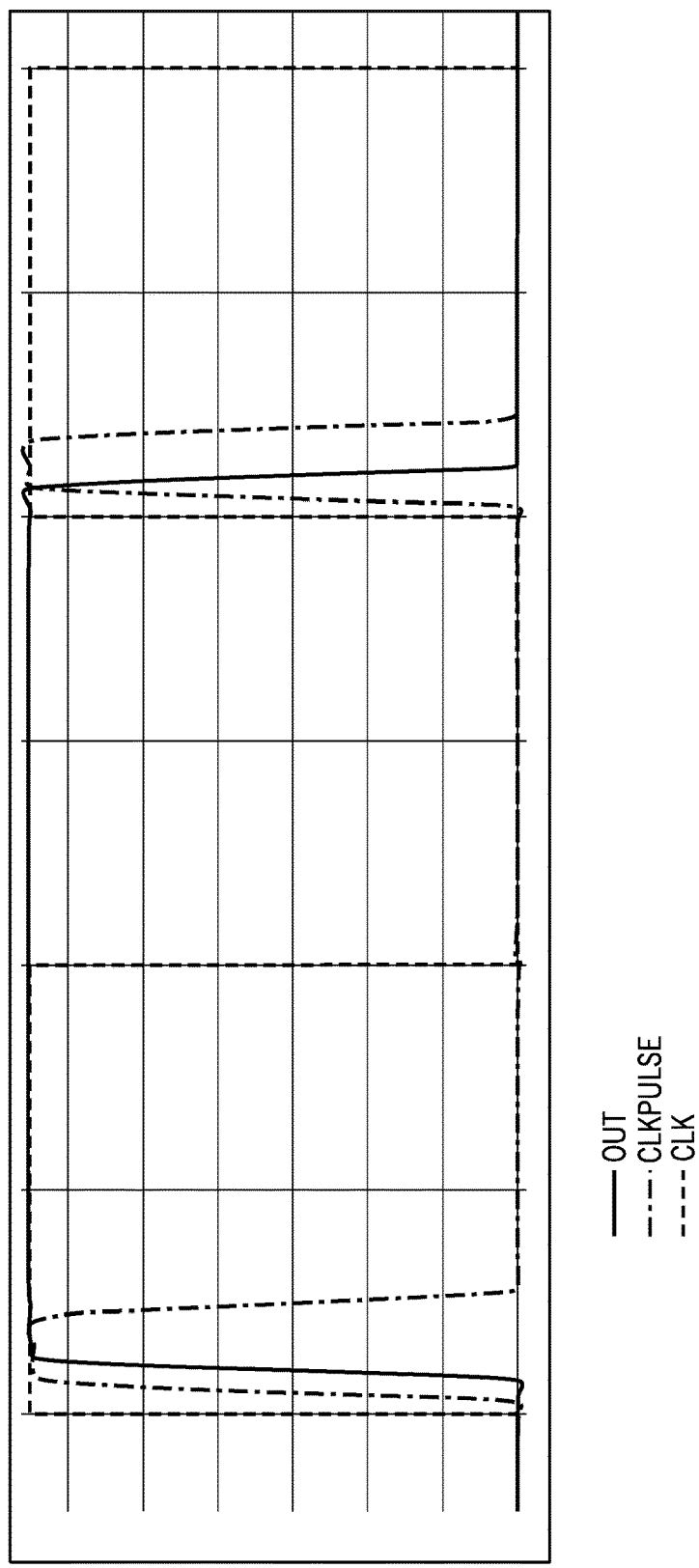
FIG. 8 is a timing waveform for one embodiment.

FIG. 8 shows a timing waveform of the pulse triggered flip flop. As shown in the waveform, a pulse "clkpulse" is generated which is active until the data is latched and readout out from the flip flops in the latching stage 14 shown by waveform "out." The "clk" waveform is the input clock signal that the flip flop circuit 10 receives. Note that according to one embodiment, the clock pulse stays high after the output signal goes high.

The operation of the pulse generator, according to one embodiment, where the clock pulse stays high after the output signal goes high is illustrated using a truth table in Table 1.

| data | databar | q | qbar | clk | clkpulse | nc2 | out | comment |
|---|---|---|---|---|---|---|---|---|
| 0 | 1 | 0 | 1 | 0 | 1 | 0 | 0 | recycle |
| 0 | 1 | 1 | 0 | 0 | 1 | 0 | 1 | recycle |
| 1 | 0 | 0 | 1 | 0 | 1 | 0 | 0 | recycle |
| 1 | 0 | 1 | 0 | 0 | 1 | 0 | 1 | recycle |
| 0 | 1 | 0 | 1 | 1 | 1 | 0 | 0 | recycle |
| 0 | 1 | 1 | 0 | 1 | 0 | 1 | 0 | out = data |
| 1 | 0 | 0 | 1 | 1 | 0 | 1 | 1 | out = data |
| 1 | 0 | 1 | 0 | 1 | 1 | 0 | 1 | recycle |

Based on the truth table set forth in Table 1, when clock (clk) is low, the output (out) recycles previous data and when clock is high, based on a comparison of previous data and new data, the output either retains previous data or updates the new data.

One consideration to take into account is that input data cannot change in a high phase of the clock, since otherwise the data inside the flip flop may be corrupted if input data changes in the high phase. The pulse triggered flip flop can be used where incoming data comes from a single source and input data is stable for one cycle.

Based on simulations, one embodiment of a pulsed triggered flip flop shows around 40% of clock to out delay impact but provides a significant power saving ranging from 58% to 90% depending on the input data toggle from 25% to 0%. This design is especially suitable for power-constrained applications that are speed insensitive.

Figure 9:
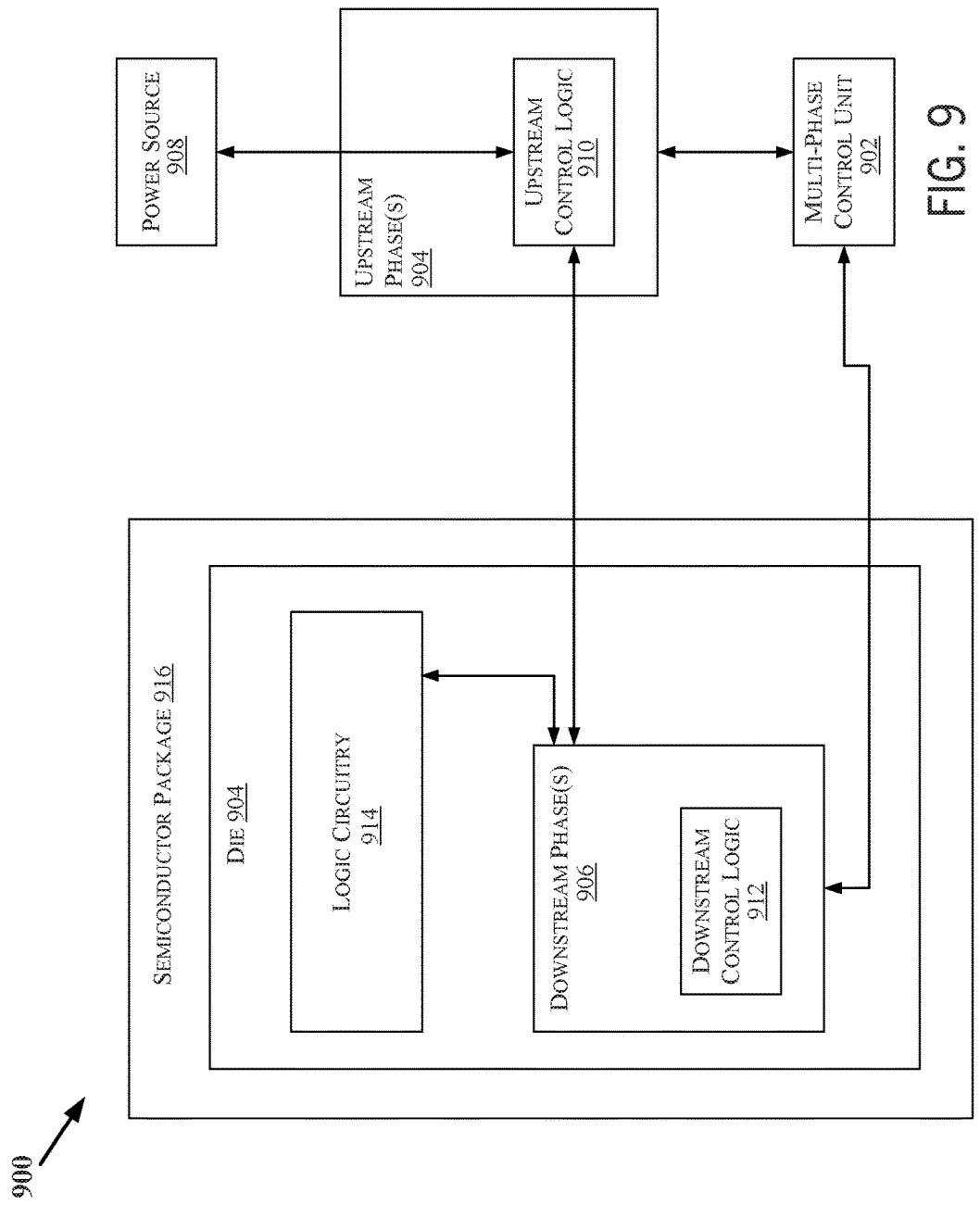
FIG. 9 is a system depiction for one embodiment.

FIG. 9 illustrates a block diagram of a switching regulator according to an embodiment. One or more switching regulators shown in FIG. 9 may be incorporated in various systems discussed herein to provide power to one or more Integrated Circuit (IC) chips. While a single phase of the current-parking switching regulator with a single inductor may be discussed with reference to FIG. 9, one or more of the multiple phases of the current-parking switching regulator may be implemented with a split inductor. Furthermore, a combination of one or more current-parking switching regulators (with or without a split inductor) may be used with one or more conventional electric power conversion devices to provide power to the load (e.g., logic circuitry 914).

More particularly, FIG. 9 illustrates a system 900 that includes a switching regulator (sometimes referred to as a current-parking switching regulator). The current-parking switching regulator may be a multi-phase switching regulator in various embodiments. The multi-phase control unit 902 is coupled to multiple phases, where each phase may include one or more upstream phases 904 and one or more downstream phases 906. As shown, an electrical power source 908 is coupled to upstream control logic 910 (which provides a current control mechanisms in each upstream phase). More than one upstream control logic may be used in various implementations. Each upstream phase may include an inductor (not shown) that is coupled to a respective downstream phase. In an embodiment, the upstream phases may each include one or more inductors. The multi-phase control unit 902 may configure any active upstream control logic 910, e.g., to generate a current through an inductor coupled between the upstream phases and the downstream phases. The downstream control logic 912 may be configured by the multi-phase control unit 902 to be ON, OFF, or switching to regulate the voltage level at the load (e.g., logic circuitry 914). In turn, the downstream control logic 912 may be configured by the multi-phase control unit 902 to maintain the voltage level at the load within a range based at least in part on Vmin (minimum voltage) and Vmax (maximum voltage) values.

In one embodiment, an inductor (coupled between a downstream phase and a respective upstream phase) may be positioned outside of a semiconductor package 916 that includes the load 914. Another inductor (not shown) may be positioned inside of the package 916, e.g., to reduce parasitic capacitance. In one embodiment, the inductor inside the package 916 may be a planar air-core inductor that is coupled to the logic circuitry 914 via one or more switching logic which include planar Metal-Oxide Semiconductor Field-Effect Transistors (MOSFETs). Furthermore, one or more of the components discussed herein (e.g., with reference to FIGS. 9, 10, and/or 11, including, for example, L3 cache, upstream control logic, and/or downstream control logic) may be provided in substrate layer(s) (e.g., between semiconductor packages), on an integrated circuit die, or outside of a semiconductor package (e.g., on a Printed Circuit Board (PCB)) in various embodiments.

Figure 10:
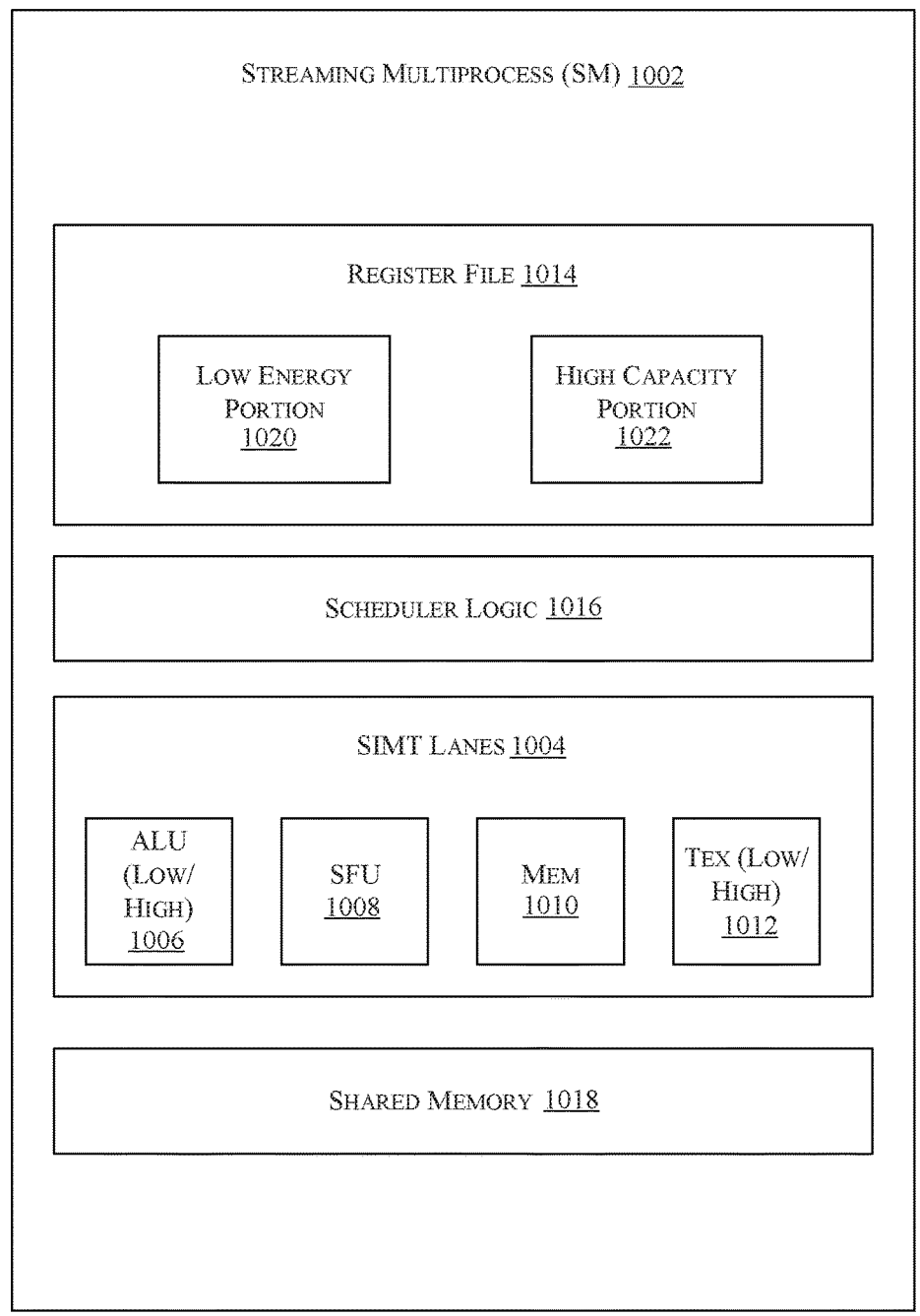
FIG. 10 is a system block diagram for one embodiment.

FIG. 10 is a block diagram of a system 1000 including a streaming multiprocessor 1002, in accordance with one or more embodiments. The streaming multiprocessor may include 32 Single-Instruction, Multiple Thread (SIMT) lanes 1004 that are capable of collectively issuing up to 32 instructions per clock cycle, e.g., one from each of 32 threads. More or less lanes may be present depending on the implementation such as 64, 128, 256, etc. The SIMT lanes 1004 may in turn include one or more: Arithmetic Logic Units (ALUs) 1006, Special Function Units (SFUs) 1008, memory units (MEM) 1010, and/or texture units (TEX) 1012.

In some embodiments, one or more of ALU(s) 1006 and/or TEX unit(s) 1012 may be low energy or high capacity, e.g., such as discussed with reference to items 1020 and 1022. For example, the system may map 100% of the register addresses for threads 0-30 to the low energy portion and 100% of the register addresses for threads 31-127 to the high capacity portion. As another example, the system may map 20% of each thread's registers to the low energy portion and to map 80% of each thread's registers to the high capacity portion. Moreover, the system may determine the number of entries allocated per thread based on runtime information.

As illustrated in FIG. 10, the streaming multiprocessor 1002 also include a register file 1014, a scheduler logic 1016 (e.g., for scheduling threads or thread groups, or both), and shared memory 1018, e.g., local scratch storage. As discussed herein, a "thread group" refers to a plurality of threads that are grouped with ordered (e.g., sequential or consecutive) thread indexes. Generally, a register file refers to an array of registers accessed by components of a processor (including a graphics processor) such as those discussed herein. The register file 1014 includes a low energy portion or structure 1020 and a high capacity portion or structure 1022. The streaming multiprocessor 1002 may be configured to address the register file 1014 using a single logical namespace for both the low energy portion and the high capacity portion.

In some embodiments, the system may include a number of physical registers which can be shared by the simultaneously running threads on the system. This allows the system to use a single namespace to implement a flexible register mapping scheme. A compiler may then allocate register live ranges to register addresses, and the compiler may use a register allocation mechanism to minimize or reduce the number of registers used per thread. Multiple live ranges can be allocated to the same register address as long as the live ranges do not overlap in an embodiment. This allows for determination, e.g., at runtime and after instructions have been compiled, of how many entries per thread will be allocated in the low energy portion versus the high capacity portion. For example, the system may map 100% of the register addresses for threads 0-30 to the low energy portion and 100% of the register addresses for threads 31-127 to the high capacity portion. As another example, the system may map 20% of each thread's registers to the low energy portion and to map 80% of each thread's registers to the high capacity portion. The system may determine the number of entries allocated per thread based on runtime information, e.g., regarding the number of thread groups executing and the marginal benefit from launching more thread groups or allocating a smaller number of thread groups more space in the low energy portion.

Figure 11:
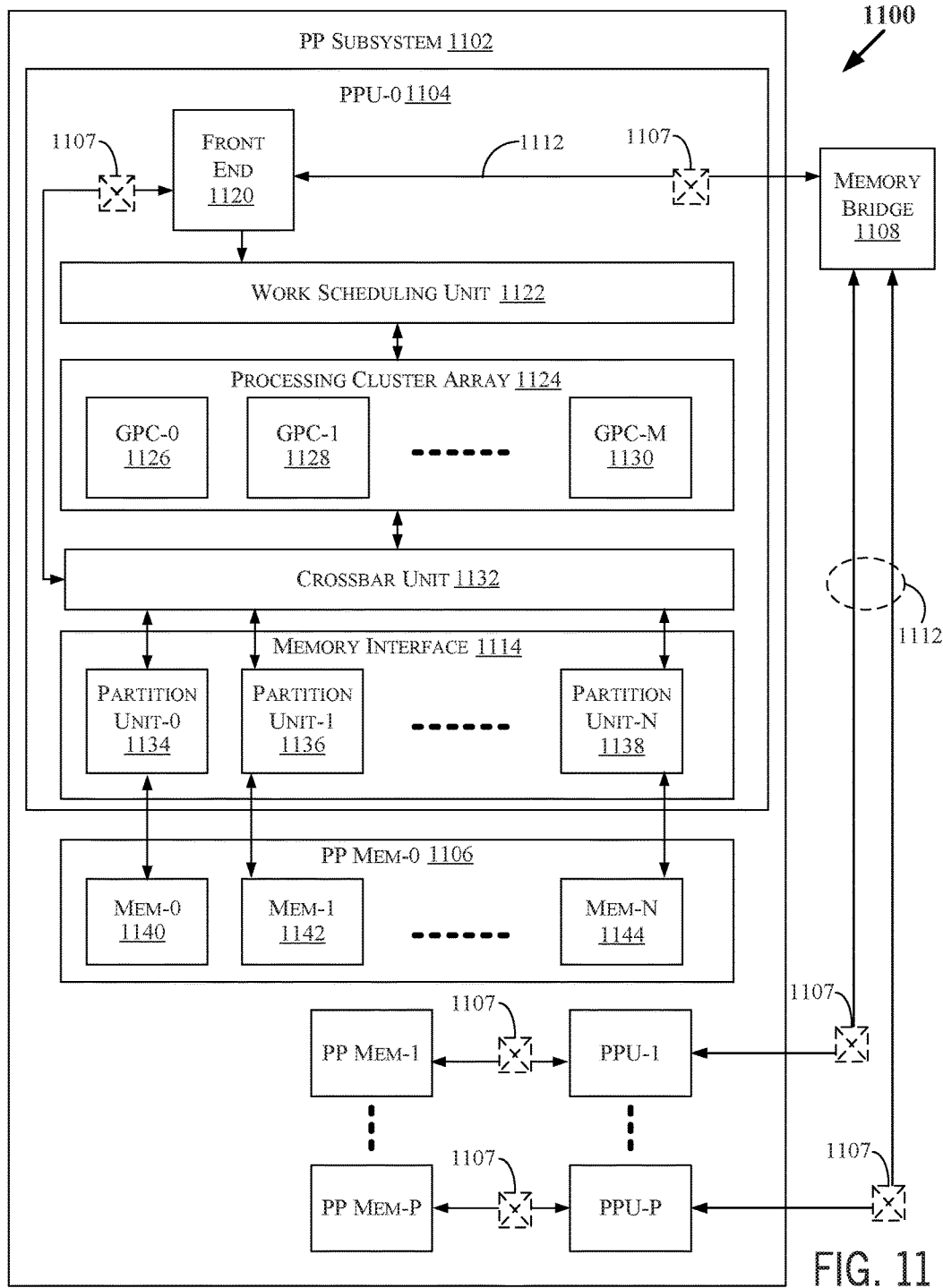
FIG. 11 is a block diagram of a parallel processing system according to one embodiment.

FIG. 11 illustrates a block diagram of a parallel processing system 1100, according to one embodiment. System 1100 includes a Parallel Processing (Previously Presented) subsystem 1102 which in turn includes one or more Parallel Processing Units (PPUs) PPU-0 through PPU-P. Each PPU is coupled to a local Parallel Processing (PP) memory (e.g., Mem-0 through MEM-P, respectively). In some embodiments, the PP subsystem system 1102 may include P number of PPUs. PPU-0 804 and parallel processing memories 1106 may be implemented using one or more integrated circuit devices, such as programmable processors, Application Specific Integrated Circuits (ASICs), or memory devices.

Referring to FIG. 11 several optional switch or connections 1107 are shown that may be used in system 1100 to manage power. While several switches 1107 are shown, embodiments are not limited to the specifically shown switches and more or less switches may be utilized depending on the implementation. These connections/switches 1107 may be utilized for clock gating or general power gating. Hence, items 1107 may include one or more of a power transistor, on-die switch, power plane connections, or the like. In an embodiment, prior to shutting power to a portion of system 1100 via switches/connections 1107, logic (e.g., a microcontroller, digital signal processor, firmware, etc.) may ensure the results of operation are committed (e.g., to memory) or finalized to maintain correctness.

Further, in some embodiments, one or more of PPUs in parallel processing subsystem 1102 are graphics processors with rendering pipelines that may be configured to perform various tasks such as those discussed herein with respect to other figures. The graphics information/data may be communicated via memory bridge 1108 with other components of a computing system (including components of system 1100). The data may be communicated via a shared bus and/or one or more interconnect(s) 1110 (including, for example, one or more direct or point-to-point links). PPU-0 804 may access its local parallel processing memory 1114 (which may be used as graphics memory including, e.g., a frame buffer) to store and update pixel data, delivering pixel data to a display device (such as those discussed herein), etc. In some embodiments, the parallel processing subsystem 1102 may include one or more PPUs that operate as graphics processors and one or more other PPUs that operate to perform general-purpose computations. The PPUs may be identical or different, and each PPU may have access to its own dedicated parallel processing memory device(s), no dedicated parallel processing memory device(s), or a shared memory device or cache.

In an embodiment, operations performed by PPUs may be controlled by another processor (or one of the PPUs) generally referred to as a master processor or processor core. In one embodiment, the master processor/core may write a stream of commands for each PPU to a push buffer in various locations such as a main system memory, a cache, or other memory such as those discussed herein with reference to other figures. The written commands may then be read by each PPU and executed asynchronously relative to the operation of master processor/core.

Furthermore, as shown in FIG. 11, PPU-0 includes a front end logic 1120 which may include an Input/Output (I/O or IO) unit (e.g., to communicate with other components of system 1100 through the memory bridge 1108) and/or a host interface (e.g., which receives commands related to processing tasks). The front end 1120 may receive commands read by the host interface (for example from the push buffer)). The front end 1120 in turn provides the commands to a work scheduling unit 1122 that schedules and allocates operation(s)/task(s) associated with the commands to a processing cluster array or arithmetic subsystem 1124 for execution.

As shown in FIG. 11, the processing cluster array 1124 may include one or more General Processing Cluster (GPC) units (e.g., GPC-0 1126, GPC-1 1128, through GPC-M 1130). Each GPC may be capable of executing a large number (e.g., hundreds or thousands) of threads concurrently, where each thread is an instance of a program. In various applications, different GPCs may be allocated for processing different types of programs or for performing different types of computations. For example, in a graphics application, a first set of GPCs (e.g., including one or more GPC units) may be allocated to perform tessellation operations and to produce primitive topologies for patches, and a second set of GPCs (e.g., including one or more GPC units) may be allocated to perform tessellation shading to evaluate patch parameters for the primitive topologies and to determine vertex positions and other per-vertex attributes. The allocation of GPCs may vary depending on the workload arising for each type of program or computation.

Additionally, processing tasks that are assigned by the work scheduling unit 1122 may include indices of data to be processed, such surface/patch data, primitive data, vertex data, pixel data, and/or state parameters and commands defining how the data is to be processed (e.g., what program is to be executed). The work scheduling unit 1122 may be configured to fetch the indices corresponding to the tasks, or may receive the indices from front end 1120. Front end 1120 may also ensure that GPCs are configured to a valid state before the processing specified by the push buffers is initiated.

In one embodiment, the communication path 1112 is a Peripheral Component Interface (PCI) express (or PCI-e) link, in which dedicated lanes may be allocated to each PPU. Other communication paths may also be used. For example, commands related to processing tasks may be directed to the host interface 1118, while commands related to memory operations (e.g., reading from or writing to parallel processing memory 1114) may be directed to a memory crossbar unit 1132.

In some embodiments, parallel processing subsystem 1102 may be implemented as an add-in card that is inserted into an expansion slot of computer system or server (such as a blade server). In other embodiments, a PPU may be integrated on a single chip with a bus bridge, such as memory bridge 1108, an I/O bridge, etc. In still other embodiments, some or all components of PPU may be integrated on a single integrated circuit chip with one or more other processor cores, memory devices, caches, etc.

Referring to FIG. 11, memory interface 1114 includes N partition units (e.g., Unit-0 1134, Unit-1 1136, through Unit-N 11-38) that are each directly coupled to a corresponding portion of parallel processing memory 1106 (such as Mem-0 1140, Mem-1 1142, through Mem-N 1144). The number of partition units may generally be equal to the number of Previously Presented memory (or N as shown). The Previously Presented memory may be implemented with volatile memory such as Dynamic Random Access Memory (DRAM) or other types of volatile memory such as those discussed herein. In other embodiments, the number of partition units may not equal the number of memory devices. Graphics data (such as render targets, frame buffers, or texture maps) may be stored across Previously Presented memory devices, allowing partition units to write portions of graphics data in parallel to efficiently use the available bandwidth of the parallel processing memory 1106.

Furthermore, any one of GPCs may process data to be written to any of the partition units within the parallel processing memory. Crossbar unit 1132 may be implemented as an interconnect that is configured to route the output of each GPC to the input of any partition unit or to another GPC for further processing. Hence, GPCs 1126 to 1130 may communicate with memory interface 1114 through crossbar unit 1132 to read from or write to various other (or external) memory devices. As shown, crossbar unit 1132 may directly communicate with the front end 1120, as well as having a coupling (direct or indirect) to local memory 1106, to allow the processing cores within the different GPCs to communicate with system memory and/or other memory that is not local to PPU. Furthermore, the crossbar unit 1132 may utilize virtual channels to organize traffic streams between the GPCs and partition units.

Graphics System

Figure 12:
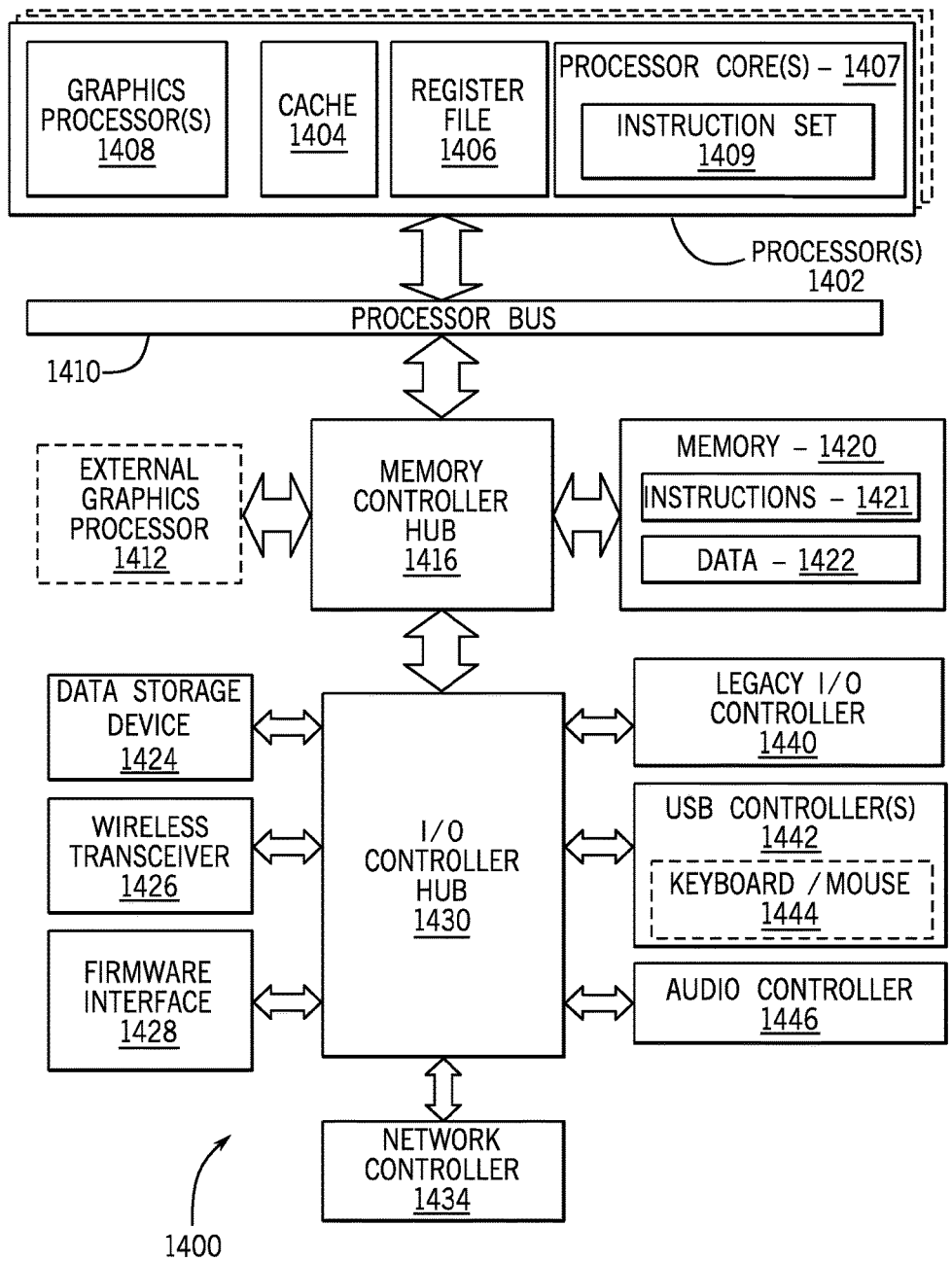
FIG. 12 is a block diagram of a processing system according to one embodiment.

FIG. 12 is a block diagram of a processing system 1400, according to an embodiment. In various embodiments the system 1400 includes one or more processors 1602 and one or more graphics processors 1408, and may be a single processor desktop system, a multiprocessor workstation system, or a server system having a large number of processors 1402 or processor cores 1407. In one embodiment, the system 1400 is a processing platform incorporated within a system-on-a-chip (SoC) integrated circuit for use in mobile, handheld, or embedded devices.

The processing system including a graphics processing unit may be an integrated circuit. An integrated circuit means a single integrated silicon die. The die contains the graphics processing unit and parallel interconnected geometry processing fixed-function units.

An embodiment of system 1400 can include, or be incorporated within a server-based gaming platform, a game console, including a game and media console, a mobile gaming console, a handheld game console, or an online game console. In some embodiments system 1400 is a mobile phone, smart phone, tablet computing device or mobile Internet device. Data processing system 1400 can also include, couple with, or be integrated within a wearable device, such as a smart watch wearable device, smart eyewear device, augmented reality device, or virtual reality device. In some embodiments, data processing system 1400 is a television or set top box device having one or more processors 1402 and a graphical interface generated by one or more graphics processors 1408.

In some embodiments, the one or more processors 1402 each include one or more processor cores 1407 to process instructions which, when executed, perform operations for system and user software. In some embodiments, each of the one or more processor cores 1407 is configured to process a specific instruction set 1409. In some embodiments, instruction set 1409 may facilitate Complex Instruction Set Computing (CISC), Reduced Instruction Set Computing (RISC), or computing via a Very Long Instruction Word (VLIW). Multiple processor cores 1407 may each process a different instruction set 1409, which may include instructions to facilitate the emulation of other instruction sets. Processor core 1407 may also include other processing devices, such a Digital Signal Processor (DSP).

In some embodiments, the processor 1402 includes cache memory 1404. Depending on the architecture, the processor 1402 can have a single internal cache or multiple levels of internal cache. In some embodiments, the cache memory is shared among various components of the processor 1402. In some embodiments, the processor 1402 also uses an external cache (e.g., a Level-3 (L3) cache or Last Level Cache (LLC)) (not shown), which may be shared among processor cores 1407 using known cache coherency techniques. A register file 1406 is additionally included in processor 1402 which may include different types of registers for storing different types of data (e.g., integer registers, floating point registers, status registers, and an instruction pointer register). Some registers may be general-purpose registers, while other registers may be specific to the design of the processor 1402.

In some embodiments, processor 1402 is coupled with a processor bus 1410 to transmit communication signals such as address, data, or control signals between processor 1402 and other components in system 1400. In one embodiment the system 1400 uses an exemplary 'hub' system architecture, including a memory controller hub 1416 and an Input Output (I/O) controller hub 1430. A memory controller hub 1416 facilitates communication between a memory device and other components of system 1400, while an I/O Controller Hub (ICH) 1430 provides connections to I/O devices via a local I/O bus. In one embodiment, the logic of the memory controller hub 1416 is integrated within the processor.

Memory device 1420 can be a dynamic random access memory (DRAM) device, a static random access memory (SRAM) device, flash memory device, phase-change memory device, or some other memory device having suitable performance to serve as process memory. In one embodiment the memory device 1420 can operate as system memory for the system 1400, to store data 1422 and instructions 1421 for use when the one or more processors 1402 executes an application or process. Memory controller hub 1416 also couples with an optional external graphics processor 1412, which may communicate with the one or more graphics processors 1408 in processors 1402 to perform graphics and media operations.

In some embodiments, ICH 1430 enables peripherals to connect to memory device 1420 and processor 1402 via a high-speed I/O bus. The I/O peripherals include, but are not limited to, an audio controller 1446, a firmware interface 1428, a wireless transceiver 1426 (e.g., Wi-Fi, Bluetooth), a data storage device 1624 (e.g., hard disk drive, flash memory, etc.), and a legacy I/O controller 1440 for coupling legacy (e.g., Personal System 2 (PS/2)) devices to the system. One or more Universal Serial Bus (USB) controllers 1442 connect input devices, such as keyboard and mouse 1444 combinations. A network controller 1434 may also couple with ICH 1430. In some embodiments, a high-performance network controller (not shown) couples with processor bus 1410. It will be appreciated that the system 1400 shown is exemplary and not limiting, as other types of data processing systems that are differently configured may also be used. For example, the I/O controller hub 1430 may be integrated within the one or more processor 1402, or the memory controller hub 1416 and I/O controller hub 1430 may be integrated into a discreet external graphics processor, such as the external graphics processor 1412.

Figure 13:
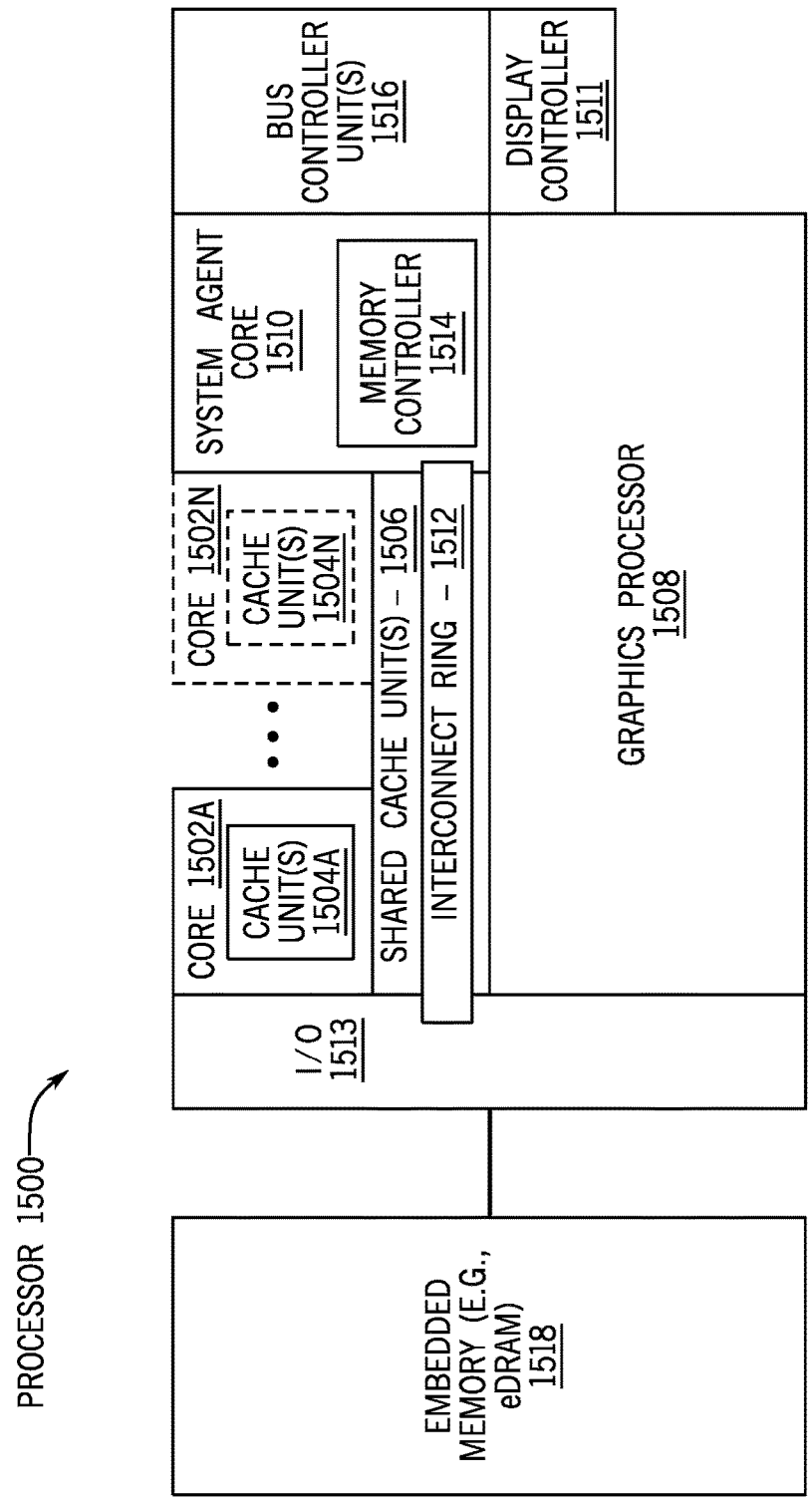
FIG. 13 is a block diagram of a processor according to one embodiment.

FIG. 13 is a block diagram of an embodiment of a processor 1500 having one or more processor cores 1502A-1502N, an integrated memory controller 1514, and an integrated graphics processor 1508. Those elements of FIG. 9 having the same reference numbers (or names) as the elements of any other figure herein can operate or function in any manner similar to that described elsewhere herein, but are not limited to such. Processor 1500 can include additional cores up to and including additional core 1502N represented by the dashed lined boxes. Each of processor cores 1502A-1502N includes one or more internal cache units 1504A-1504N. In some embodiments each processor core also has access to one or more shared cached units 1506.

The internal cache units 1504A-1504N and shared cache units 1506 represent a cache memory hierarchy within the processor 1500. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1506 and 1504A-1504N.

In some embodiments, processor 1500 may also include a set of one or more bus controller units 1516 and a system agent core 1510. The one or more bus controller units 1516 manage a set of peripheral buses, such as one or more Peripheral Component Interconnect buses (e.g., PCI, PCI Express). System agent core 1510 provides management functionality for the various processor components. In some embodiments, system agent core 1510 includes one or more integrated memory controllers 1514 to manage access to various external memory devices (not shown).

In some embodiments, one or more of the processor cores 1502A-1502N include support for simultaneous multi-threading. In such embodiment, the system agent core 1510 includes components for coordinating and operating cores 1502A-1502N during multi-threaded processing. System agent core 1510 may additionally include a power control unit (PCU), which includes logic and components to regulate the power state of processor cores 1502A-1502N and graphics processor 1508.

In some embodiments, processor 1500 additionally includes graphics processor 1508 to execute graphics processing operations. In some embodiments, the graphics processor 1508 couples with the set of shared cache units 1506, and the system agent core 1510, including the one or more integrated memory controllers 1514. In some embodiments, a display controller 1511 is coupled with the graphics processor 1508 to drive graphics processor output to one or more coupled displays. In some embodiments, display controller 1511 may be a separate module coupled with the graphics processor via at least one interconnect, or may be integrated within the graphics processor 1508 or system agent core 1510.

In some embodiments, a ring based interconnect unit 1512 is used to couple the internal components of the processor 1500. However, an alternative interconnect unit may be used, such as a point-to-point interconnect, a switched interconnect, or other techniques, including techniques well known in the art. In some embodiments, graphics processor 1508 couples with the ring interconnect 1512 via an I/O link 1513.

The exemplary I/O link 1513 represents at least one of multiple varieties of I/O interconnects, including an on package I/O interconnect which facilitates communication between various processor components and a high-performance embedded memory module 1518, such as an eDRAM module. In some embodiments, each of the processor cores 1502A-1502N and graphics processor 1508 use embedded memory modules 1518 as a shared Last Level Cache.

In some embodiments, processor cores 1502A-1502N are homogenous cores executing the same instruction set architecture. In another embodiment, processor cores 1502A-5102N are heterogeneous in terms of instruction set architecture (ISA), where one or more of processor cores 1502A-1502N execute a first instruction set, while at least one of the other cores executes a subset of the first instruction set or a different instruction set. In one embodiment processor cores 1502A-1502N are heterogeneous in terms of microarchitecture, where one or more cores having a relatively higher power consumption couple with one or more power cores having a lower power consumption. Additionally, processor 1500 can be implemented on one or more chips or as an SoC integrated circuit having the illustrated components, in addition to other components.

Figure 14:
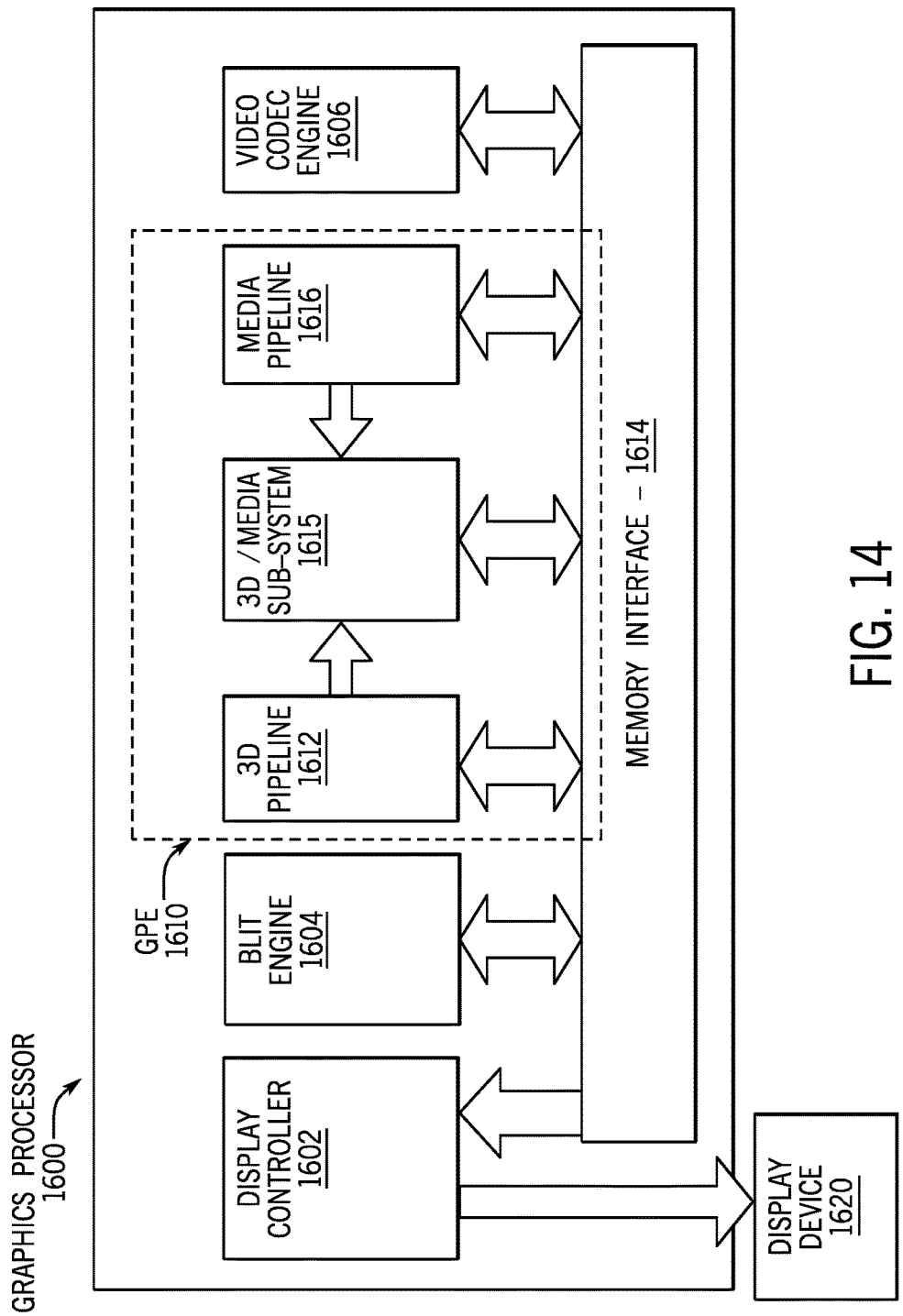
FIG. 14 is a block diagram of a graphics processor according to one embodiment.

FIG. 14 is a block diagram of a graphics processor 1600, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1600 includes a memory interface 1614 to access memory. Memory interface 1614 can be an interface to local memory, one or more internal caches, one or more shared external caches, and/or to system memory.

In some embodiments, graphics processor 1600 also includes a display controller 1602 to drive display output data to a display device 1620. Display controller 1602 includes hardware for one or more overlay planes for the display and composition of multiple layers of video or user interface elements. In some embodiments, graphics processor 1600 includes a video codec engine 1606 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421 M/VC-1, and Joint Photographic Experts Group (JPEG) formats such as JPEG, and Motion JPEG (MJPEG) formats.

In some embodiments, graphics processor 1800 includes a block image transfer (BLIT) engine 1604 to perform two-dimensional (2D) rasterizer operations including, for example, bit-boundary block transfers. However, in one embodiment, 2D graphics operations are performed using one or more components of graphics processing engine (GPE) 1610. In some embodiments, GPE 1610 is a compute engine for performing graphics operations, including three-dimensional (3D) graphics operations and media operations.

In some embodiments, GPE 1610 includes a 3D pipeline 1612 for performing 3D operations, such as rendering three-dimensional images and scenes using processing functions that act upon 3D primitive shapes (e.g., rectangle, triangle, etc.). The 3D pipeline 1612 includes programmable and fixed function elements that perform various tasks within the element and/or spawn execution threads to a 3D/Media sub-system 1615. While 3D pipeline 1612 can be used to perform media operations, an embodiment of GPE 1610 also includes a media pipeline 1616 that is specifically used to perform media operations, such as video post-processing and image enhancement.

In some embodiments, media pipeline 1616 includes fixed function or programmable logic units to perform one or more specialized media operations, such as video decode acceleration, video de-interlacing, and video encode acceleration in place of, or on behalf of video codec engine 1606. In some embodiments, media pipeline 1616 additionally includes a thread spawning unit to spawn threads for execution on 3D/Media sub-system 1615. The spawned threads perform computations for the media operations on one or more graphics execution units included in 3D/Media subsystem 1615.

In some embodiments, 3D/Media subsystem 1615 includes logic for executing threads spawned by 3D pipeline 1612 and media pipeline 1616. In one embodiment, the pipelines send thread execution requests to 3D/Media subsystem 1615, which includes thread dispatch logic for arbitrating and dispatching the various requests to available thread execution resources. The execution resources include an array of graphics execution units to process the 3D and media threads. In some embodiments, 3D/Media subsystem 1615 includes one or more internal caches for thread instructions and data. In some embodiments, the subsystem also includes shared memory, including registers and addressable memory, to share data between threads and to store output data.

Figure 15:
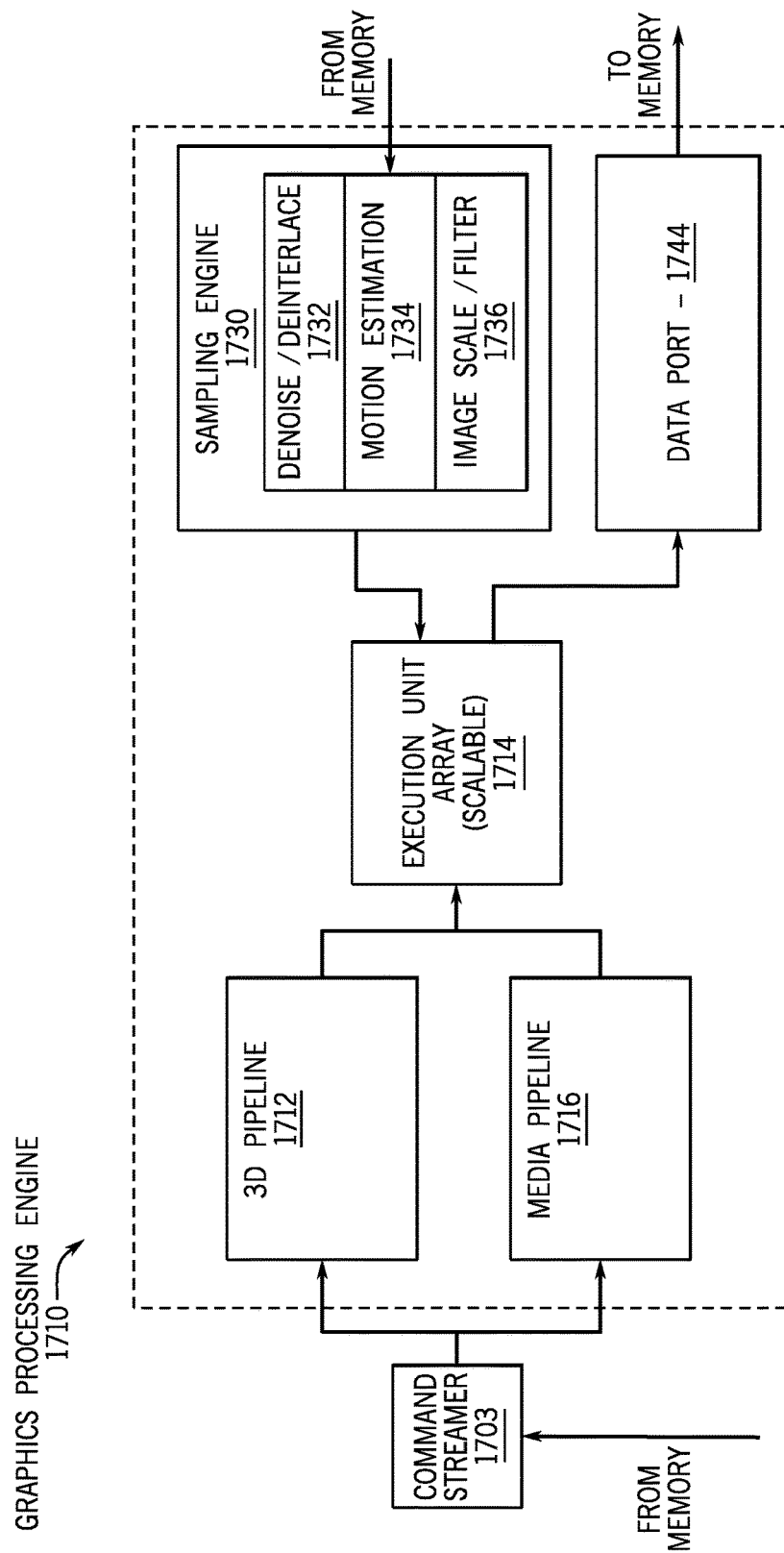
FIG. 15 is a block diagram of a graphics processing engine according to one embodiment.

FIG. 15 is a block diagram of a graphics processing engine 1710 of a graphics processor in accordance with some embodiments. In one embodiment, the graphics processing engine (GPE) 1710 is a version of the GPE 1710 shown in FIG. 11. Elements of FIG. 11 having the same reference numbers (or names) as the elements of any other figure herein can operate or function in any manner similar to that described elsewhere herein, but are not limited to such. For example, the 3D pipeline 1612 and media pipeline 1616 of FIG. 9 are illustrated. The media pipeline 1616 is optional in some embodiments of the GPE 1710 and may not be explicitly included within the GPE 1710. For example and in at least one embodiment, a separate media and/or image processor is coupled to the GPE 1710.

In some embodiments, GPE 1710 couples with or includes a command streamer 1703, which provides a command stream to the 3D pipeline 1612 and/or media pipelines 1616. In some embodiments, command streamer 1703 is coupled with memory, which can be system memory, or one or more of internal cache memory and shared cache memory. In some embodiments, command streamer 1703 receives commands from the memory and sends the commands to 3D pipeline 1612 and/or media pipeline 1616. The commands are directives fetched from a ring buffer, which stores commands for the 3D pipeline 1612 and media pipeline 1616. In one embodiment, the ring buffer can additionally include batch command buffers storing batches of multiple commands. The commands for the 3D pipeline 1612 can also include references to data stored in memory, such as but not limited to vertex and geometry data for the 3D pipeline 1612 and/or image data and memory objects for the media pipeline 1616. The 3D pipeline 1612 and media pipeline 1616 process the commands and data by performing operations via logic within the respective pipelines or by dispatching one or more execution threads to a graphics core array 1714.

In various embodiments the 3D pipeline 1612 can execute one or more shader programs, such as vertex shaders, geometry shaders, pixel shaders, fragment shaders, compute shaders, or other shader programs, by processing the instructions and dispatching execution threads to the graphics core array 1714. The graphics core array 1714 provides a unified block of execution resources. Multi-purpose execution logic (e.g., execution units) within the graphic core array 1714 includes support for various 3D API shader languages and can execute multiple simultaneous execution threads associated with multiple shaders.

In some embodiments the graphics core array 1714 also includes execution logic to perform media functions, such as video and/or image processing. In one embodiment, the execution units additionally include general-purpose logic that is programmable to perform parallel general purpose computational operations, in addition to graphics processing operations. The general purpose logic can perform processing operations in parallel or in conjunction with general purpose logic within the processor core(s) 1407 of FIG. 9 or core 1502A-1502N as in FIG. 13.

Output data generated by threads executing on the graphics core array 1714 can output data to memory in a unified return buffer (URB) 1718. The URB 1718 can store data for multiple threads. In some embodiments the URB 1718 may be used to send data between different threads executing on the graphics core array 1714. In some embodiments the URB 1718 may additionally be used for synchronization between threads on the graphics core array and fixed function logic within the shared function logic 1720.

In some embodiments, graphics core array 1714 is scalable, such that the array includes a variable number of graphics cores, each having a variable number of execution units based on the target power and performance level of GPE 1710. In one embodiment the execution resources are dynamically scalable, such that execution resources may be enabled or disabled as needed.

The graphics core array 1714 couples with shared function logic 1720 that includes multiple resources that are shared between the graphics cores in the graphics core array.

The shared functions within the shared function logic 1720 are hardware logic units that provide specialized supplemental functionality to the graphics core array 1714. In various embodiments, shared function logic 1720 includes but is not limited to sampler 1721, math 1722, and inter-thread communication (ITC) 1723 logic. Additionally, some embodiments implement one or more cache(s) 1725 within the shared function logic 1720. A shared function is implemented where the demand for a given specialized function is insufficient for inclusion within the graphics core array 1714. Instead a single instantiation of that specialized function is implemented as a stand-alone entity in the shared function logic 1720 and shared among the execution resources within the graphics core array 1714. The precise set of functions that are shared between the graphics core array 1714 and included within the graphics core array 1714 varies between embodiments.

Figure 16:
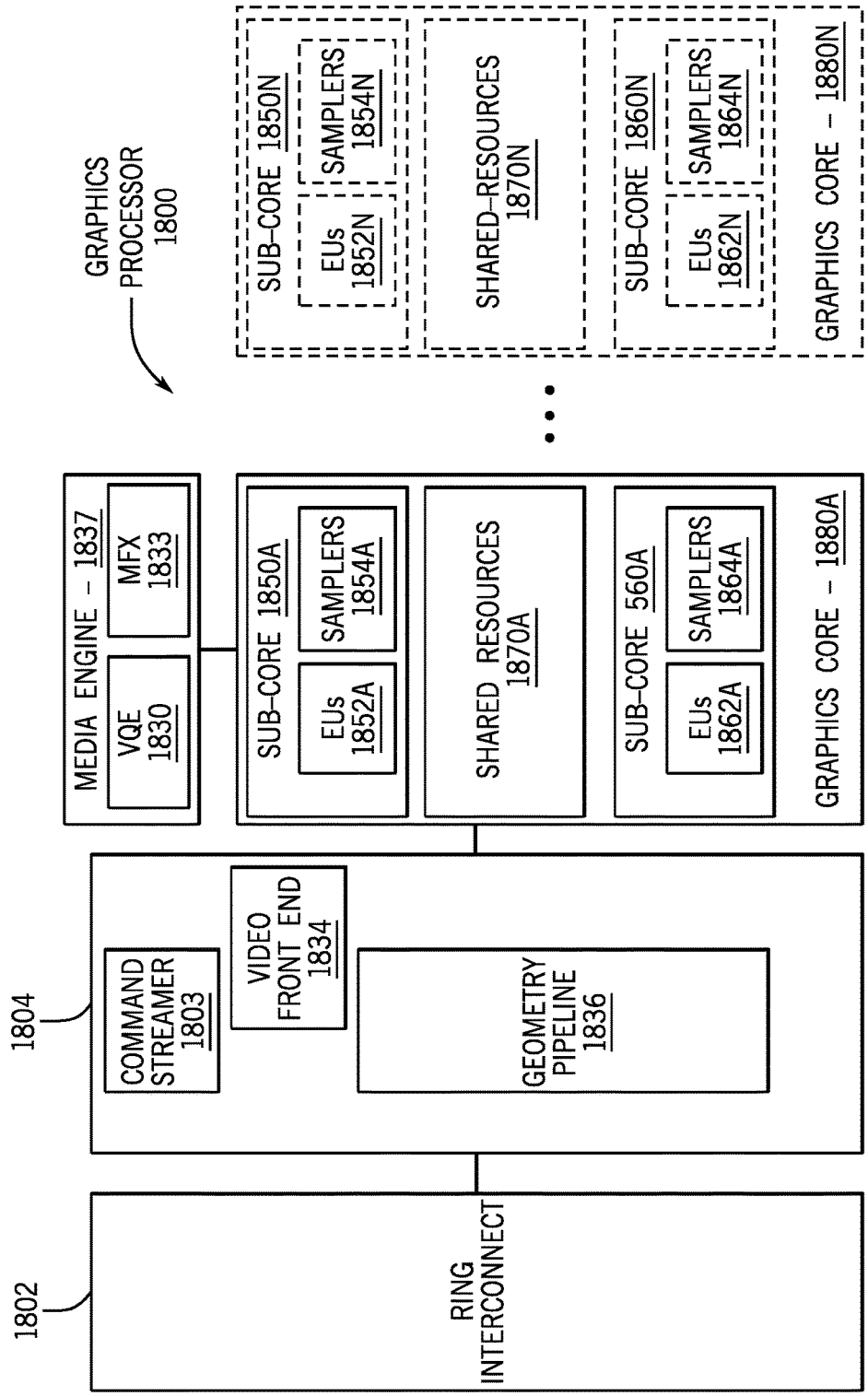
FIG. 16 is a block diagram of another embodiment of a graphics processor.

FIG. 16 is a block diagram of another embodiment of a graphics processor 1800. Elements of FIG. 16 having the same reference numbers (or names) as the elements of any other figure herein can operate or function in any manner similar to that described elsewhere herein, but are not limited to such.

In some embodiments, graphics processor 1800 includes a ring interconnect 1802, a pipeline front-end 1804, a media engine 1837, and graphics cores 1880A-1880N. In some embodiments, ring interconnect 1802 couples the graphics processor to other processing units, including other graphics processors or one or more general-purpose processor cores. In some embodiments, the graphics processor is one of many processors integrated within a multi-core processing system.

In some embodiments, graphics processor 1800 receives batches of commands via ring interconnect 1802. The incoming commands are interpreted by a command streamer 1803 in the pipeline front-end 1804. In some embodiments, graphics processor 1800 includes scalable execution logic to perform 3D geometry processing and media processing via the graphics core(s) 1880A-1880N. For 3D geometry processing commands, command streamer 1803 supplies commands to geometry pipeline 1836. For at least some media processing commands, command streamer 1803 supplies the commands to a video front end 1834, which couples with a media engine 1837. In some embodiments, media engine 1837 includes a Video Quality Engine (VQE) 2030 for video and image post-processing and a multi-format encode/decode (MFX) 1833 engine to provide hardware-accelerated media data encode and decode. In some embodiments, geometry pipeline 1836 and media engine 1837 each generate execution threads for the thread execution resources provided by at least one graphics core 1880A.

In some embodiments, graphics processor 1800 includes scalable thread execution resources featuring modular cores 1880A-1880N (sometimes referred to as core slices), each having multiple sub-cores 1850A-1850N, 1860A-1860N (sometimes referred to as core sub-slices). In some embodiments, graphics processor 1800 can have any number of graphics cores 1880A through 1880N. In some embodiments, graphics processor 1800 includes a graphics core 1880A having at least a first sub-core 1850A and a second sub-core 1860A. In other embodiments, the graphics processor is a low power processor with a single sub-core (e.g., 1850A). In some embodiments, graphics processor 1800 includes multiple graphics cores 1880A-1880N, each including a set of first sub-cores 1850A-1850N and a set of second sub-cores 1860A-1860N. Each sub-core in the set of first sub-cores 1850A-1850N includes at least a first set of execution units 1852A-1852N and media/texture samplers 1854A-1854N. Each sub-core in the set of second sub-cores 1860A-1860N includes at least a second set of execution units 1862A-1862N and samplers 1864A-1864N. In some embodiments, each sub-core 1850A-1850N, 1860A-1860N shares a set of shared resources 1870A-1870N. In some embodiments, the shared resources include shared cache memory and pixel operation logic. Other shared resources may also be included in the various embodiments of the graphics processor.

Figure 17:
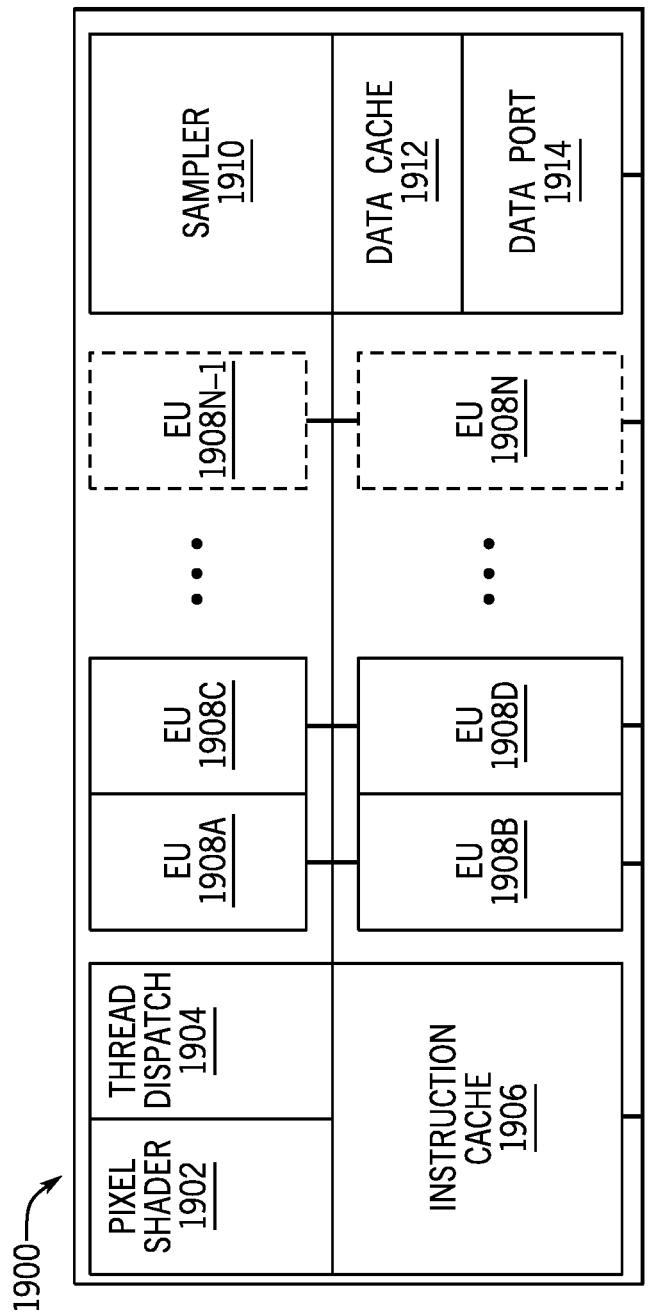
FIG. 17 is a depiction of thread execution logic according to one embodiment.

FIG. 17 illustrates thread execution logic 1900 including an array of processing elements employed in some embodiments of a GPE. Elements of FIG. 17 having the same reference numbers (or names) as the elements of any other figure herein can operate or function in any manner similar to that described elsewhere herein, but are not limited to such.

In some embodiments, thread execution logic 1900 includes a shader processor 1902, a thread dispatcher 1904, instruction cache 1906, a scalable execution unit array including a plurality of execution units 1908A-1908N, a sampler 1910, a data cache 1912, and a data port 1914. In one embodiment the scalable execution unit array can dynamically scale by enabling or disabling one or more execution units (e.g., any of execution unit 1908A, 1908B, 1908C, 1908D, through 1908N-1 and 1908N) based on the computational requirements of a workload. In one embodiment the included components are interconnected via an interconnect fabric that links to each of the components. In some embodiments, thread execution logic 1900 includes one or more connections to memory, such as system memory or cache memory, through one or more of instruction cache 1906, data port 1914, sampler 1910, and execution units 1908A-1908N. In some embodiments, each execution unit (e.g. 1908A) is a stand-alone programmable general purpose computational unit that is capable of executing multiple simultaneous hardware threads while processing multiple data elements in parallel for each thread. In various embodiments, the array of execution units 1908A-1908N is scalable to include any number individual execution units.

In some embodiments, the execution units 1908A-1908N are primarily used to execute shader programs. A shader processor 1902 can process the various shader programs and dispatch execution threads associated with the shader programs via a thread dispatcher 1904. In one embodiment the thread dispatcher includes logic to arbitrate thread initiation requests from the graphics and media pipelines and instantiate the requested threads on one or more execution unit in the execution units 1908A-1908N. For example, the geometry pipeline (e.g., 1836 of FIG. 16) can dispatch vertex, tessellation, or geometry shaders to the thread execution logic 1900 (FIG. 17) for processing. In some embodiments, thread dispatcher 1904 can also process runtime thread spawning requests from the executing shader programs.

In some embodiments, the execution units 1908A-1908N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 1908A-1908N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 1908A-1908N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader.

Each execution unit in execution units 1908A-1908N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 1908A-1908N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

One or more internal instruction caches (e.g., 1906) are included in the thread execution logic 1900 to cache thread instructions for the execution units. In some embodiments, one or more data caches (e.g., 1912) are included to cache thread data during thread execution. In some embodiments, a sampler 1910 is included to provide texture sampling for 3D operations and media sampling for media operations. In some embodiments, sampler 1910 includes specialized texture or media sampling functionality to process texture or media data during the sampling process before providing the sampled data to an execution unit.

During execution, the graphics and media pipelines send thread initiation requests to thread execution logic 1900 via thread spawning and dispatch logic. Once a group of geometric objects has been processed and rasterized into pixel data, pixel processor logic (e.g., pixel shader logic, fragment shader logic, etc.) within the shader processor 1902 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 1902 then executes an application programming interface (API)-supplied pixel or fragment shader program. To execute the shader program, the shader processor 1902 dispatches threads to an execution unit (e.g., 1908A) via thread dispatcher 1904. In some embodiments, pixel shader 1902 uses texture sampling logic in the sampler 1910 to access texture data in texture maps stored in memory. Arithmetic operations on the texture data and the input geometry data compute pixel color data for each geometric fragment, or discards one or more pixels from further processing.

In some embodiments, the data port 1914 provides a memory access mechanism for the thread execution logic 1900 output processed data to memory for processing on a graphics processor output pipeline. In some embodiments, the data port 1914 includes or couples to one or more cache memories (e.g., data cache 1912) to cache data for memory access via the data port.

Figure 18:
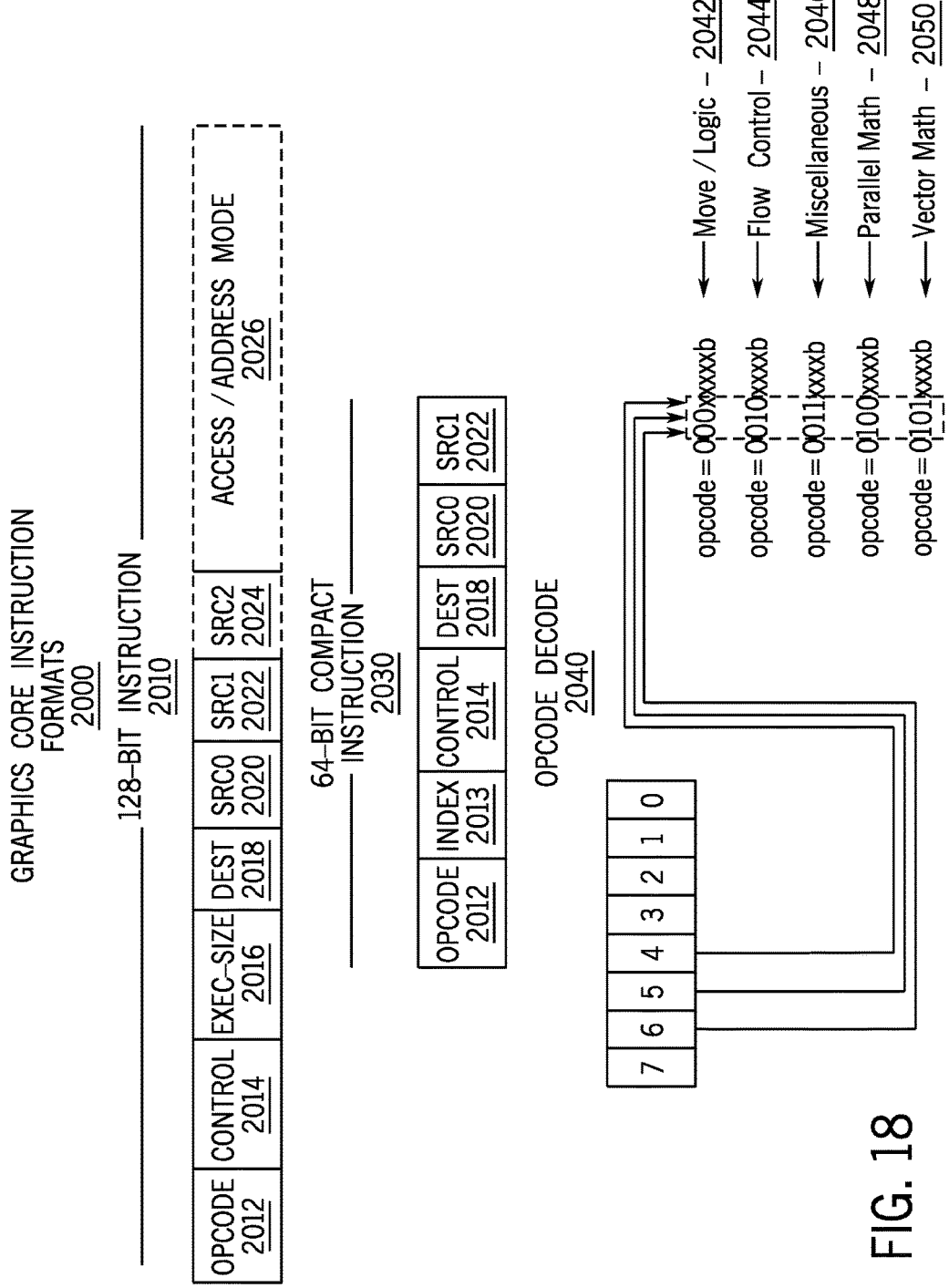
FIG. 18 is a block diagram of a graphics processor instruction format according to some embodiments.

FIG. 18 is a block diagram illustrating a graphics processor instruction formats 2000 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 2000 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 2010. A 64-bit compacted instruction format 2030 is available for some instructions based on the selected instruction, instruction options, and number of operands. The native 128-bit instruction format 2010 provides access to all instruction options, while some options and operations are restricted in the 64-bit instruction format 2030. The native instructions available in the 64-bit instruction format 2030 vary by embodiment. In some embodiments, the instruction is compacted in part using a set of index values in an index field 2013. The execution unit hardware references a set of compaction tables based on the index values and uses the compaction table outputs to reconstruct a native instruction in the 128-bit instruction format 2010.

For each format, instruction opcode 2012 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 2014 enables control over certain execution options, such as channels selection (e.g., predication) and data channel order (e.g., swizzle). For instructions in the 128-bit instruction format 2010 an exec-size field 2016 limits the number of data channels that will be executed in parallel. In some embodiments, exec-size field 2016 is not available for use in the 64-bit compact instruction format 2030.

Some execution unit instructions have up to three operands including two source operands, src0 2020, src1 2022, and one destination 2018. In some embodiments, the execution units support dual destination instructions, where one of the destinations is implied. Data manipulation instructions can have a third source operand (e.g., SRC2 2024), where the instruction opcode 2012 determines the number of source operands. An instruction's last source operand can be an immediate (e.g., hard-coded) value passed with the instruction.

In some embodiments, the 128-bit instruction format 2010 includes an access/address mode field 2026 specifying, for example, whether direct register addressing mode or indirect register addressing mode is used. When direct register addressing mode is used, the register address of one or more operands is directly provided by bits in the instruction.

In some embodiments, the 128-bit instruction format 2010 includes an access/address mode field 2026, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 2026 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 2012 bit-fields to simplify Opcode decode 2040. For an 8-bit opcode, bits 4, 5, and 6 allow the execution unit to determine the type of opcode. The precise opcode grouping shown is merely an example. In some embodiments, a move and logic opcode group 2042 includes data movement and logic instructions (e.g., move (mov), compare (cmp)). In some embodiments, move and logic group 2042 shares the five most significant bits (MSB), where move (mov) instructions are in the form of 0000xxxxb and logic instructions are in the form of 0001xxxxb. A flow control instruction group 2044 (e.g., call, jump (jmp)) includes instructions in the form of 0010xxxxb (e.g., 0x20). A miscellaneous instruction group 2046 includes a mix of instructions, including synchronization instructions (e.g., wait, send) in the form of 0011xxxxb (e.g., 0x30). A parallel math instruction group 2048 includes component-wise arithmetic instructions (e.g., add, multiply (mul)) in the form of 0100xxxxb (e.g., 0x40). The parallel math group 2048 performs the arithmetic operations in parallel across data channels. The vector math group 2050 includes arithmetic instructions (e.g., dp4) in the form of 0101xxxxb (e.g., 0x50). The vector math group performs arithmetic such as dot product calculations on vector operands.

Figure 19:
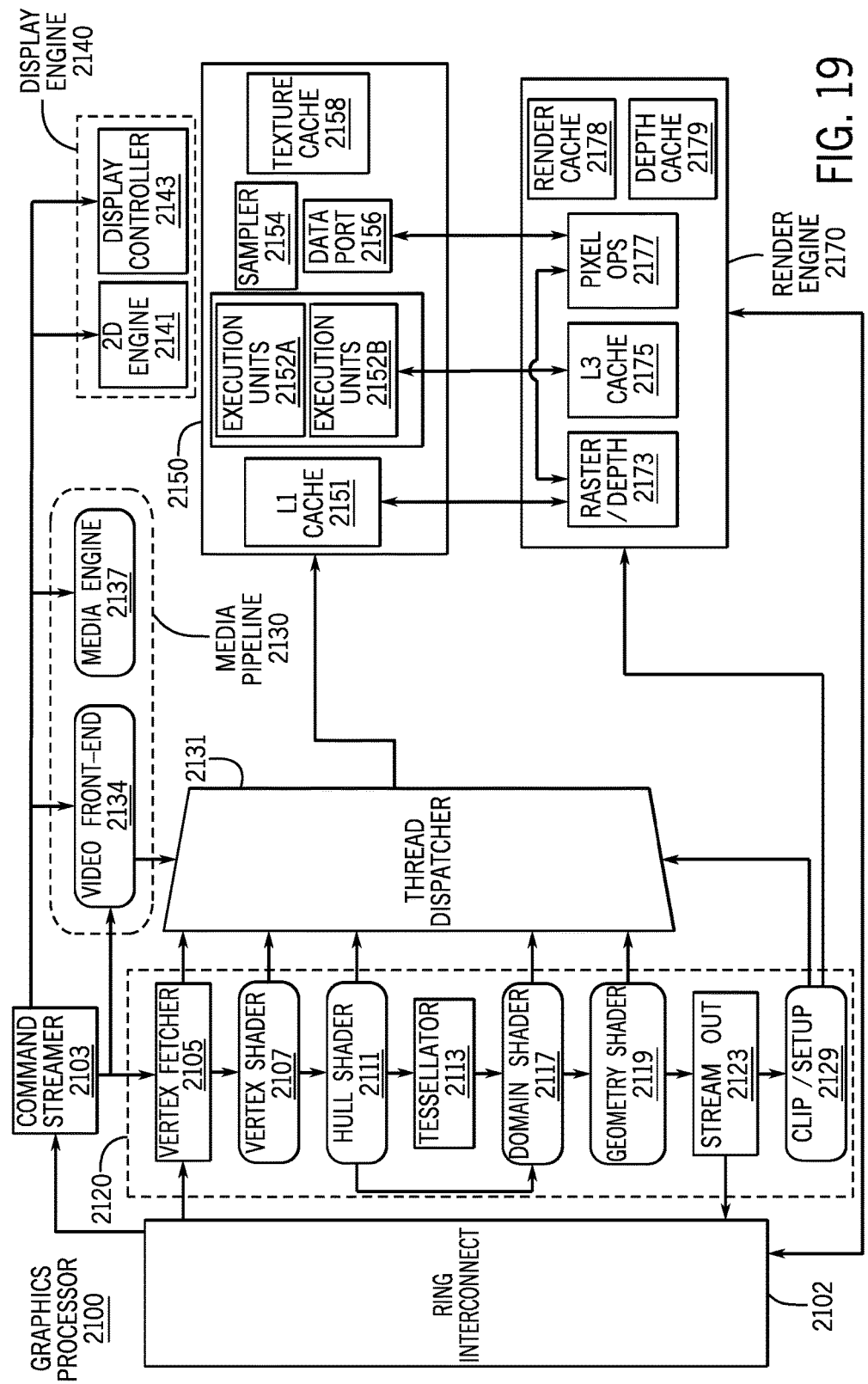
FIG. 19 is a block diagram of another embodiment of a graphics processor.

FIG. 19 is a block diagram of another embodiment of a graphics processor 2100. Elements of FIG. 19 having the same reference numbers (or names) as the elements of any other figure herein can operate or function in any manner similar to that described elsewhere herein, but are not limited to such.

In some embodiments, graphics processor 2100 includes a graphics pipeline 2120, a media pipeline 2130, a display engine 2140, thread execution logic 2150, and a render output pipeline 2170. In some embodiments, graphics processor 2100 is a graphics processor within a multi-core processing system that includes one or more general purpose processing cores. The graphics processor is controlled by register writes to one or more control registers (not shown) or via commands issued to graphics processor 2100 via a ring interconnect 2102. In some embodiments, ring interconnect 2102 couples graphics processor 2100 to other processing components, such as other graphics processors or general-purpose processors. Commands from ring interconnect 2102 are interpreted by a command streamer 2103, which supplies instructions to individual components of graphics pipeline 2120 or media pipeline 2130.

In some embodiments, command streamer 2103 directs the operation of a vertex fetcher 2105 that reads vertex data from memory and executes vertex-processing commands provided by command streamer 2103. In some embodiments, vertex fetcher 2105 provides vertex data to a vertex shader 2107, which performs coordinate space transformation and lighting operations to each vertex. In some embodiments, vertex fetcher 2105 and vertex shader 2107 execute vertex-processing instructions by dispatching execution threads to execution units 2152A-2152B via a thread dispatcher 2131.

In some embodiments, execution units 2152A-2152B are an array of vector processors having an instruction set for performing graphics and media operations. In some embodiments, execution units 2152A-2152B have an attached L1 cache 2151 that is specific for each array or shared between the arrays. The cache can be configured as a data cache, an instruction cache, or a single cache that is partitioned to contain data and instructions in different partitions.

In some embodiments, graphics pipeline 2120 includes tessellation components to perform hardware-accelerated tessellation of 3D objects. In some embodiments, a programmable hull shader 2111 configures the tessellation operations. A programmable domain shader 2117 provides back-end evaluation of tessellation output. A tessellator 2113 operates at the direction of hull shader 2111 and contains special purpose logic to generate a set of detailed geometric objects based on a coarse geometric model that is provided as input to graphics pipeline 2120. In some embodiments, if tessellation is not used, tessellation components (e.g., hull shader 2311, tessellator 2113, and domain shader 2117) can be bypassed.

In some embodiments, complete geometric objects can be processed by a geometry shader 2119 via one or more threads dispatched to execution units 2152A-2152B, or can proceed directly to the clipper 2129. In some embodiments, the geometry shader operates on entire geometric objects, rather than vertices or patches of vertices as in previous stages of the graphics pipeline. If the tessellation is disabled the geometry shader 2119 receives input from the vertex shader 2107. In some embodiments, geometry shader 2119 is programmable by a geometry shader program to perform geometry tessellation if the tessellation units are disabled.

Before rasterization, a clipper 2129 processes vertex data. The clipper 2129 may be a fixed function clipper or a programmable clipper having clipping and geometry shader functions. In some embodiments, a rasterizer and depth test component 2173 in the render output pipeline 2170 dispatches pixel shaders to convert the geometric objects into their per pixel representations. In some embodiments, pixel shader logic is included in thread execution logic 2150. In some embodiments, an application can bypass the rasterizer and depth test component 2173 and access un-rasterized vertex data via a stream out unit 2123.

The graphics processor 2100 has an interconnect bus, interconnect fabric, or some other interconnect mechanism that allows data and message passing amongst the major components of the processor. In some embodiments, execution units 2152A-2152B and associated cache(s) 2151, texture and media sampler 2154, and texture/sampler cache 2158 interconnect via a data port 2156 to perform memory access and communicate with render output pipeline components of the processor. In some embodiments, sampler 2154, caches 2151, 2158 and execution units 2152A-2152B each have separate memory access paths.

In some embodiments, render output pipeline 2170 contains a rasterizer and depth test component 2173 that converts vertex-based objects into an associated pixel-based representation. In some embodiments, the rasterizer logic includes a windower/masker unit to perform fixed function triangle and line rasterization. An associated render cache 2178 and depth cache 2179 are also available in some embodiments. A pixel operations component 2177 performs pixel-based operations on the data, though in some instances, pixel operations associated with 2D operations (e.g. bit block image transfers with blending) are performed by the 2D engine 2141, or substituted at display time by the display controller 2143 using overlay display planes. In some embodiments, a shared L3 cache 2175 is available to all graphics components, allowing the sharing of data without the use of main system memory.

In some embodiments, graphics processor media pipeline 2130 includes a media engine 2137 and a video front end 2134. In some embodiments, video front end 2134 receives pipeline commands from the command streamer 2103. In some embodiments, media pipeline 2130 includes a separate command streamer. In some embodiments, video front-end 2134 processes media commands before sending the command to the media engine 2137. In some embodiments, media engine 2137 includes thread spawning functionality to spawn threads for dispatch to thread execution logic 2150 via thread dispatcher 2131.

In some embodiments, graphics processor 2100 includes a display engine 2140. In some embodiments, display engine 2140 is external to processor 2100 and couples with the graphics processor via the ring interconnect 2102, or some other interconnect bus or fabric. In some embodiments, display engine 2140 includes a 2D engine 2141 and a display controller 2143. In some embodiments, display engine 2140 contains special purpose logic capable of operating independently of the 3D pipeline. In some embodiments, display controller 2143 couples with a display device (not shown), which may be a system integrated display device, as in a laptop computer, or an external display device attached via a display device connector.

In some embodiments, graphics pipeline 2120 and media pipeline 2130 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Figure 20A:
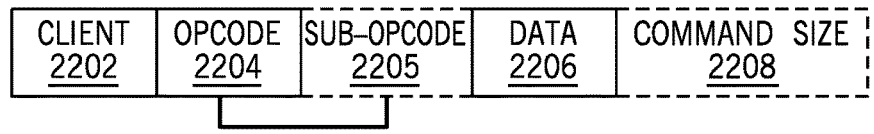
FIGS. 20A-20B is a block diagram of a graphics processor command format according to some embodiments.
Figure 20B:
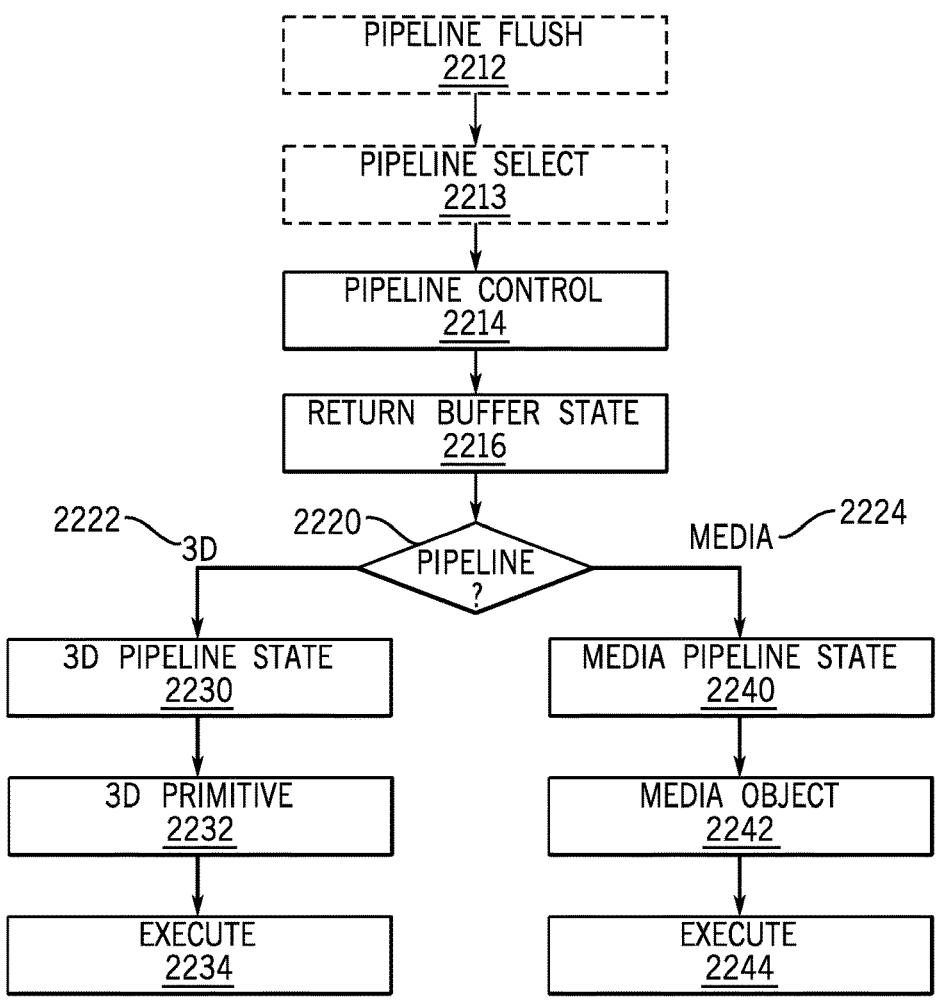

FIG. 20A is a block diagram illustrating a graphics processor command format 2200 according to some embodiments. FIG. 20B is a block diagram illustrating a graphics processor command sequence 2210 according to an embodiment. The solid lined boxes in FIG. 20A illustrate the components that are generally included in a graphics command while the dashed lines include components that are optional or that are only included in a sub-set of the graphics commands. The exemplary graphics processor command format 2200 of FIG. 20A includes data fields to identify a target client 2202 of the command, a command operation code (opcode) 2204, and the relevant data 2206 for the command. A sub-opcode 2205 and a command size 2208 are also included in some commands.

In some embodiments, client 2202 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 2204 and, if present, sub-opcode 2205 to determine the operation to perform. The client unit performs the command using information in data field 2206. For some commands an explicit command size 2208 is expected to specify the size of the command. In some embodiments, the command parser automatically determines the size of at least some of the commands based on the command opcode. In some embodiments commands are aligned via multiples of a double word.

The flow diagram in FIG. 20B shows an exemplary graphics processor command sequence 2210. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 2210 may begin with a pipeline flush command 2212 to cause any active graphics pipeline to complete the currently pending commands for the pipeline. In some embodiments, the 3D pipeline 2222 and the media pipeline 2224 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 2212 can be used for pipeline synchronization or before placing the graphics processor into a low power state.

In some embodiments, a pipeline select command 2213 is used when a command sequence requires the graphics processor to explicitly switch between pipelines. In some embodiments, a pipeline select command 2213 is required only once within an execution context before issuing pipeline commands unless the context is to issue commands for both pipelines. In some embodiments, a pipeline flush command 2212 is required immediately before a pipeline switch via the pipeline select command 2213.

In some embodiments, a pipeline control command 2214 configures a graphics pipeline for operation and is used to program the 3D pipeline 2222 and the media pipeline 2224. In some embodiments, pipeline control command 2214 configures the pipeline state for the active pipeline. In one embodiment, the pipeline control command 2214 is used for pipeline synchronization and to clear data from one or more cache memories within the active pipeline before processing a batch of commands.

In some embodiments, commands for the return buffer state 2216 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, configuring the return buffer state 2216 includes selecting the size and number of return buffers to use for a set of pipeline operations.

The remaining commands in the command sequence differ based on the active pipeline for operations. Based on a pipeline determination 2220, the command sequence is tailored to the 3D pipeline 2222 beginning with the 3D pipeline state 2230 or the media pipeline 2224 beginning at the media pipeline state 2240.

The commands to configure the 3D pipeline state 2230 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 2230 commands are also able to selectively disable or bypass certain pipeline elements if those elements will not be used.

In some embodiments, 3D primitive 2232 command is used to submit 3D primitives to be processed by the 3D pipeline. Commands and associated parameters that are passed to the graphics processor via the 3D primitive 2232 command are forwarded to the vertex fetch function in the graphics pipeline. The vertex fetch function uses the 3D primitive 2232 command data to generate vertex data structures. The vertex data structures are stored in one or more return buffers. In some embodiments, 3D primitive 2232 command is used to perform vertex operations on 3D primitives via vertex shaders. To process vertex shaders, 3D pipeline 2222 dispatches shader execution threads to graphics processor execution units.

In some embodiments, 3D pipeline 2222 is triggered via an execute 2234 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 910 follows the media pipeline 2240 path when performing media operations. In general, the specific use and manner of programming for the media pipeline 2240 depends on the media or compute operations to be performed. Specific media decode operations may be offloaded to the media pipeline during media decode. In some embodiments, the media pipeline can also be bypassed and media decode can be performed in whole or in part using resources provided by one or more general purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 2240 is configured in a similar manner as the 3D pipeline 2222. A set of commands to configure the media pipeline state 2240 are dispatched or placed into a command queue before the media object commands 2242. In some embodiments, commands for the media pipeline state 2240 include data to configure the media pipeline elements that will be used to process the media objects. This includes data to configure the video decode and video encode logic within the media pipeline, such as encode or decode format. In some embodiments, commands for the media pipeline state 940 also support the use of one or more pointers to "indirect" state elements that contain a batch of state settings.

In some embodiments, media object commands 2242 supply pointers to media objects for processing by the media pipeline. The media objects include memory buffers containing video data to be processed. In some embodiments, all media pipeline states must be valid before issuing a media object command 2242. Once the pipeline state is configured and media object commands 2242 are queued, the media pipeline 2224 is triggered via an execute command 2244 or an equivalent execute event (e.g., register write). Output from media pipeline 2224 may then be post processed by operations provided by the 3D pipeline 2222 or the media pipeline 2224. In some embodiments, GPGPU operations are configured and executed in a similar manner as media operations.

Graphics Software Architecture

Figure 21:
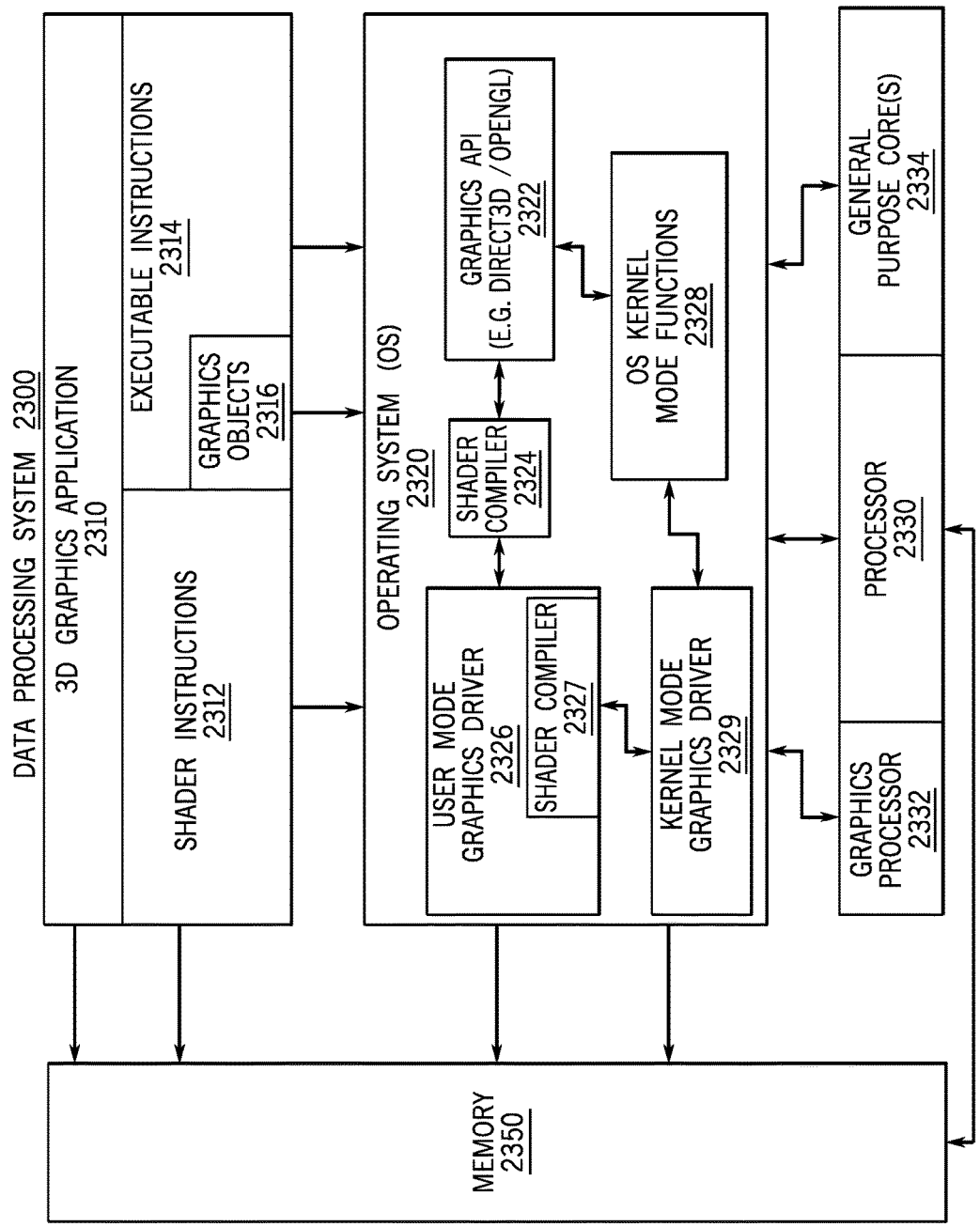
FIG. 21 illustrates exemplary graphics software architecture for a data processing system for one embodiment.

FIG. 21 illustrates exemplary graphics software architecture for a data processing system 2300 according to some embodiments. In some embodiments, software architecture includes a 3D graphics application 2310, an operating system 2320, and at least one processor 2330. In some embodiments, processor 2330 includes a graphics processor 2332 and one or more general-purpose processor core(s) 2334. The graphics application 2310 and operating system 2320 each execute in the system memory 2350 of the data processing system.

In some embodiments, 3D graphics application 2310 contains one or more shader programs including shader instructions 2312. The shader language instructions may be in a high-level shader language, such as the High Level Shader Language (HLSL) or the OpenGL Shader Language (GLSL). The application also includes executable instructions 2314 in a machine language suitable for execution by the general-purpose processor core 2334. The application also includes graphics objects 2316 defined by vertex data.

In some embodiments, operating system 2320 is a Microsoft® Windows® operating system from the Microsoft Corporation, a proprietary UNIX-like operating system, or an open source UNIX-like operating system using a variant of the Linux kernel. The operating system 2320 can support a graphics API 2322 such as the Direct3D API, the OpenGL API, or the Vulkan API. When the Direct3D API is in use, the operating system 2320 uses a front-end shader compiler 2324 to compile any shader instructions 2312 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 2310. In some embodiments, the shader instructions 2312 are provided in an intermediate form, such as a version of the Standard Portable Intermediate Representation (SPIR) used by the Vulkan API.

In some embodiments, user mode graphics driver 2326 contains a back-end shader compiler 2327 to convert the shader instructions 2312 into a hardware specific representation. When the OpenGL API is in use, shader instructions 2312 in the GLSL high-level language are passed to a user mode graphics driver 2326 for compilation. In some embodiments, user mode graphics driver 2326 uses operating system kernel mode functions 2328 to communicate with a kernel mode graphics driver 2329. In some embodiments, kernel mode graphics driver 2329 communicates with graphics processor 2332 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 22:
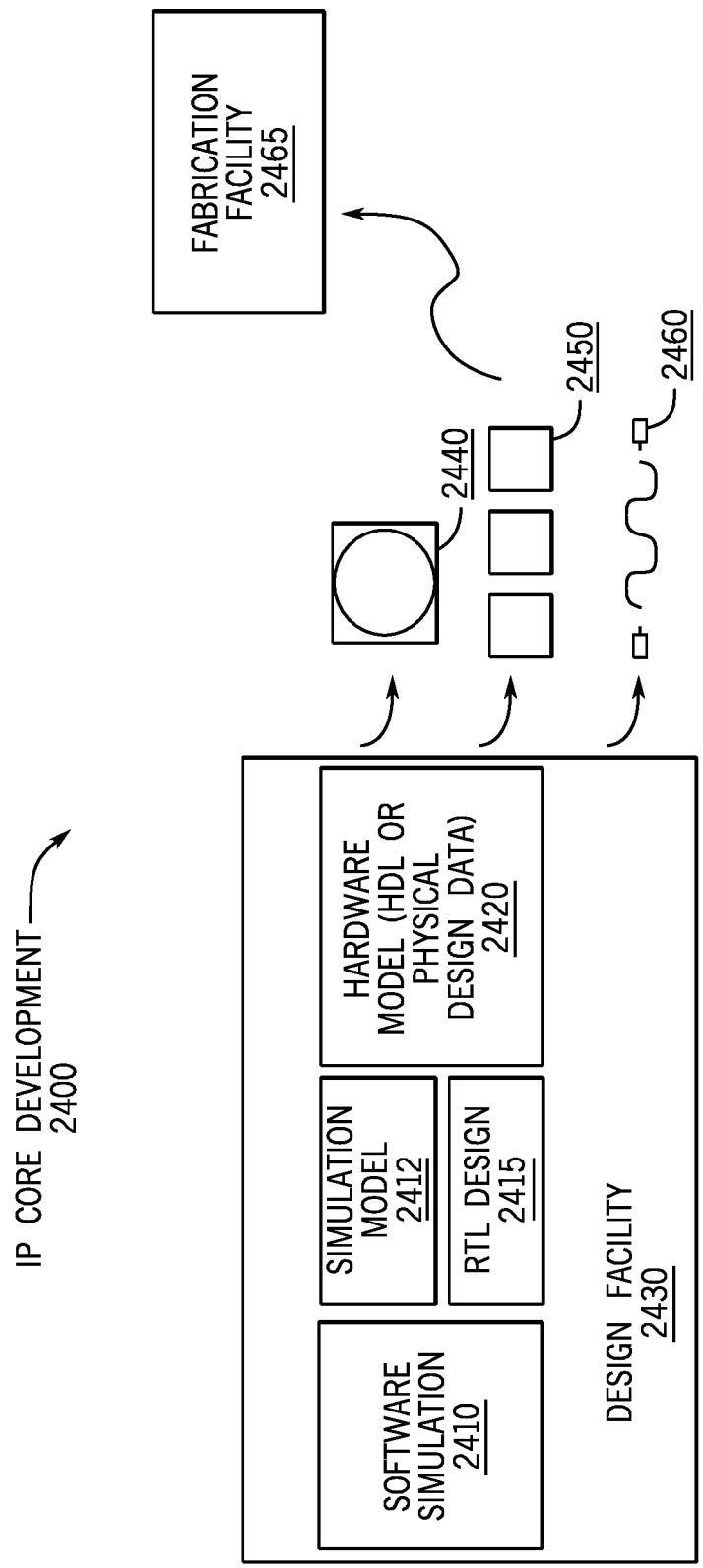
FIG. 22 is a block diagram illustrating an IP core development system for one embodiment.

FIG. 22 is a block diagram illustrating an IP core development system 2400 that may be used to manufacture an integrated circuit to perform operations according to an embodiment. The IP core development system 2400 may be used to generate modular, re-usable designs that can be incorporated into a larger design or used to construct an entire integrated circuit (e.g., an SOC integrated circuit). A design facility 2430 can generate a software simulation 2410 of an IP core design in a high level programming language (e.g., C/C++). The software simulation 2410 can be used to design, test, and verify the behavior of the IP core using a simulation model 2412. The simulation model 2412 may include functional, behavioral, and/or timing simulations. A register transfer level (RTL) design 2415 can then be created or synthesized from the simulation model 2412. The RTL design 2415 is an abstraction of the behavior of the integrated circuit that models the flow of digital signals between hardware registers, including the associated logic performed using the modeled digital signals. In addition to an RTL design 2415, lower-level designs at the logic level or transistor level may also be created, designed, or synthesized. Thus, the particular details of the initial design and simulation may vary.

The RTL design 2415 or equivalent may be further synthesized by the design facility into a hardware model 2420, which may be in a hardware description language (HDL), or some other representation of physical design data. The HDL may be further simulated or tested to verify the IP core design. The IP core design can be stored for delivery to a 3rd party fabrication facility 2465 using non-volatile memory 2440 (e.g., hard disk, flash memory, or any non-volatile storage medium). Alternatively, the IP core design may be transmitted (e.g., via the Internet) over a wired connection 2450 or wireless connection 2460. The fabrication facility 2465 may then fabricate an integrated circuit that is based at least in part on the IP core design. The fabricated integrated circuit can be configured to perform operations in accordance with at least one embodiment described herein.

Exemplary System on a Chip Integrated Circuit

Figure 23:
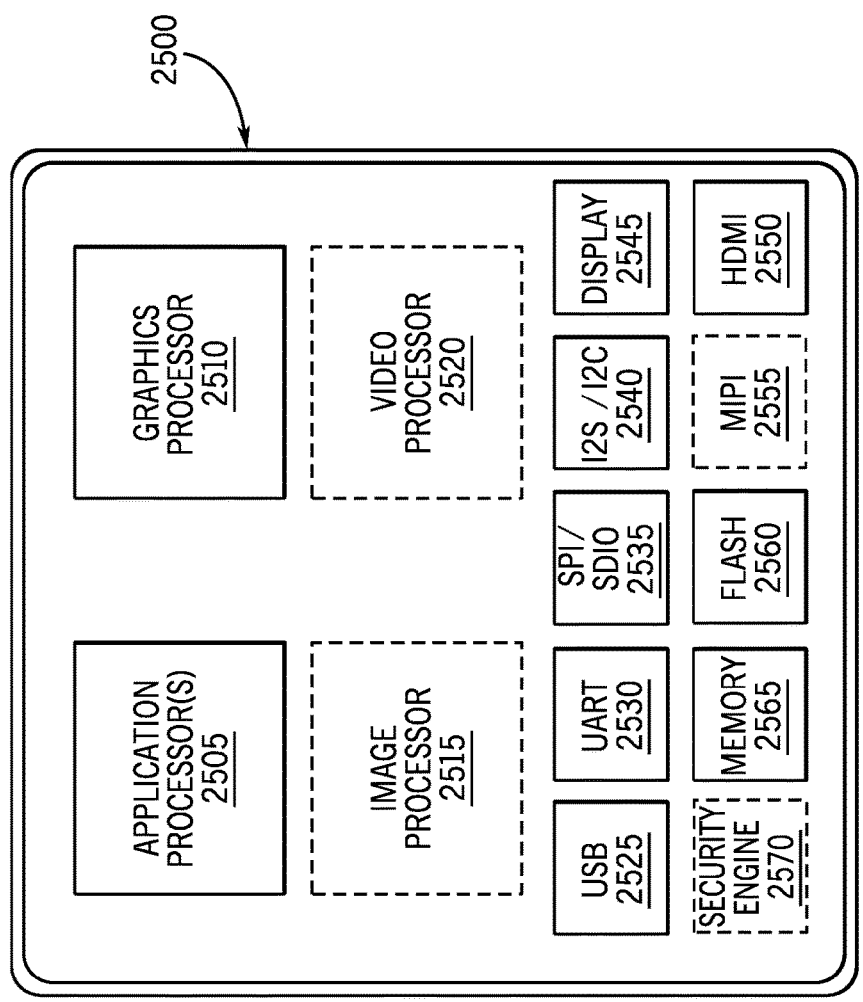
FIG. 23 is a block diagram illustrating an exemplary system on a chip for one embodiment.
Figure 24:
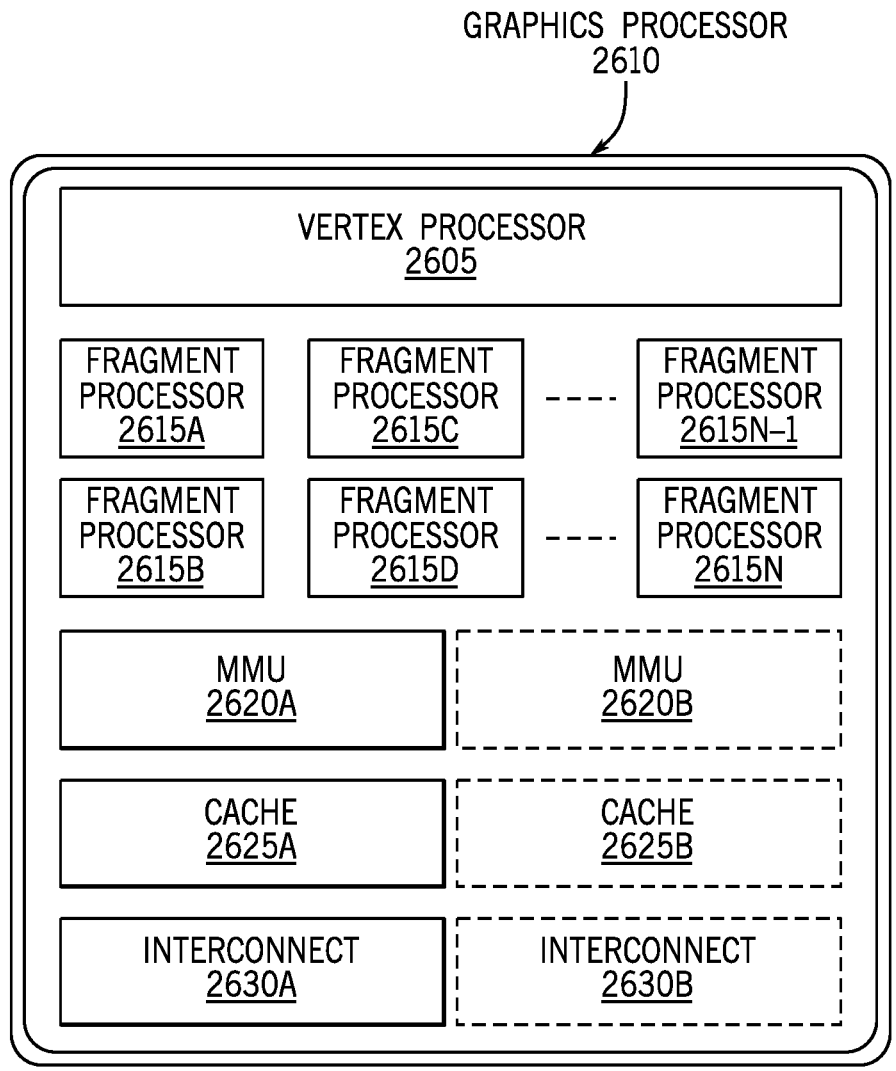
FIG. 24 is a block diagram illustrating an exemplary graphics processor.
Figure 25:
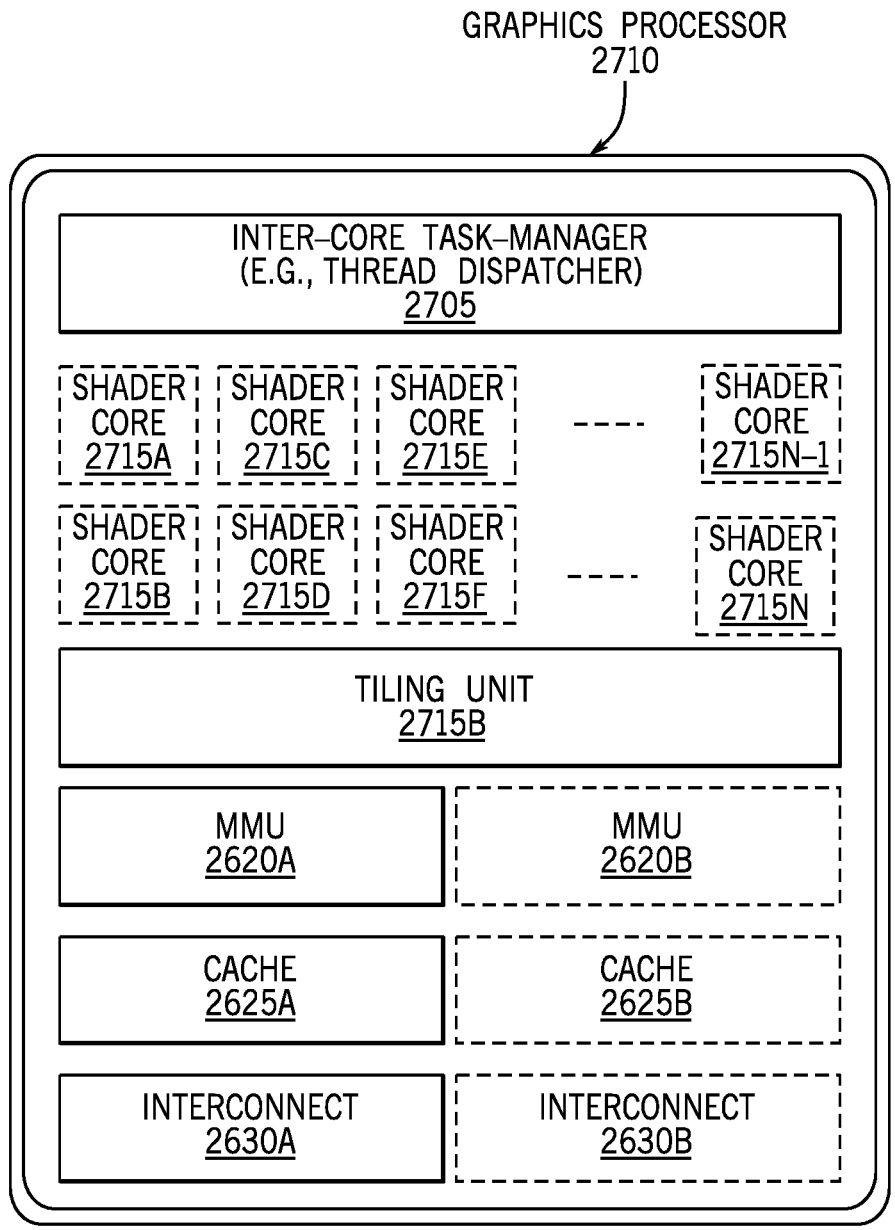
FIG. 25 is a block diagram illustrating an additional exemplary graphics processor.

FIGS. 23-25 illustrate exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general purpose processor cores.

FIG. 23 is a block diagram illustrating an exemplary system on a chip integrated circuit 2500 that may be fabricated using one or more IP cores, according to an embodiment. Exemplary integrated circuit 2500 includes one or more application processor(s) 2505 (e.g., CPUs), at least one graphics processor 2510, and may additionally include an image processor 2515 and/or a video processor 2520, any of which may be a modular IP core from the same or multiple different design facilities. Integrated circuit 2500 includes peripheral or bus logic including a USB controller 2525, UART controller 2530, an SPI/SDIO controller 2535, and an I2S/I2C controller 2540. Additionally, the integrated circuit can include a display device 2545 coupled to one or more of a high-definition multimedia interface (HDMI) controller 2550 and a mobile industry processor interface (MIPI) display interface 2555. Storage may be provided by a flash memory subsystem 2560 including flash memory and a flash memory controller. Memory interface may be provided via a memory controller 2565 for access to SDRAM or SRAM memory devices. Some integrated circuits additionally include an embedded security engine 2570.

FIG. 24 is a block diagram illustrating an exemplary graphics processor 2610 of a system on a chip integrated circuit that may be fabricated using one or more IP cores, according to an embodiment. Graphics processor 2610 can be a variant of the graphics processor 2510 of FIG. 23. Graphics processor 2610 includes a vertex processor 2605 and one or more fragment processor(s) 2615A-2615N (e.g., 2615A, 2615B, 2615C, 2615D, through 2615N–1, and 2615N). Graphics processor 2610 can execute different shader programs via separate logic, such that the vertex processor 2605 is optimized to execute operations for vertex shader programs, while the one or more fragment processor(s) 2615A-2615N execute fragment (e.g., pixel) shading operations for fragment or pixel shader programs. The vertex processor 2605 performs the vertex processing stage of the 3D graphics pipeline and generates primitives and vertex data. The fragment processor(s) 2615A-2615N use the primitive and vertex data generated by the vertex processor 2605 to produce a framebuffer that is displayed on a display device. In one embodiment, the fragment processor(s) 2615A-2615N are optimized to execute fragment shader programs as provided for in the OpenGL API, which may be used to perform similar operations as a pixel shader program as provided for in the Direct 3D API.

Graphics processor 2610 additionally includes one or more memory management units (MMUs) 2620A-2620B, cache(s) 2625A-2625B, and circuit interconnect(s) 2630A-2630B. The one or more MMU(s) 2620A-2620B provide for virtual to physical address mapping for graphics processor 2610, including for the vertex processor 2605 and/or fragment processor(s) 2615A-2615N, which may reference vertex or image/texture data stored in memory, in addition to vertex or image/texture data stored in the one or more cache(s) 2625A-2625B. In one embodiment the one or more MMU(s) 2620A-2620B may be synchronized with other MMUs within the system, including one or more MMUs associated with the one or more application processor(s) 2505, image processor 2515, and/or video processor 2520 of FIG. 23, such that each processor 2505-2520 can participate in a shared or unified virtual memory system. The one or more circuit interconnect(s) 2630A-2630B enable graphics processor 2610 to interface with other IP cores within the SoC, either via an internal bus of the SoC or via a direct connection, according to embodiments.

FIG. 25 is a block diagram illustrating an additional exemplary graphics processor 2710 of a system on a chip integrated circuit that may be fabricated using one or more IP cores, according to an embodiment. Graphics processor 2710 can be a variant of the graphics processor 1710 of FIG. 15. Graphics processor 2710 includes the one or more MMU(s) 2620A-2620B, cache(s) 2625A-2625B, and circuit interconnect(s) 2630A-2630B of the integrated circuit 2610 of FIG. 20.

Graphics processor 2710 includes one or more shader core(s) 2715A-2715N (e.g., 2715A, 2715B, 2715C, 2715D, 2715E, 2715F, through 2715N-1, and 2715N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 2710 includes an inter-core task manager 2705, which acts as a thread dispatcher to dispatch execution threads to one or more shader core(s) 2715A-2715N and a tiling unit 2718 to accelerate tiling operations for tile-based rendering, in which rendering operations for a scene are subdivided in image space, for example to exploit local spatial coherence within a scene or to optimize use of internal caches.

The following clauses and/or examples pertain to further embodiments:

One example embodiment may be a method comprising providing a pulse triggered flip flop circuit including an exclusive OR clock generating stage that receives an input clock and data and produces an output clock pulse, said stage to produce the output clock pulse that only goes away when the data is fully captured, and said stage to disable the output clock pulse only when the data is fully captured. The method may include providing a feedback signal to the stage. The method may include wherein said stage only produces the clock output pulse when the input clock is high. The method may include wherein said stage only produces the clock output pulse when only one of data and the feedback signal is high. The method may include said stage to compare data, databar, feedback, feedback bar and the input clock. The method may include self-correcting the pulse generator stage. The method may include using only eight clocked transistors in said circuit. The method may include only toggling the circuit when input data changes.

In another example embodiment may be one or more non-transitory computer readable media storing instructions to perform a sequence comprising providing a pulse triggered flip flop circuit including an exclusive OR clock generating stage that receives an input clock and data and produces an output clock pulse, said stage to produce the output clock pulse that only goes away when the data is fully captured, and said stage to disable the output clock pulse only when the data is fully captured. The media may include further storing instructions to perform a sequence including providing a feedback signal to the stage. The media may include further storing instructions to perform a sequence wherein said stage only produces the clock output pulse when the input clock is high. The media may include further storing instructions to perform a sequence wherein said stage only produces the clock output pulse when only one of data and the feedback signal is high. The media may include further storing instructions to perform a sequence including said stage to compare data, databar, feedback, feedback bar and the input clock. The media may include further storing instructions to perform a sequence including self-correcting the pulse generator stage. The media may include further storing instructions to perform a sequence including using only eight clocked transistors in said circuit. The media may include further storing instructions to perform a sequence including only toggling the circuit when input data changes.

Another example embodiment may be a pulse triggered flip flop circuit comprising an exclusive OR clock generating stage that receives an input clock and data and produces an output clock pulse, said stage to produce the output clock pulse that only goes away when the data is fully captured, said stage to disable the output clock pulse only when the data is fully captured, and clocked transistors coupled to said clock generating stage. The circuit may include said transistors to provide a feedback signal to the stage. The circuit may include wherein said stage only produces the clock output pulse when the input clock is high. The circuit may include wherein said stage only produces the clock output pulse when only one of data and the feedback signal is high. The circuit may include said transistors to provide a stage to compare data, databar, feedback, feedback bar and the input clock. The circuit may include wherein said pulse generator stage is self-correcting. The circuit may include only eight clocked transistors. The circuit may include only toggling when input data changes.

The following clauses and/or examples pertain to further embodiments:

One example embodiment may be a method comprising providing a pulse triggered flip flop circuit including an exclusive OR clock generating stage that receives an input clock and data and produces an output clock pulse, said stage to produce the output clock pulse that only goes away when the data is fully captured, and said stage to disable the output clock pulse only when the data is fully captured. The method may include providing a feedback signal to the stage. The method may include wherein said stage only produces the clock output pulse when the input clock is high. The method may include wherein said stage only produces the clock output pulse when only one of data and the feedback signal is high. The method may include said stage to compare data, databar, feedback, feedback bar and the input clock. The method may include self-correcting the pulse generator stage. The method may include using only eight clocked transistors in said circuit. The method may include only toggling the circuit when input data changes.

In another example embodiment may include one or more non-transitory computer readable media storing instructions to perform a sequence comprising providing a pulse triggered flip flop circuit including an exclusive OR clock generating stage that receives an input clock and data and produces an output clock pulse, said stage to produce the output clock pulse that only goes away when the data is fully captured; and said stage to disable the output clock pulse only when the data is fully captured. The media may further storing instructions to perform a sequence including providing a feedback signal to the stage. The media may further storing instructions to perform a sequence wherein said stage only produces the clock output pulse when the input clock is high. The media may further storing instructions to perform a sequence wherein said stage only produces the clock output pulse when only one of data and the feedback signal is high. The media may further storing instructions to perform a sequence including said stage to compare data, databar, feedback, feedback bar and the input clock. The media may further storing instructions to perform a sequence including self-correcting the pulse generator stage. The media may further storing instructions to perform a sequence including using only eight clocked transistors in said circuit. The media may further storing instructions to perform a sequence including only toggling the circuit when input data changes.

Another example embodiment may be a pulse triggered flip flop circuit comprising an exclusive OR clock generating stage that receives an input clock and data and produces an output clock pulse, said stage to produce the output clock pulse that only goes away when the data is fully captured, said stage to disable the output clock pulse only when the data is fully captured and clocked transistors coupled to said clock generating stage. The circuit may include said transistors to provide a feedback signal to the stage. The circuit may include wherein said stage only produces the clock output pulse when the input clock is high. The circuit may include wherein said stage only produces the clock output pulse when only one of data and the feedback signal is high. The circuit may include said transistors to provide a stage to compare data, databar, feedback, feedback bar and the input clock. The circuit may include wherein said pulse generator stage is self-correcting. The circuit may include only eight clocked transistors. The circuit may include the circuit only toggling when input data changes.

The foregoing description and drawings are to be regarded in an illustrative rather than a restrictive sense. Persons skilled in the art will understand that various modifications and changes may be made to the embodiments described herein without departing from the broader spirit and scope of the invention as set forth in the appended claims.

What is claimed:

1. A method comprising:
providing a pulse triggered flip flop circuit including an exclusive OR clock generating stage that receives an input clock and data and produces an output clock pulse;
said stage to produce the output clock pulse that only goes away when the data is fully captured;
said stage to disable the output clock pulse only when the data is fully captured; and
providing clocked transistors coupled to said stage, wherein said stage includes only eight clocked transistors.

2. The method of claim 1 including providing a feedback signal to the stage.

3. The method of claim 2 wherein said stage only produces the clock output pulse when the input clock is high.

4. The method of claim 2 wherein said stage only produces the clock output pulse when only one of data and the feedback signal is high.

5. The method of claim 2 said stage to compare data, databar, feedback, feedback bar and the input clock.

6. The method of claim 2 including self-correcting the pulse generator stage.

7. The method of claim 1 including only toggling the circuit when input data changes.

8. One or more non-transitory computer readable media storing instructions to perform a sequence comprising:
providing a pulse triggered flip flop circuit including an exclusive OR clock generating stage that receives an input clock and data and produces an output clock pulse;
said stage to produce the output clock pulse that only goes away when the data is fully captured; and
said stage to disable the output clock pulse only when the data is fully captured, wherein said stage includes only eight clocked transistors.

9. The media of claim 8, further storing instructions to perform a sequence including providing a feedback signal to the stage.

10. The media of claim 9, further storing instructions to perform a sequence wherein said stage only produces the clock output pulse when the input clock is high.

11. The media of claim 9, further storing instructions to perform a sequence wherein said stage only produces the clock output pulse when only one of data and the feedback signal is high.

12. The media of claim 9, further storing instructions to perform a sequence including said stage to compare data, databar, feedback, feedback bar and the input clock.

13. The media of claim 9, further storing instructions to perform a sequence including self-correcting the pulse generator stage.

14. The media of claim 8, further storing instructions to perform a sequence including only toggling the circuit when input data changes.

15. A pulse triggered flip flop circuit comprising:
an exclusive OR clock generating stage that receives an input clock and data and produces an output clock pulse, said stage to produce the output clock pulse that only goes away when the data is fully captured, said stage to disable the output clock pulse only when the data is fully captured; and
clocked transistors coupled to said clock generating stage, wherein said stage includes only eight clocked transistors.

16. The circuit of claim 15, said transistors to provide a feedback signal to the stage.

17. The circuit of claim 16, wherein said stage only produces the clock output pulse when the input clock is high.

18. The circuit of claim 16 wherein said stage only produces the clock output pulse when only one of data and the feedback signal is high.

19. The circuit of claim 16, said transistors to provide a stage to compare data, databar, feedback, feedback bar and the input clock.

20. The circuit of claim 16, wherein said pulse generator stage is self-correcting.

21. The circuit of claim 15, the circuit only toggling when input data changes.

* * * * *

UNITED STATES PATENT AND TRADEMARK OFFICE
CERTIFICATE OF CORRECTION

Page 1 of 1

PATENT NO. : 10,158,346 B2
APPLICATION NO. : 15/488628
DATED : December 18, 2018
INVENTOR(S) : Bhushan M. Borole et al.

It is certified that error appears in the above-identified patent and that said Letters Patent is hereby corrected as shown below:

In the Claims

Column 47, Line 66: "stage" should be --circuit--.

Column 48, Line 24: "stage" should be --circuit--.

Column 48, Line 54: "stage" should be --circuit--.

Signed and Sealed this
Fifth Day of February, 2019

Andrei Iancu
*Director of the United States Patent and Trademark Office*